US009625647B2

(12) United States Patent
Taylor

(10) Patent No.: US 9,625,647 B2
(45) Date of Patent: Apr. 18, 2017

(54) OPTOELECTRONIC INTEGRATED CIRCUIT

(71) Applicants: Opel Solar, Inc., Storrs Mansfield, CT (US); The University of Connecticut, Farmington, CT (US)

(72) Inventor: Geoff W. Taylor, Storrs-Mansfield, CT (US)

(73) Assignees: THE UNIVERSITY OF CONNECTICUT, Farmington, CT (US); Opel Solar, Inc., Storrs Mansfield, CT (US)

(*) Notice: Subject to any disclaimer, the term of this patent is extended or adjusted under 35 U.S.C. 154(b) by 0 days.

(21) Appl. No.: 14/222,841

(22) Filed: Mar. 24, 2014

(65) Prior Publication Data

US 2015/0214425 A1 Jul. 30, 2015

Related U.S. Application Data

(60) Provisional application No. 61/962,303, filed on Jan. 29, 2014.

(51) Int. Cl.
*H01L 29/10* (2006.01)
*G02B 6/134* (2006.01)
(Continued)

(52) U.S. Cl.
CPC ........ *G02B 6/1347* (2013.01); *H01L 21/8252* (2013.01); *H01L 27/0605* (2013.01);
(Continued)

(58) Field of Classification Search
None
See application file for complete search history.

(56) References Cited

U.S. PATENT DOCUMENTS 4,683,637 A 8/1987 Varker et al.
5,034,958 A 7/1991 Kwon et al.
(Continued)

FOREIGN PATENT DOCUMENTS

EP 0452032 A2 10/1991
JP 06 252504 9/1994
(Continued)

OTHER PUBLICATIONS

GaAs-based long-wavelength InAs quantum dots on multi-step-graded InGaAs metamorphic buffer grown by molecular beam epitaxy, He Ji-Fang et al., Journal of Physics D: Applied Physics, J.Phyus. D: Appl.Phys. 44(2011) 335102 (5pp).
(Continued)

*Primary Examiner* — Charles Garber
*Assistant Examiner* — Steven Christopher
(74) *Attorney, Agent, or Firm* — Sughrue Mion, PLLC

(57) ABSTRACT

A semiconductor device employs an epitaxial layer arrangement including a first ohmic contact layer and first modulation doped quantum well structure disposed above the first ohmic contact layer. The first ohmic contact layer has a first doping type, and the first modulation doped quantum well structure has a modulation doped layer of a second doping type. At least one isolation ion implant region is provided that extends through the first ohmic contact layer. The at least one isolation ion implant region can include oxygen ions. The at least one isolation ion implant region can define a region that is substantially free of charge carriers in order to reduce a characteristic capacitance of the device. A variety of high performance transistor devices (e.g., HFET and BICFETs) and optoelectronic devices can employ this device structure. Other aspects of wavelength-tunable microresonantors and related semiconductor fabrication methodologies are also described and claimed.

15 Claims, 27 Drawing Sheets

(51) Int. Cl.

| | |
|---|---|
| H01L 27/144 | (2006.01) |
| H01L 31/0352 | (2006.01) |
| H01S 5/042 | (2006.01) |
| H01L 29/66 | (2006.01) |
| H01L 29/74 | (2006.01) |
| H01L 21/8252 | (2006.01) |
| H01L 29/778 | (2006.01) |
| H01L 27/06 | (2006.01) |
| H01L 27/085 | (2006.01) |
| H01L 31/111 | (2006.01) |
| H01L 33/10 | (2010.01) |
| H01S 5/0625 | (2006.01) |
| H01S 5/343 | (2006.01) |
| H01S 5/062 | (2006.01) |
| H01S 5/10 | (2006.01) |
| H01S 5/20 | (2006.01) |
| H01S 5/30 | (2006.01) |
| H01S 5/22 | (2006.01) |

(52) U.S. Cl.
CPC ........ *H01L 27/085* (2013.01); *H01L 27/1443* (2013.01); *H01L 29/66401* (2013.01); *H01L 29/74* (2013.01); *H01L 29/7783* (2013.01); *H01L 31/035209* (2013.01); *H01L 31/1113* (2013.01); *H01S 5/0421* (2013.01); *H01S 5/0424* (2013.01); *H01S 5/1071* (2013.01); *H01S 5/1075* (2013.01); *H01L 29/1066* (2013.01); *H01L 33/105* (2013.01); *H01S 5/0625* (2013.01); *H01S 5/06203* (2013.01); *H01S 5/06226* (2013.01); *H01S 5/1032* (2013.01); *H01S 5/2027* (2013.01); *H01S 5/2063* (2013.01); *H01S 5/2086* (2013.01); *H01S 5/222* (2013.01); *H01S 5/309* (2013.01); *H01S 5/34313* (2013.01)

(56) References Cited

U.S. PATENT DOCUMENTS

| | | | |
|---|---|---|---|
| 6,031,243 A * | 2/2000 | Taylor | ............................ 257/13 |
| 6,479,844 B2 | 11/2002 | Taylor | |
| 6,841,795 B2 | 1/2005 | Taylor et al. | |
| 6,849,866 B2 | 2/2005 | Taylor | |
| 6,853,014 B2 | 2/2005 | Taylor et al. | |
| 6,870,207 B2 | 3/2005 | Taylor | |
| 6,873,273 B2 | 3/2005 | Taylor et al. | |
| 6,954,473 B2 | 10/2005 | Dehmubed et al. | |
| 6,995,407 B2 | 2/2006 | Taylor et al. | |
| 7,332,752 B2 | 2/2008 | Taylor et al. | |
| 2002/0121647 A1 * | 9/2002 | Taylor | ............................ 257/192 |
| 2002/0191659 A1 | 12/2002 | Skogman | |
| 2003/0219045 A1 | 11/2003 | Orenstein et al. | |
| 2009/0028492 A1 * | 1/2009 | Wu | ........................ G02B 6/125 385/14 |
| 2010/0116976 A1 * | 5/2010 | Wober | ................... B82Y 20/00 250/227.23 |
| 2010/0236625 A1 * | 9/2010 | Kenney et al. | ................ 136/259 |
| 2012/0164797 A1 * | 6/2012 | Lowenthal et al. | ........... 438/127 |
| 2014/0050242 A1 | 2/2014 | Taylor | |
| 2014/0241660 A1 * | 8/2014 | Taylor | ................. G02B 6/12007 385/8 |

FOREIGN PATENT DOCUMENTS

| | | |
|---|---|---|
| JP | 2002 217484 | 8/2002 |
| WO | WO 02/071490 | 9/2002 |
| WO | WO 2013/025964 | 2/2013 |

OTHER PUBLICATIONS

"Tunable Bragg reflectors on silicon-on-insulator rib waveguides", Ivano Giutoni et al., Oct. 12, 2009 / vol. 17, No. 21, Optics Express 18518-18524.

U.S. Appl. No. 08/949,504, Geoff W. Taylor, filed Oct. 19, 1997.

U.S. Appl. No. 09/710,217, Geoff W. Taylor, filed Nov. 11, 2000.

Formation of Buried Insulating Layers in Silicon by the Implantation of High Doses of Oxygen, P.L.F. Hemment, et al., Nuclear Instruments and Methods 209/210 (1983) 157-164.

"Implant Isolation of Gallium Arsenide" Ahmed Shuja, Thesis, School of Electronics, Computing and Mathematics, University of Surrey, May 2002.

Metamorphic growth for application in long-wavelength (1.3-1.55 µm) lasers and MODFET-type structures on GaAs substrates, E.S. Semenova et al., Nanotechnology 15 (2004) S283-S287.

Room temperature operating infrared (8-12 µm) photo detector with InAs quantum dots in modulation doped heterostructures, Taehee Cho et al., IEEE, Dec. 6, 1998, pp. 441-444.

\* cited by examiner

| P-type Ohmic Contact | 30 |
|---|---|
| P-type layer(s) | 28 |
| Undoped Spacer Layer | 26 |
| N-type Modulation Doped QW Structure | 24 |
| Spacer Layer(s) | 22 |
| P-type Modulation Doped QW Structure | 20 |
| Undoped spacer layer | 18 |
| N-type layer(s) | 16 |
| N-type Ohmic Contact | 14 |
| Bottom DBR Mirror | 12 |
| Substrate | 10 |

*Fig. 1*
Prior Art

| optical guide layer 1035 |
|---|
| top p-type ohmic contact layer(s) 1033 |
| top p-type layer(s) 1031 |
| spacer layer(s) 1029 |
| n-type modulation doped QW structure 1027 |
| spacer layer(s) 1025 |
| QD-in QW structure 1023 |
| spacer layer(s) 1021 |
| QD-in-QW structure 1019 |
| spacer/barrier layer(s) 1017 |
| p-type modulation doped QW structure 1015 |
| spacer layer(s) 1013 |
| bottom n-type layer(s) 1011 |
| bottom n-type ohmic contact layer(s) 1009 |
| spacer layer(s) 1007 |
| metomorphic buffer 1005 |
| bottom DBR mirror layers 1003 |
| Substrate 1001 |

*Fig. 10*

| Epitaxial Structure | reference number | Material | doping type | typical doping concentration (atoms/cm3) | typical layer thickness (Å) | substrate temp (°C) | Notes |
|---|---|---|---|---|---|---|---|
| optical guide 1035 | 1235 | In$_{0.53}$Ga$_{0.47}$As | UD | | 870 | | |
| top p-type ohmic contact 1133 | 1233 | In$_{0.53}$Ga$_{0.47}$As | P+ | 1E20 | 60 | | |
| | 1231 | In$_{0.53}$Ga$_{0.47}$As | P+ | 7E18 | 880 | | optical and electrical confinement |
| top P-type layer(s) 1031 | 1229 | In$_{0.52}$Al$_{0.48}$As | P+ | 5E17 | 700 | | |
| | 1227 | In$_{0.53}$Ga$_{0.47}$As | P+ | 7E18 | 12 | | capacitor |
| | 1225 | In$_{0.52}$Al$_{0.48}$As | P+ | 7E18 | 60 | | capacitor layer |
| spacer layer(s) 1029 | 1223 | In$_{0.52}$Al$_{0.48}$As | UD | | 300 | | |
| n-type modulation doped QW structure 1027 | 1221 | In$_{0.52}$Al$_{0.48}$As | N+ | 3.5E18 | | | N+ charge sheet - modulation doping layer and bottom plate of top capacitor |
| | 1219 | In$_{0.52}$Al$_{0.48}$As | UD | | 80 | | spacer layer |
| | 1217 | In$_{0.53}$Ga$_{0.47}$As | UD | | 30 | | barrier layer |
| | 1215 | In$_{0.3}$Ga$_{0.7}$As ) x3 | UD | | 15 | | QW |
| spacer layer(s) 1025 | 1213 | In$_{0.53}$Ga$_{0.47}$As | UD | | 60 | 400-450 | spacer/barrier layer |
| | | | | | 300-500 | | |

Fig. 11A

| Epitaxial Structure | reference number | Material | doping type | typical doping concentration (atoms/cm3) | typical layer thickness (Å) | substrate temp (°C) | Notes |
|---|---|---|---|---|---|---|---|
| Emission QD structure 1023-8 | 1211 | In$_x$Ga$_{1-x}$As, x=.7→0.53 | UD | | 40 | | top side of analog-graded InGaAs QW |
| | 1209 | InAs | UD | | | | QDs embedded in the InGaAs QW |
| | 1207 | In$_x$Ga$_{1-x}$As, x=0.53→0.7 | UD | | 40 | | bottom side of analog-grade InGaAs QW |
| spacer/barrier layer 1023-7 | 1205 | In$_{0.53}$Ga$_{0.47}$As | UD | | 100 | | spacer/barrier layer |
| template QD structure 1023-6 | 1203 | In$_x$Ga$_{1-x}$As | UD | | 40-60 | | top side of non-graded InGaAs QW |
| | 1201 | InAs | UD | | | | QDs embedded in the InGaAs QW |
| | 1199 | In$_{0.53}$Ga$_{0.47}$As | UD | | ? | | bottom side of non-graded InGaAs QW |
| spacer/barrier layer 1023-5 | 1197 | In$_{0.53}$Ga$_{0.47}$As | UD | | 300-500 | | spacer/barrier layer |
| Emission QD structure 1023-4 | 1195 | In$_x$Ga$_{1-x}$As, x=.7→0.53 | UD | | 40 | | top side of analog-graded InGaAs QW |
| | 1193 | InAs | UD | | | | QDs embedded in the InGaAs QW |
| | 1191 | In$_x$Ga$_{1-x}$As, x=0.53→0.7 | UD | | 40 | | bottom side of analog-grade InGaAs QW |
| spacer/barrier layer 1023-3 | 1189 | In$_{0.53}$Ga$_{0.47}$As | UD | | 100 | 400-500 | barrier/spacer layer |

Fig. 11B

| Epitaxial Structure | reference number | Material | doping type | typical doping concentration (atoms/cm3) | typical layer thickness (Å) | substrate temp (°C) | Notes |
|---|---|---|---|---|---|---|---|
| template QD structure 1023-2 | 1187 | $In_{0.53}Ga_{0.47}As$ | UD | | 40-60 | ← | top side of non-graded InGaAs QW |
| | 1185 | InAs | UD | | 2 | | QD's embedded in the InGaAs QW |
| | 1183 | $In_{0.7}Ga_{0.3}As$ | UD | | | | bottom side of non-graded InGaAs QW |
| spacer/barrier layer 1022-1 | 1181 | $In_{0.53}Ga_{0.47}As$ | UD | | 300-400 | | spacer/barrier layer |
| spacer barrier layer(s) 1021 | 1179 | $In_{0.52}Al_{0.48}As$ | UD | | 400 | | spacer layer |
| emission QD structure 1019-7 | 1177 | $In_xGa_{1-x}As, x=0.7 \rightarrow 0.53$ | UD | | 40 | | top side of analog-graded InGaAs QW |
| | 1175 | InAs | UD | | | | QD's embedded in the InGaAs QW |
| | 1173 | $In_xGa_{1-x}As, x=0.53 \rightarrow 0.7$ | UD | | 40 | | bottom side of analog-graded InGaAs QW |
| spacer/barrier layer 1019-6 | 1171 | $In_{0.53}Ga_{0.47}As$ | UD | | 100 | | barrier layer |
| | 1169 | $In_{0.7}Ga_{0.3}As$ | UD | | 40-60 | | top side of non-graded InGaAs QW |
| | 1167 | InAs | UD | | | | forms QDs embedded in the InGaAs QW |
| emission QD structure 1019-5 | 1165 | $In_{0.7}Ga_{0.3}As$ | UD | | 2 | 400-450 | bottom side of non-graded InGaAs QW |

Fig. 11C

| Epitaxial Structure | reference number | Material | doping type | typical doping concentration (atoms/cm3) | typical layer thickness (Å) | substrate temp (°C) | Notes |
|---|---|---|---|---|---|---|---|
| spacer/barrier layer 1019-4 | 1163 | In$_{0.53}$Ga$_{0.47}$As | UID | | 300-500 | | spacer/barrier layer |
| emission QD structure 1019-3 | 1161 | In$_x$Ga$_{1-x}$As, x=0.7→0.53 | UID | | 40 | | top side of analog-graded InGaAs QW |
| | 1159 | InAs | UID | | | | QDs embedded in the InGaAs QW |
| | 1157 | In$_x$Ga$_{1-x}$As, x=0.53→0.7 | UID | | 40 | | bottom side of analog-graded InGaAs QW |
| spacer/barrier layer 1019-2 | 1155 | In$_{0.53}$Ga$_{0.47}$As | UID | | 100 | | barrier/spacer layer |
| template QD structure 1019-1 | 1153 | In$_{0.7}$Ga$_{0.3}$As | UID | | 40-60 | | top side of non-graded InGaAs QW |
| | 1151 | InAs | UID | | | | QDs embedded in the InGaAs QW |
| | 1149 | In$_{0.7}$Ga$_{0.3}$As | UID | | 2 | | bottom side of non-graded InGaAs QW |
| spacer/barrier layer(s) 1017 | 1147 | In$_{0.53}$Ga$_{0.47}$As | UID | | 300-500 | 400-450 | spacer/barrier layer |

Fig. 11D

| Epitaxial Structure | reference number | Material | doping type | typical doping concentration (atoms/cm3) | typical layer thickness (Å) | substrate temp (°C) | Notes |
|---|---|---|---|---|---|---|---|
| p-type modulation doped QW structure 1015 | 1145 | $In_{0.53-y}Ga_{0.47+y}As$ | UD | | 60 | ← | non-graded InGaAs QW |
| | 1143 | $In_{0.52}Al_{0.23}Ga_{0.25}As$ | UD | | 15 | | barrier layer |
| | 1141 | $In_{0.52}Al_{0.23}Ga_{0.25}As$ | UD | | 30 | | spacer layer |
| | 1139 | $In_{0.52}Al_{0.23}Ga_{0.25}As$ | P+ | 7E18 | 40 | | P+ charge sheet-modulation doping layer and top plate of bottom capacitor |
| spacer layer(s) 1013 | 1137 | $In_{0.52}Al_{0.23}Ga_{0.25}As$ | UD | | 300 | | capacitor layer |
| bottom p-type ohmic contact (layer(s) 1011 | 1135 | $In_{0.52}Al_{0.23}Ga_{0.25}As$ | N+ | 3.5E18 | 80 | | bottom plate of bottom capacitor |
| | 1133 | $In_{0.53}Ga_{0.47}As$ | N+ | 3.5E18 | 12 | | |
| | 1131 | $In_{0.52}Al_{0.23}Ga_{0.25}As$ | N+ | 3.5E18 | 20 | | |
| | 1129 | $In_{0.53}Ga_{0.47}As$ | N+ | 3.5E18 | 12 | | |
| bottom n-type ohmic contact 1009 | 1127 | $In_{0.52}Al_{0.48}As$ | N | 5E17 | 1080 | | optical and electric confinement |
| spacer layer(s) 1007 | 1125 | $In_{0.52}Al_{0.23}Ga_{0.25}As$ | N+ | 3.5E18 | 3000 | | |
| | 1123 | $In_{0.53}Ga_{0.47}As$ | UD | | 200 | 400-420 | eliminate anti-null absorption |

*Fig. 11E*

| Epitaxial Structure | reference number | Material | doping type | typical doping concentration (atoms/cm3) | typical layer thickness (Å) | substrate temp (°C) | Notes |
|---|---|---|---|---|---|---|---|
| metamorphic buffer 1005 | 1121 | $In_xAl_{1-x}As, x = 0.49$ | | | 110 | ↑ | heating layer |
| | 1119 | $In_xAl_{1-x}As, x = 0.52 \rightarrow 0.49$ | | | 20 | | inverse step |
| | 1117 | $In_xAl_{1-x}As, x = 0.23 \rightarrow 0.52$ | | | 380 | | |
| | 1115 | $In_xAl_{1-x}As, x = 0.25$ | | | 120 | | heating |
| | 1113 | $In_xAl_{1-x}As, x = 0.28 \rightarrow 0.25$ | | | 20 | | inverse step |
| | 1111 | $In_xAl_{1-x}As, x = 0.05 \rightarrow 0.28$ | | | 340 | 400-450 | |
| | 1109 | $(Al_{0.5}Ga_{0.5}As/GaAs) \times 5$ | | | (24/14)λ 5 | ↑ | super-lattice buffer |
| | 1107 | GaAs | | | 34 | | |
| bottom DBR mirror layers 1003 | 1103 | AlAs | | | 700 | | |
| | 1105 | GaAs ⎫ | | | 1650 ⎫ | | |
| | 1103 | AlAs ⎬ x7 | | | 700 ⎬ | | |
| substrate 1001 | 1101 | GaAs Substrate | Si | | 1650 | 600 | |

*Fig. 11F*

OPTOELECTRONIC INTEGRATED CIRCUIT

CROSS-REFERENCE TO RELATED APPLICATION(S)

The present application claims priority from U.S. Prov. Appl. No. 61/962,303, filed on Jan. 29, 2014, herein incorporated by reference in its entirety.

BACKGROUND

1. Field

The present application relates to semiconductor integrated circuits that implement a variety optoelectronic functions (such as optical emitters, optical detectors and optical switches) and electronic functions (such as heterojunction field effect transistors and bipolar field effect transistors).

2. State of the Art

The present application builds upon technology (referred to by the Applicant as "Planar Optoelectronic Technology" or "POET") that provides for the realization of a variety of devices (optoelectronic devices, logic circuits and/or signal processing circuits) utilizing inversion quantum-well channel device structures as described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; all of which are hereby incorporated by reference in their entireties.

With these structures, a fabrication sequence can be used to make the devices on a common substrate. In other words, n type and p type contacts, critical etches, etc. can be used to realize all of these devices simultaneously on a common substrate. The essential features of this device structure include 1) an n-type modulation doped interface and a p-type modulation doped quantum well interface, 2) self-aligned n-type and p-type channel contacts formed by ion implantation, 3) n-type metal contacts to the n-type ion implants and the bottom n-type layer structure, and 4) p-type metal contacts to the p-type ion implants and the top p-type layer structure. The active device structures are preferably realized with a material system of group III-V materials (such as a GaAs/AlGaAs).

POET can be used to construct a variety of optoelectronic devices. POET can also be used to construct a variety of high performance transistor devices, such as complementary NHFET and PHFET unipolar devices as well as n-type and p-type HBT bipolar devices.

SUMMARY

A semiconductor device employs an epitaxial layer arrangement including a first ohmic contact layer and first modulation doped quantum well structure disposed above the first ohmic contact layer. The first ohmic contact layer has a first doping type, and the first modulation doped quantum well structure has a modulation doped layer of a second doping type. At least one isolation ion implant region is provided that extends through the first ohmic contact layer. The at least one isolation ion implant region can include oxygen ions. The at least one isolation ion implant region can define a region that is substantially free of charge carriers in order to reduce a characteristic capacitance of the device.

In one embodiment, the epitaxial layer arrangement further includes at least one spacer layer disposed above the first modulation doped quantum well structure. A mesa can be formed in the at least one spacer layer. At least one contact implant region can be disposed below the mesa in contact with the first modulation doped quantum well structure. At least one electrode terminal can be formed on the mesa in contact with the at least one contact implant region. The at least one isolation implant region can be disposed below the mesa and below the at least one contact implant region.

In another embodiment, the first modulation doped quantum well structure defines a QW channel of an HFET device, wherein the QW channel extends between opposed contact ion implant regions that are in contact with corresponding source and drain terminal electrodes of the HFET device, and a gate terminal electrode of the HFET device is in contact with the first ohmic contact layer.

In another embodiment, the first modulation doped quantum well structure defines a QW channel of a BICFET device, wherein the QW channel is in contact with a base terminal electrode of the BICFET device, and an emitter terminal electrode of the BICFET device is in contact with the first ohmic contact layer.

In still another embodiment, the at least one isolation implant region provides for lateral confinement of light within a resonant cavity defined by the epitaxial layer arrangement.

In yet another embodiment, the first modulation doped quantum well structure, the first ohmic contact layer and the at least one isolation ion implant region are all part of an optical resonator formed in the epitaxial layer arrangement, wherein the optical resonator is adapted to process light at at least one predetermined wavelength. The optical resonator can include a resonant cavity supporting propagation of an optical signal therein, wherein the at least one isolation implant is disposed adjacent the resonant cavity. A first terminal electrode can be formed in electrical contact with the first modulation doped quantum well structure. A second terminal electrode can be formed in electrical contact with the first ohmic contact layer. The first and second terminal electrodes can be configured as terminals of a diode laser whereby injected electrical current flows between the first and second terminal electrodes and causes light generation and propagation within the resonant cavity. Alternatively, the first and second terminal electrodes are configured as terminals of a diode optical detector that carry electrical current caused by absorption of light propagating within the resonant cavity.

In another embodiment, the epitaxial layer arrangement can include at least one spacer layer disposed above the first modulation doped quantum well structure, a second modulation doped quantum well structure disposed above the at least one spacer layer, and a second ohmic contact layer disposed above the second modulation doped quantum well structure. The second modulation doped quantum well structure has a modulation doped layer of the first doping type, and the second ohmic contact layer has the second doping type. A top terminal electrode can be formed in electrical contact with the second ohmic contact layer. A first injector terminal electrode can be formed in electrical contact with the second modulation doped quantum well structure. A second injector terminal electrode can be formed in electrical contact with the first modulation doped quantum well structure. A bottom terminal electrode can be formed in electrical contact with the first ohmic contact layer. The top terminal electrode, the first injector terminal electrode, the second injector terminal electrode, and the bottom terminal electrode can be configured as terminals of a switching thyristor laser having an ON state whereby current flows between the top terminal electrode and bottom terminal electrode to cause light generation and propagation within the resonant cavity. Alternatively, the top terminal electrode, the first injector terminal electrode, the second injector terminal electrode, and the bottom terminal electrode can be configured as terminals of a switching thyristor optical detector having an ON state whereby current flows between the top terminal electrode and bottom terminal electrode, wherein the ON state is caused by absorption of light propagation in the resonant cavity.

In such embodiments, the resonant cavity can have a disk-like shape and the optical signal comprises a whispering gallery optical signal, or the resonant cavity can have an annular-shape and the optical signal comprises a circulating optical signal. The at least one isolation implant region can be disposed adjacent a central region of the resonant cavity or adjacent a peripheral region of the resonant cavity.

In another embodiment, the resonant cavity can be defined by a rib waveguide, wherein the at least one isolation implant region is disposed on at least one side of the rib waveguide. The rib waveguide can have a plurality of straight sections that are optically coupled together by bend sections. A coupling waveguide structure can be spaced from the resonant cavity of optical resonator to provide for evanescent-wave optical coupling therebetween.

In one embodiment, the resonant cavity of the optical resonator and the coupling waveguide structure can be defined by sidewalls of the epitaxial layer arrangement. The epitaxial layer arrangement can be disposed above a bottom DBR mirror, wherein the sidewalls that define the resonant cavity of the optical resonator and the coupling waveguide structure extend downward to the bottom DBR mirror.

In one embodiment, the epitaxial layer arrangement includes an N+ type doped layer for the first ohmic contact layer, a first plurality of layers that define a p-type modulation doped quantum well structure for the first modulation doped quantum well structure, a second plurality of layers that define an n-type modulation doped quantum well structure for the second n-type modulation doped structure, and a P+ type doped layer for the second ohmic contact layer.

In another aspect, a semiconductor device includes a dual-cavity optical resonator having a first vertical resonant cavity surrounded by a second annular resonant cavity formed in an epitaxial layer arrangement. A coupling waveguide structure is spaced from the second resonant cavity of optical resonator to provide for evanescent-wave optical coupling therebetween. The second resonant cavity of the optical resonator and the coupling waveguide structure can be defined by sidewalls of the epitaxial layer arrangement. The coupling waveguide structure and the optical resonator can be configured to perform predetermined mode transformation operations selected from the group consisting of vertical propagation to in-plane propagation, in-plane propagation to vertical propagation, wavelength conversion, and combinations thereof.

In one embodiment, the epitaxial layer arrangement includes a first ohmic contact layer, a first modulation doped quantum well structure disposed above the first ohmic contact layer, at least one spacer layer disposed above the first modulation doped quantum well structure, a second modulation doped quantum well structure disposed above the spacer layer, and a second ohmic contact layer disposed above the second modulation doped quantum well structure, wherein the first ohmic contact layer has a first doping type, the first modulation doped quantum well structure has a modulation doped layer of a second doping type, the second first modulation doped quantum well structure has a modulation doped layer of the first doping type, and the second ohmic contact layer has the second doping type. The dual cavity resonator can include a top terminal electrode in electrical contact with the second ohmic contact layer, at least one of a first injector terminal electrode s (which is in electrical contact with the second modulation doped quantum well structure) and a second injector terminal (which is in electrical contact with the first modulation doped quantum well structure), and a bottom terminal electrode in electrical contact with the first ohmic contact layer. The electrodes of the device can be configured as terminals of a switching thyristor laser having an ON state whereby current flows between the top terminal electrode and bottom terminal electrode causes light generation and propagation within the vertical resonant cavity. Alternatively, the electrodes of the device are configured as terminals of a switching thyristor optical detector having an ON state whereby current flows between the top terminal electrode and bottom terminal electrode, wherein the ON state is caused by absorption of light propagating in the vertical resonant cavity.

In yet another aspect, a semiconductor device includes an optical resonator including a closed path waveguide that supports circulating propagation of light. A waveguide structure is spaced from the closed path waveguide of the optical resonator to provide for evanescent-wave optical coupling therebetween. The closed path waveguide includes at least one active section and a tuning section that is isolated from the at least one active section. The active section is configured to generate or absorb light that circulates in the closed path waveguide. The tuning section is configured to provide electrical control of the wavelength of the light circulating in the closed path waveguide. The closed path waveguide of the optical resonator and the waveguide structure can both be formed in an epitaxial layer structure that includes at least one modulation doped quantum well structure. The tuning section of the closed path waveguide can include a plurality of electrodes for supplying electrical signals that control charge in one or more quantum wells of the at least one modulation doped quantum well structure of the tuning section in order to control the wavelength of the light circulating in the closed path waveguide. The tuning section of the closed path waveguide can be isolated from the at least one active section by passive waveguide sections.

In yet another aspect, a semiconductor device includes an optical resonator having a closed path waveguide that supports circulating propagation of light. A waveguide structure is spaced from the closed path waveguide of the optical resonator to provide for evanescent-wave optical coupling therebetween. The waveguide structure has a first end disposed opposite a second end. A reflector structure is integral to the first end of the waveguide structure. The reflector structure includes a Bragg-grating that is configured to reflect a particular wavelength of light. The reflector structure can include two co-planar radio-frequency (RF) traveling wave transmission lines disposed on opposite sides of the Bragg-grating along the length of the Bragg-grating. A signal source can be configured to supply a traveling wave RF signal to the two co-planar RF traveling wave transmission lines in order to selectively vary the particular wavelength of light that is reflected by the Bragg-grating of the reflector structure. The closed path waveguide of the optical resonator and the waveguide structure and the reflector structure can all be formed in an epitaxial layer structure that includes at least one layer disposed above a modulation doped quantum well structure, The Bragg-grating can be formed in the at least one layer disposed above the modulation doped quantum well structure.

In yet another aspect, a method is provided for forming a patterned layer of metal that defines an aperture of an optoelectronic device that is part of integrated circuit wafer. The method includes depositing and patterning a first mask on a top surface of the wafer, wherein the pattern of the first mask defines a feature that protects an area of the aperture. An ion implant operation is performed that forms at least one implant region adjacent the aperture. Metal is deposited such that the metal covers the top surface and the mask feature. A second mask is deposited and patterned to define a window that overlies the mask feature. The window has a smaller width that width of the mask feature. A first etch operation is performed that etches through the window defined by the second mask to a depth at or near the top surface. The first etch operation leaves being at least one sidewall of the mask feature. A second etch operation is performed that etches sideways and undercuts the at least one opposed sidewall of the mask feature as well as at least one adjacent sidewall of the metal to form the aperture. The first mask can be a dual layer structure of oxide and nitride. The second mask can be a photoresist material. The at least one ion implant region can provide for current funneling toward an active region under the aperture and/or lateral confinement of light within the active region under the aperture.

In one embodiment, the metal comprises tungsten. The sidewall(s) that result from the first etch operation can have a width dimension on the order of 1-2 μm. The first etch operation can employ an anisotropic etching process that define a near vertical profile for the sidewall(s). The second etch operation can employ a buffer-oxide etchant.

In another aspect, an optoelectronic semiconductor device includes a substrate and an epitaxial layer arrangement formed on the substrate. The epitaxial layer arrangement includes a buffer structure and an active device structure formed on the buffer structure. The active device structure includes at least one modulation doped quantum well structure spaced from a QD-in-QW structure. The buffer structure comprises a plurality of layer that are configured to accommodate lattice strain due to mismatch between the active device structure and the substrate.

In one embodiment, the substrate is a GaAs substrate, the at least one modulation doped quantum well structure includes at least one InGaAs quantum well formed from an alloy of InAs and GaAs that includes at least 70 percent InAs, and the QD-in-QW structure includes quantum dots formed from InAs and embedded within at least one InGaAs quantum well formed from an alloy of InAs and GaAs that includes at least 70 percent InAs. The InGaAs quantum well of the QD-in-QW structure can include a template substructure formed below an emission substructure. The template substructure includes a non-graded InGaAs quantum well formed from an alloy of InAs and GaAs that includes less than 70 percent InAs, and the emission substructure includes a graded InGaAs quantum well formed from an alloy of InAs and GaAs that has a maximum percentage of InAs of at least 70 percent InAs. The buffer structure can include a plurality of layers formed from an alloy of InAs and AlAs and possibly a periodic superlattice layer structure comprising a first layer formed from an alloy of AlAs and GaAs and a second layer formed from GaAs.

In another aspect, a method of fabricating an optoelectronic device realized in an integrated circuit wafer that includes a top layer overlying a doped ohmic contact layer and semiconductor layers therebelow. The method includes depositing a protective layer on the top layer, and depositing and patterning a first mask on the protective layer, wherein the pattern of the first mask protects an area for an optical feature. A first etch operation is performed that etches down to the doped ohmic contact in order to define the optical feature that includes the top layer. The first etch operation exposes the doped ohmic contact layer on at least one side of the optical feature and leaves behind at least one sidewall of the optical feature. An ion implant operation is performed that forms at least one ion implant region in the semiconductor layers disposed below the exposed doped ohmic contact layer and adjacent the at least one side of the optical feature. A second mask is deposited and patterned to define a window that overlies the optical feature. A second etch operation is performed that uses the window of the second mask to expose the top layer of the optical feature.

In one embodiment, the optical feature is selected from group consisting of an aperture, a waveguide layer of an active waveguide structure, and a waveguide layer of a passive waveguide structure.

The method can further include depositing metal such that the metal covers the optical feature. In this case, the second mask is deposited on the metal and the window defined by the second mask exposes metal that covers the optical feature, and the second etch operation removes the metal that covers the optical feature in order to expose the top layer of the optical feature.

In one embodiment, the optical feature is selected from group consisting of an aperture, a waveguide layer of an active waveguide structure, and a waveguide layer of a passive waveguide structure. The top layer can comprise an undoped semiconductor layer. The protective layer can comprise a silicon nitride layer. The first etch operation can employ an anisotropic etching process that define a near vertical profile for the at least one sidewall of the optical feature. The second etch operation can employ a buffer-oxide etchant.

BRIEF DESCRIPTION OF THE DRAWINGS

FIG. 1 is a schematic illustration of exemplary layer structures of the optoelectronic integrated circuit device structures of FIGS. 2A to 9D.

FIG. 2A is a schematic top view of the diode whispering gallery microresonator; and FIG. 2B is a schematic cross-sectional view of the diode thyristor whispering gallery microresonator along the section labeled 2B-2B of FIG. 2A.

FIG. 3A is a schematic top view of the diode ring microresonator; and FIG. 3B is a schematic cross-sectional view of the diode ring microresonator along the section labeled 3B-3B of FIG. 3A.

FIG. 4A is a schematic top view of the thyristor whispering gallery microresonator; and FIG. 4B is a schematic cross-sectional view of the thyristor whispering gallery microresonator along the section labeled 4B-4B of FIG. 4A.

FIG. 5A is a schematic top view of the closed-loop microresonator; FIG. 5B is a schematic cross-sectional view of the closed-loop microresonator along the section labeled 5B-5B of FIG. 5A; FIG. 5C is a schematic cross-sectional view of the closed-loop microresonator along the section labeled 5C-5C of FIG. 5A; FIG. 5D is a schematic cross-sectional view of the closed-loop microresonator along the section labeled 5D-5D of FIG. 5A; and FIG. 5E is a schematic cross-sectional view of the closed-loop microresonator along the section labeled 5E-5E of FIG. 5A.

FIG. 5F is a schematic top view of the closed-loop microresonator and electrically-controlled tuning reflector; FIG. 5G is a schematic cross-sectional view of the tuning reflector along the section labeled 5G-5GB of FIG. 5F; and FIG. 5H is a cross-section through the tuning reflector along the section labeled 5H-5H of FIG. 5F.

FIG. 6A is a schematic top view of the split-electrode vertical cavity surface emitting device; FIG. 6B is a schematic cross-sectional view of the split-electrode vertical cavity surface emitting device along the section labeled 6B-6B of FIG. 6A; and FIG. 6C is a schematic cross-sectional view of the split-electrode vertical cavity surface emitting device along the section labeled 6C-6C of FIG. 6A.

FIG. 7A is a schematic top view of the p-channel HFET device; FIG. 7B is a schematic cross-sectional view of the p-channel HFET device along the section labeled 7B-7B of FIG. 7A; and FIG. 7C is a schematic cross-sectional view of the p-channel HFET device along the section labeled 7C-7C of FIG. 7A.

FIG. 8A is a schematic top view of the dual-wavelength hybrid device; FIG. 8B is a schematic cross-sectional view of the dual-wavelength hybrid device along the section labeled 8B-8B of FIG. 8A; and FIG. 8C is a schematic cross-sectional view of the dual-wavelength hybrid device along the section labeled 8C-8C of FIG. 8A.

FIG. 10 is a schematic illustration of another exemplary layer structure for realizing the optoelectronic integrated circuit device structures described herein.

FIGS. 11A to 11F, collectively, are a chart illustrating an exemplary layer structure for realizing the optoelectronic integrated circuit device structures described herein.

DETAILED DESCRIPTION OF THE PREFERRED EMBODIMENTS

Figure 2A:
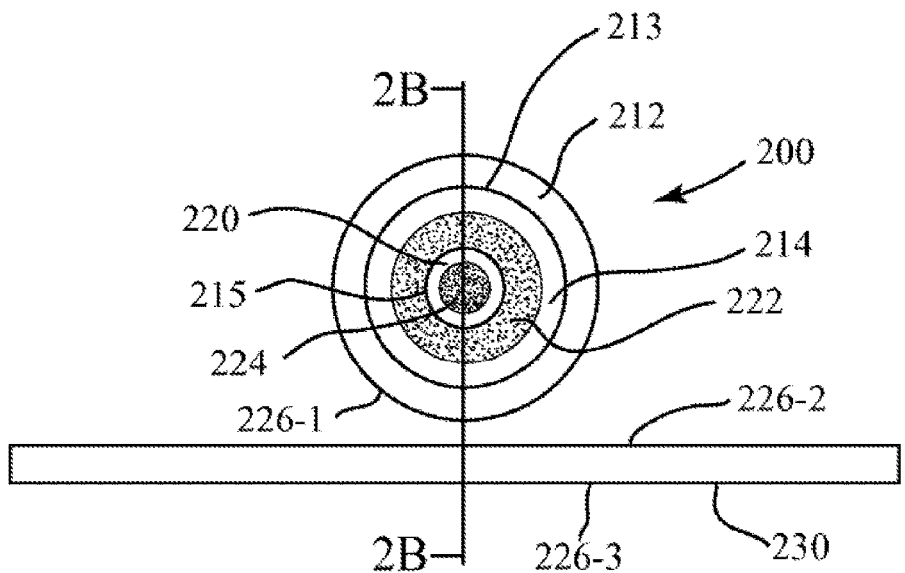
FIGS. 2A-2B illustrate a diode whispering gallery microresonator realized as part of an optoelectronic integrated circuit that employs the layer structure of FIG. 1.

Turning now to FIG. 1, the device structure of the present application includes a bottom dielectric distributed Bragg reflector (DBR) mirror 12 formed on substrate 10. The bottom DBR mirror 12 is typically formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4$) optical thickness, the reflections from each of the boundaries will be added in phase to produce a large amount of reflected light (e.g., a large reflection coefficient) at the particular center wavelength $\lambda_C$. Deposited upon the bottom DBR mirror 12 is the active device structure suitable for realizing complementary heterostructure field-effect transistor (HFET) devices. The first of these complementary HFET devices is a p-channel HFET which has a p-type modulation doped quantum well (QW) structure 20 with an n-type gate region (i.e., n-type ohmic contact layer 14 and n-type layer(s) 16)) below the p-type modulation doped QW structure 20. An undoped spacer layer 18 is disposed between the p-type modulation doped quantum well (QW) structure 20 and the underlying n-type layer(s) 16. One or more spacer layers 22 are disposed above the p-type modulation doped QW structure 20. The spacer layers 22 can include a first QD-In-QW structure (not shown) formed above the p-type modulation doped QW structure 20, where the first QD-In-QW structure includes at least one QW layer with self-assembled quantum dots (QDs) embedded therein. The first QD-In-QW structure can be spaced from the QW(s) of the p-type modulation doped QW structure 20 by an undoped spacer layer therebetween. The second of these complementary HFET devices is an n-channel HFET which includes an n-type modulation doped QW structure 24 with a p-type gate region (i.e., p-type layer(s) 28 and p-type ohmic contact 30) formed above the n-type modulation doped QW structure 24. An undoped spacer layer 26 is disposed between the n-type modulation doped quantum well (QW) structure 24 and the overlying p-type layer(s) 28. The spacer layers 22 can also include a second QD-In-QW structure (not shown) formed below the n-type modulation doped QW structure 24, where the second QD-In-QW structure includes at least one QW layer with self-assembled quantum dots (QDs) embedded therein. The second QD-In-QW structure can be spaced from the QW(s) of the n-type modulation doped QW structure 24 by an undoped spacer layer therebetween. The layers encompassing the spacer layer 22 and the n-type modulation doped QW structure 24 forms the collector region of the p-channel HFET. Similarly, the layers encompassing the spacer layer 22 and the p-type modulation doped QW structure 20 forms the collector region of the n-channel HFET. Such collector regions are analogous to the substrate region of a MOSFET device as is well known. Therefore a non-inverted n-channel HFET device is stacked upon an inverted p-channel HFET device as part of the active device structure.

The active device layer structure begins with n-type ohmic contact layer(s) 14 which enables the formation of ohmic contacts thereto. Deposited on layer 14 are one or more n-type layers 16 and an undoped spacer layer 18 which serve electrically as part of the gate of the p-channel HFET device and optically as a part of the lower waveguide cladding of the device. Deposited on layer 18 is the p-type modulation doped QW structure 20 that defines a p-type charge sheet offset from one or more QWs (which may be formed from strained or unstrained heterojunction materials) by an undoped spacer layer. The p-type charge sheet is formed first below the undoped spacer and the one or more QWs of the p-type modulation doped QW structure 20. All of the layers grown thus far form the p-channel HFET device with the gate ohmic contact on the bottom. Deposited on the p-type modulation doped QW structure 20 is one or more spacer layers 22. The spacer layers 22 can include first and QD-In-QW structures (not shown) that correspond to the p-type modulation doped QW structure 20 and the n-type modulation doped QW structure 24, respectively, and are offset from the corresponding structure by a respective undoped spacer layer.

Deposited on the spacer layer(s) 22 is the n-type modulation doped QW structure 24. The n-type modulation doped QW structure 24 defines an n-type charge sheet offset from one or more QWs by an undoped spacer layer. The n-type charge sheet is formed last above the undoped spacer and the one or more QWs of the n-type modulation doped QW structure 24.

Deposited on the n-type modulation doped QW structure 24 is an undoped spacer layer 26 and one or more p-type layers 28 which can serve electrically as part of the gate of the n-channel HFET and optically as part of the upper waveguide cladding of the device. Preferably, the p-type layers 28 include two sheets of planar doping of highly doped p-material separated by a lightly doped layer of p-material. These p-type layers are offset from the n-type modulation doped quantum well structure 24 by the undoped spacer layer 26. In this configuration, the top charge sheet achieves low gate contact resistance and the bottom charge sheet defines the capacitance of the n-channel HFET with respect to the n-type modulation doped QW structure 24. Deposited on p-type layer(s) 28 is one or more p-type ohmic contact layer(s) 30, which enables the formation of ohmic contacts thereto.

For the n-channel HFET device, a gate terminal electrode (not shown) of the n-channel HFET device is operably coupled to the top p-type ohmic contact layer(s) 30. A source terminal electrode (not shown) and a drain terminal electrode (not shown) of the n-channel HFET device are operably coupled to opposite ends of a QW channel(s) realized in the n-type modulation doped QW structure 24. One or more terminal electrodes (not shown) can be operably coupled to the p-type modulation doped QW structure 20 and used as collector terminal electrodes for the n-channel HFET device.

Figure 7A:
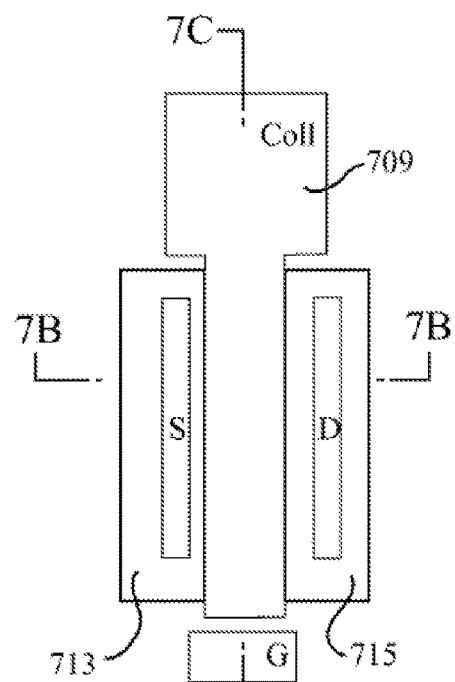
FIGS. 7A to 7C illustrate an embodiment of a p-channel HFET device realized as part of an optoelectronic integrated circuit that employs the layer structure of FIG. 1.
Figure 7B:
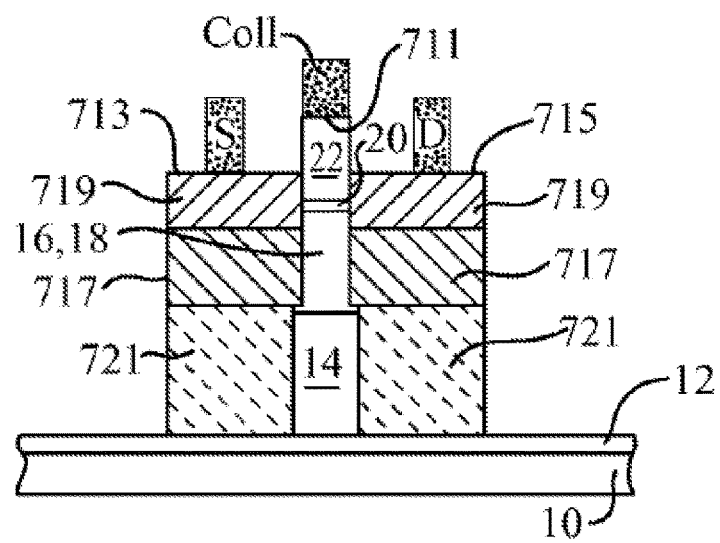
Figure 7C:
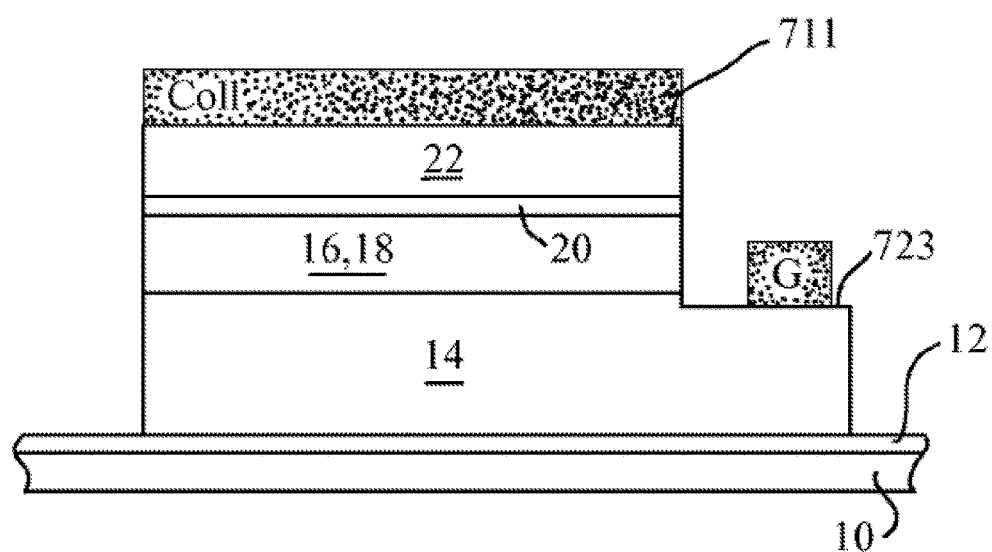

An exemplary embodiment of the p-channel HFET device is shown in FIGS. 7A-7C, which includes a gate terminal electrode (G), a source terminal electrode (S), a drain terminal electrode (D), and a collector terminal electrode (Coll). The source terminal electrode (S) and the drain terminal electrode (D) are operably coupled to opposite sides of an elongate QW channel(s) realized in the p-type modulation doped QW structure 20. The layer structure of the p-channel HFET device is patterned and etched down to spacer layer 22 to form a top mesa 711 at spacer layer 22 for the collector electrode (Coll).

The resulting structure is then patterned and etched to form opposed elongate mesas 713, 715 in the spacer layer 22 above the p-type modulation doped QW structure 20. The elongate mesas 713, 715 are disposed on opposite sides of the elongate collector terminal electrode (Coll) along the lengthwise dimension of the collector terminal electrode (Coll) as best shown in FIGS. 7A and 7B.

A sequence of two different ion implant operations is then carried out to implant ions through the elongate mesas 713, 715. The first implant operation employs p-type acceptor ions, such as beryllium ions, to form p-type ion implant regions 719 that create the self-aligned p-type contacts to the p-type modulation doped quantum well structure 20 that forms the QW channel of the p-channel HFET device. This implant can also possibly be accompanied by an implant of fluorine ions to prevent upward diffusion. A rapid thermal anneal (RTA) oxide is then deposited on the resultant structure and RTA operations are carried (for example, at 850° C. for 10 seconds) to activate the implant regions 719. After the RTA is complete, a second implant operation is carried out involving oxygen ions to form high resistance deep oxygen ion implant regions 721 in the bottom n+ contact layer 14, where such high resistance effectively blocks current flow therethrough. The peak density of the oxygen ion implant regions 721 can be controlled to provide the desired resistance. In one embodiment, the peak density of the oxygen ion implant regions 721 is at or near $1e^{19}$ cm-3. Multiple implants of oxygen ions at different energies can be used to provide complete coverage of the thickness of the bottom n+ contact layer 14. An RTA is then performed (preferably at 500° C. for about 15 seconds) in order to activate the oxygen ion implant regions 721. Note that the implant regions 719 and 721 are stacked on top another under both the source mesa 713 and the drain mesa 715 as best shown in FIG. 7B and extend parallel to the QW channel under the collector terminal electrode (Coll) along the lengthwise dimension of the QW channel on opposite sides of the QW channel. The current blocking oxygen ion implant regions 721 define an isolation region between the p-type implant regions 719 and the bottom N+-type ohmic contact layer 14 of the layer structure. Such isolation region is substantially devoid of conducting species and significantly reduces the capacitance between the source terminal electrode (S) and the gate terminal electrode (G). This capacitance can drastically lower the speed of response of the PHFET device if not reduced. Note the temperature (e.g., 500° C.) of the rapid thermal anneal operation that activates the oxygen ions of the implant regions 721 can be significantly less than the temperature (e.g., 850° C.) of the rapid thermal anneal operation that activates the ions of the implant regions 719.

The resulting structure is then etched to form a mesa 723 at the bottom n-type ohmic contact layer(s) 14 for the gate terminal electrode (G) as best shown in FIG. 7C.

The metal that defines the elongate collector terminal electrode (Coll), which is preferably a W—In alloy, is deposited and patterned on the top mesa 711 above the elongate QW channel in contact with the spacer layer 22. The metal of the collector terminal electrode (Coll) can have a wide tab-region 709 offset laterally from the source and drain terminal electrodes as best shown in FIG. 7A. The metal of the source and drain terminal electrodes (S) and (D), which is preferably an Au—Be alloy, is deposited and patterned on the mesas 713 and 715 in contact with the p-type ion implant regions 719 in order to contact the p-type modulation doped QW structure 20 that forms the QW channel of the p-channel device as best shown in FIG. 7B. The metal of the gate terminal electrode (G), which is preferably an Au—Ge—Ni alloy, is deposited and patterned on the mesa 723 in contact with the bottom n-type ohmic contact layer(s) 14 as best shown in FIG. 7C. The resultant structure can be heated to treat the metal alloys of the source, drain and gate electrodes as desired. In one embodiment, the resultant structure can be heated at 420° C. to treat the metal alloys of the source, drain, gate and collector electrodes of the device.

Both the n-channel HFET device and the p-channel HFET device are field effect transistors where current flows as a two-dimensional gas through a QW channel with contacts at either end. The basic transistor action is the modulation of the QW channel conductance by a modulated electric field that is perpendicular to the QW channel. The modulated electric field modulates the QW channel conductance by controlling an inversion layer (i.e., a two-dimensional electron gas for the n-channel HFET device or a two-dimensional hole gas for the p-channel HFET) as a function of gate voltage relative to source voltage.

For the n-channel HFET device, the QW channel conductance is turned on by biasing the gate terminal electrode and the source terminal electrode at voltages where the P/N junction of the gate and source regions is forward biased with minimal gate conduction and an inversion layer of electron gas is created in the QW channel of the n-type modulation doped quantum well structure 24 between the source terminal electrode and the drain terminal electrode. In this configuration, the source terminal electrode is the terminal electrode from which the electron carriers enter the QW channel of the n-type modulation doped quantum well structure 24, the drain terminal electrode is the terminal electrode where the electron carriers leave the device, and the gate terminal electrode is the control terminal for the device.

The p-channel HFET device of FIGS. 7A-7C operates in a similar manner to the n-channel HFET device with the current direction and voltage polarities reversed with respect to those of the n-channel HFET device. For the p-channel HFET device, the QW channel conductance is turned on by biasing the gate terminal electrode (G) and the source terminal electrode (S) at a voltage where the P/N junction of the source and gate regions is forward-biased with minimal gate conduction and an inversion layer of hole gas is created in the QW channel of the p-type modulation doped quantum well structure 20 between the source terminal electrode (S) and the drain terminal electrode (S). In this configuration, the source terminal electrode (S) is the terminal from which the hole carriers enter the QW channel of the p-type modulation doped quantum well structure 20, the drain terminal electrode (D) is the terminal where the hole carriers leave the device, and the gate terminal electrode (G) is the control terminal for the device.

The device structure of the present application can also be configured to realize bipolar inversion channel field-effect transistors (BICFETs) with either an n-type modulation doped quantum well inversion channel base region (n-channel base BICFET) or a p-type modulation doped quantum well inversion channel base region (p-channel base BICFET).

For the n-channel base BICFET device, an emitter terminal electrode (not shown) of the n-channel base BICFET device is operably coupled to the top p-type ohmic contact layer(s) 30 of the active device structure. A base terminal electrode (not shown) of the n-channel base BICFET device is operably coupled to the QW channel(s) realized in the n-type modulation doped QW structure 24. A collector terminal electrode (not shown) of the n-channel base BICFET device is operably coupled to the p-type modulation doped QW structure 20. The n-channel base BICFET device is a bipolar junction type transistor which can be operated in an active mode by applying a forward bias to the PN junction of the emitter and base regions while applying a reverse bias to the PN junction of the base and collector regions, which causes holes to be injected from the emitter terminal electrode to the collector terminal electrode. Because the holes are positive carriers, their injection contributes to current flowing out of the collector terminal electrode as well as current flowing into the emitter terminal electrode. The bias conditions also cause electrons to be injected from the base to the emitter, which contributes to current flowing out of the base terminal electrode as well as the current flowing into the emitter terminal electrode.

The p-channel base BICFET device is similar in construction to the p-channel HFET device of FIGS. 7A-7C with the following adaptations. An emitter terminal electrode of the p-channel base BICFET device, which is analogous to the gate terminal electrode of the p-channel HFET device, is operably coupled to the bottom n-type ohmic contact layer(s) 14 of the active device structure. A base terminal electrode of the p-channel base BICFET device, which is analogous to the source or drain electrode of the p-channel HFET device, is operably coupled to the QW channel(s) realized in the p-type modulation doped QW structure 20. A collector terminal electrode of the p-channel base BICFET device, which is analogous to the collector terminal electrode of the p-channel HFET device, is operably coupled to the spacer layer 22. The p-channel base BICFET device is a bipolar junction type transistor which can be operated in an active mode by applying a forward bias to the PN junction of the emitter and base regions while applying a reverse bias to the PN junction of the base and collector regions, which causes electrons to be injected from the emitter terminal electrode to the collector terminal electrode. Because the electrons are negative carriers, their injection contributes to current flowing into the collector terminal electrode as well as current flowing out of the emitter terminal electrode. The bias conditions also cause holes to be injected from the base to the emitter, which contributes to current flowing into the base terminal electrode as well as the current flowing out of the emitter terminal electrode.

The device structure of the present application can also be configured to realize optoelectronic devices such as an electrically-pumped laser or optical detector. To form a resonant cavity device for optical signal emission and/or detection, a top mirror can be formed over the active device structure described above. The top mirror can be formed by depositing pairs of semiconductor or dielectric materials with different refractive indices.

In one configuration, the resonant cavity of the device can be configured as a vertical cavity and light may enter and exit the vertical cavity through an optical aperture (not shown) in the top surface of the device such that the device operates as a vertical cavity surface emitting laser/detector. In this configuration, the distance between the top mirror and the bottom DBR mirror 12 represents the length of the optical cavity and can be set to correspond to the designated wavelength (such as 1 to 3 times the designated wavelength). This distance can take into account the penetration depth of the light into the bottom and top mirror. This distance is controlled by adjusting the thickness of one or more of the layers therebetween to enable this condition.

In another configuration, the resonant cavity of the device can be configured as a whispering gallery or closed-loop microresonator to support propagation of an optical mode signal within a waveguide region formed from the device structure. For the whispering gallery microresonator, the waveguide region can be a disk-like structure that supports propagation of a whispering gallery mode. The geometry of the disk-like structure is tuned to the particular wavelength of the whispering gallery mode. For example, the circumference of the disk-like structure can be configured to correspond to an integral number of wavelengths of a standing wave that circulates in the disk-like structure. For relatively small disk-like structures (e.g., 10 µm in diameter or less), the free spectral range FSR is large enough such that the diameter of the disk-like structure can dictate the particular wavelength of the whispering gallery mode. For the closed-loop microresonator, the waveguide can support circulating propagation of an optical mode that follows a circular optical path, a rectangular optical path, an oval optical path, or other suitable geometry. The optical path length of the closed-loop waveguide is tuned to the particular wavelength of the optical mode signal that is to propagate in the closed-loop waveguide. At least one coupling waveguide is formed integral to and adjacent the whispering gallery or closed-loop microresonator. The coupling waveguide provides for evanescent coupling of light to and/or from the whispering gallery or closed-loop microresonator. Specifically, for the laser, the whispering gallery mode produced by the whispering gallery microresonator or the optical mode signal that circulates in the closed-loop waveguide of the closed-loop microresonator is coupled to the coupling waveguide to produce an output optical signal that propagates in the coupling waveguide for output therefrom. For the detector, an input optical light is supplied to the coupling waveguide, which couples the input optical light as a whispering gallery mode in the whispering gallery microresonator for detection or as an optical mode signal that circulates in the closed-loop waveguide of the closed-loop microresonator for detection.

In the vertical cavity surface emitting laser/detector as well as the whispering gallery or closed-loop microresonator, an anode terminal electrode can be operably coupled to the top p-type ohmic contact layer(s) 30, and a cathode terminal electrode can be operably coupled to the n-type modulation doped QW structure 24. One or more optional electrodes can be operably coupled to the p-type modulation doped QW structure 20 as well as to the bottom n-type ohmic contact layer(s) 14. If present, these optional electrodes are configured to float electrically with respect to the electrical signals of the anode terminal electrode as well as of the cathode terminal electrode. In this manner, the p-type region of the p-type modulation doped QW structure 20 floats with respect to the electrical signals of the anode terminal electrode as well as of the cathode terminal electrode. Electrically, this configuration operates as an electrically-pumped diode laser or diode detector. This configuration is referred to herein as the top diode laser or top diode detector because the anode terminal electrode is operably coupled to the top p-type ohmic contact layer(s) 30 and the cathode terminal electrode is operably coupled to the n-type modulation doped QW structure 24.

For the top diode laser, the anode terminal electrode is forward biased relative to the cathode terminal electrode such that holes are injected from the anode terminal electrode into the QW channel(s) realized in the n-type modulation doped QW structure 24 in order to induce photon emission within the device structure. The lower p-type region of the active device structure (which includes the p-type modulation doped QW structure 20) floats with respect to the electrical signals of the anode terminal electrode as well as of the cathode terminal electrode. For the vertical cavity surface emitting laser, the photon emission within the device structure produces the optical mode that is emitted vertically through the top surface of the device structure. For the whispering gallery microresonator, the photon emission within the device structure produces the whispering gallery mode signal that circulates in the waveguide of the whispering gallery microresonator. For the closed-loop microresonator, the photon emission within the device structure produces the optical mode signal that circulates in the closed-loop waveguide of the closed-loop microresonator. In all of these configurations, the top diode laser operates by injecting electrons into the QW channel of the n-type modulation doped QW structure 24, which lowers the barrier of the n-type modulation doped QW structure 24 and allows holes to flow over this barrier to the QW of the p-type modulation doped QW structure 20. In passing over the barrier, very few holes are captured in the QW of the n-type modulation doped QW structure 24. Simultaneously, holes diffuse upwards from the QW of the p-type modulation doped QW structure 20 to the QW of the n-type modulation doped QW structure 24 where they recombine with the injected electrons to produce stimulated emission. However, it is also noted that the same process of diffusion of holes from the lower p-type modulation doped QW structure 20 to the upper n-type modulation doped QW structure 24 also applies to the electrons injected into the n-type modulation doped QW structure 24. In this way, the n-type modulation doped QW structure 24 supplies electrons by diffusion to the p-type modulation doped QW structure 20. That means there will also be electrons and holes in the lower p-type modulation doped QW structure 20 and therefore recombination and stimulated emission. This means that the lower p-type modulation doped QW structure 20 is not a loss mechanism but instead can contribute to the laser output even though there is no electrical contact to the lower QW structure. The laser contribution of the lower p-type modulation doped QW structure 20 may be somewhat less than the upper n-type modulation doped QW structure 24. It is also noted that in order for this process to work, the lower p-type modulation doped QW structure 20 must be allowed to float in potential so to allow the carrier diffusion mechanisms to operate as described above.

For the top diode detector, the anode terminal electrode is reversed biased relative to the cathode terminal electrode. The lower p-type region of the active device structure (which includes the p-type modulation doped QW structure 20) floats with respect to the electrical signals of the anode terminal electrode as well as of the cathode terminal electrode. The reverse bias conditions are selected such that the device produces photocurrent proportional to the intensity of an optical signal absorbed by the device structure. For the vertical cavity surface detector, the device structure absorbs the optical mode that is received vertically through the top surface of the device structure. For the whispering gallery microresonator, the device structure absorbs the whispering gallery mode that propagates in the waveguide of the whispering gallery microresonator. For the closed-loop microresonator, the device structure absorbs the optical mode signal that circulates in the closed-loop waveguide of the closed-loop microresonator.

In the vertical cavity surface emitting laser/detector as well as the whispering gallery and closed-loop microresonator, an anode terminal electrode can be operably coupled to the p-type modulation doped QW structure 20, and a cathode terminal electrode can be operably coupled to the bottom n-type ohmic contact layer(s) 14. One or more optional electrodes can be operably coupled to the n-type modulation doped QW structure 24 as well as to the top p-type ohmic contact layer(s) 30. If present, these optional electrodes are configured to float electrically with respect to the electrical signals of the anode terminal electrode as well as of the cathode terminal electrode. In this manner, the n-type region of the n-type modulation doped QW structure 24 floats with respect to the electrical signals of the anode terminal electrode as well as of the cathode terminal electrode. Electrically, this configuration operates as an electrically-pumped diode laser or diode detector. This configuration is referred to herein as the bottom diode laser or bottom diode detector because the anode terminal electrode is operably coupled to the p-type modulation doped QW structure 20, and a cathode terminal electrode is operably coupled to the bottom n-type ohmic contact layer(s) 14.

For the bottom diode laser, the anode terminal electrode is forwarded biased relative to the cathode terminal electrode such that holes are injected from the anode terminal electrode into the QW channel(s) realized in the p-type modulation doped QW structure 20 in order to induce photon emission within the device structure. The n-type region of the n-type modulation doped QW structure 24, when present, floats with respect to the electrical signals of the anode terminal electrode as well as of the cathode terminal electrode. For the vertical cavity surface emitting laser, the photon emission within the device structure produces the optical mode that is emitted vertically through the top surface of the device structure. For the whispering gallery microresonator, the photon emission within the device structure produces the whispering gallery mode that circulates in the waveguide of the whispering gallery microresonator. For the closed-loop microresonator, the photon emission within the device structure produces the optical mode signal that circulates in the closed-loop waveguide of the closed-loop microresonator. In all these configurations, the bottom diode laser operates by injecting holes into the QW channel of the p-type modulation doped QW structure 20. For the case where the n-type modulation doped QW structure 24 is present (i.e., it has not been etched away, for example as described with reference to the device of FIGS. 2A and 2B), the upper n-type modulation doped QW structure 24 can contribute to emission. It is also noted that in order for this process to work, the upper n-type modulation doped QW structure 24 must be allowed to float in potential so to allow carrier diffusion mechanisms that stimulate such emission to operate.

For the bottom diode detector, the anode terminal electrode is reversed biased relative to the cathode terminal electrode. The n-type region of the modulation doped QW structure 24 floats with respect to the electrical signals of the anode terminal electrode as well as of the cathode terminal electrode. The reverse bias conditions are selected such that the device produces photocurrent proportional to the intensity of an optical signal absorbed by the device structure. For the vertical cavity surface detector, the device structure absorbs the optical mode that is received vertically through the top surface of the device structure. For the whispering gallery microresonator, the device structure absorbs the whispering gallery mode that circulates in the waveguide region of the whispering gallery microresonator. For the closed-loop microresonator, the device structure absorbs the optical mode signal that circulates in the closed-loop waveguide of the closed-loop microresonator.

In the vertical cavity surface emitting laser/detector as well as the whispering gallery and closed-loop microresonators, at least one anode terminal electrode can be operably coupled to the top p-type contact layer 30, a bottom cathode terminal electrode can be operably coupled to the bottom n-type contact layer 14, an n-channel injector terminal can be operably coupled to the n-type modulation doped QW structure 24. A p-channel injector terminal can also be operably coupled to the p-type modulation doped QW structure 20. Electrically, this configuration operates as an electrically-pumped thyristor laser or thyristor detector.

For the thyristor laser, the device structure switches from a non-conducting/OFF state (where the current I through the device is substantially zero) to a conducting/ON state (where current I s substantially greater than zero) when i) the anode terminal electrode is forward biased with respect to the cathode terminal electrode and ii) the voltage between n-channel injector and the anode electrode is biased such that charge is produced in the n-type modulation doped QW structure 32 that is greater than the critical switching charge $Q_{CR}$, which is that charge that reduces the forward breakdown voltage such that no off state bias point exists. The voltage between p-channel injector electrode and cathode electrode can also be configured to produce a charge in the p-type modulation doped QW structure 20 that is greater than the critical switching charge $Q_{CR}$. The critical switching charge $Q_{CR}$ is unique to the geometries and doping levels of the device. The device switches from the conducting/ON state (where the current I is substantially greater than zero) to a non-conducting/OFF state (where current I is substantially zero) when the current I through device falls below the hold current of the device for a sufficient period of time such that the charge in the n-type modulation doped QW structure 24 (or the charge in the p-type modulation doped QW structure 20) decreases below the holding charge $Q_H$, which is the critical value of the channel charge which will sustain holding action. Thus, if the anode terminal is forward biased with respect to the cathode terminal and the n-channel injector terminal (and/or the p-channel injector terminal) is biased to produce the critical switching charge $Q_{CR}$ in the n-type modulation doped QW structure 24 (or in the p-type modulation doped QW structure 20), then the device will switch to its conducting/ON state. If the current I in the conducting/ON state is above the threshold for lasing $I_{TH}$, then photon emission will occur within the device structure. For the vertical cavity surface emitting laser, the photon emission within the device structure produces the optical mode that is emitted vertically through the top surface of the device structure. For the whispering gallery microresonator, the photon emission within the device structure produces the whispering gallery mode signal that circulates in the waveguide region of the whispering gallery microresonator. For the closed-loop microresonator, the photon emission within the device structure produces the optical mode signal that circulates in the closed-loop waveguide of the closed-loop microresonator.

For the thyristor detector, the device structure switches from a non-conducting/OFF state (where the current I through the device is substantially zero) to a conducting/ON state (where current I is substantially greater than zero) in response to an input optical signal that produces charge in the n-type modulation doped QW structure 24 and/or the p-type modulation doped QW structure 20 resulting from photon absorption of the input optical signal. Specifically, the anode terminal electrode is forward biased with respect to the cathode terminal electrode and the voltage between n-channel injector and the anode electrode (and/or the voltage between the p-channel injector and the cathode terminal electrode) is biased such that that charged produced in the n-type modulation doped QW structure 24 (and/or the p-type modulation doped QW structure 20) resulting from photon absorption of the input optical pulse is greater than the critical switching charge $Q_{CR}$. When the input optical signal is removed, the device switches from the conducting/ON state (where the current I is substantially greater than zero) to a non-conducting/OFF state (where current I is substantially zero) when the charge in the n-type modulation doped QW structure 24 (and/or the p-type modulation doped QW structure 20) decreases below the holding charge $Q_H$. For the vertical cavity surface detector, the device structure absorbs the optical mode that is received vertically through the top surface of the device structure. For the whispering gallery microresonator, the device structure absorbs the whispering gallery mode that circulates in the waveguide region of the whispering gallery microresonator. For the closed-loop microresonator, the device structure absorbs the optical mode signal that circulates in the closed-loop waveguide of the closed-loop microresonator.

In alternate configurations based upon the vertical cavity surface emitting laser/detector as described above, a diffraction grating can be formed in the top mirror over the active device structure described above. For the laser, the diffraction grating performs the function of diffracting light produced within the resonant vertical cavity into light propagating laterally in a waveguide which has the top DBR mirror and bottom DBR mirror 12 as waveguide cladding layers and which has lateral confinement regions. For the detector, the diffraction grating performs the function of diffracting incident light that is propagating in the lateral direction into a vertical cavity mode, where it is absorbed resonantly in the vertical resonant cavity.

Details of examples of these device structures and specifics of exemplary layer structures utilizing group III-V materials are described in U.S. application Ser. No. 13/921, 311, filed on Jun. 19, 2013, and Intern. Pat. Appl. No. PCT/US2012/051265, filed on Aug. 17, 2012, which are commonly assigned to assignee of the present application and herein incorporated by reference in their entireties.

Figure 2B:
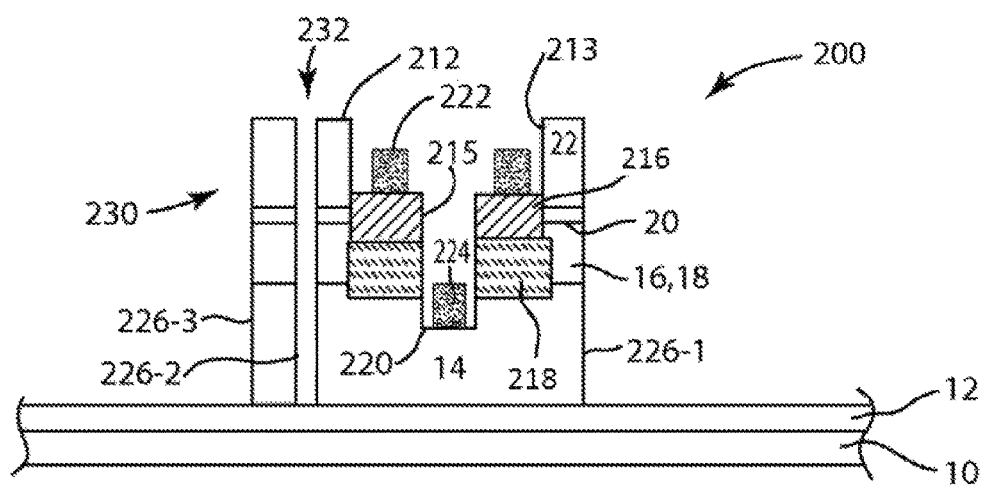

FIGS. 2A-2B illustrate an embodiment of a whispering gallery microresonator 200 realized as part of an optoelectronic integrated circuit that employs the layer structure of FIG. 1. The whispering gallery microresonator 200 is a bottom diode laser or optical detector as describe above. Thus, it can be configured as a laser or as an optical detector. In this embodiment, the whispering gallery microresonator 200 includes a mesa 212 that is formed by etching the layer structure of FIG. 1 to a depth near the top of layer 22, and then patterning and etching the resultant structure to define the inner annular sidewall 213 that forms the circular profile of the mesa 212 as evident from FIG. 2A. The inner sidewall 213 extends to an intermediate mesa 214 formed in the layer structure in spacer layer(s) 22 above (but near) the p-type modulation doped quantum well structure 20. The intermediate mesa 214 has an annular profile as defined by the annular sidewall 213 and an annular sidewall 215 (which is offset radially inside the sidewall 213) as shown in FIG. 2B.

Two ion implant regions 216, 218 are defined by ion implantation through the intermediate mesa 214. The ion implant regions 216, 218 are similar to the ion implant regions 719 and 721 of the p-channel HFET as described above with respect to FIG. 7 and can be implanted together with these implants with the same ions species (i.e., p-type acceptor ions for the ion implant region 216 and oxygen species for the ion implant region 218) as described above. The implant region 216 is implanted to a depth that encompasses the p-type modulation doped QW structure 20 with an annular pattern that is disposed laterally inside the projection of the annular sidewall 213 as evident from FIG. 2B. The implant region 216 provides for electrical contact to the annular p-type modulation doped QW structure 20 that surrounds the implant region 216. The ion implant region 218 (which has the deepest depth of the two implant regions) is implanted into the N+-type layer(s) 14 with a pattern that is disposed laterally inside the projection of the annular sidewall 213 as evident from FIG. 2B. In this manner, the implant region 216 overlies the implant region 218. The high resistance deep oxygen ion implant region 218 effectively blocks current flow therethrough and thus operates to funnel or steer current into the active region of the resonant cavity of the device. Furthermore, the current blocking oxygen ion implant region 218 defines an isolation region between the p-type implant region 216 and the bottom N+-type ohmic contact layer 14 of the layer structure. Such isolation region is substantially devoid of conducting species and significantly reduces the capacitance between the anode terminal electrode 222 and the cathode terminal electrode 224 of the device. This capacitance can drastically lower the speed of response of the device if not reduced.

The resultant structure is patterned and etched to form the annular sidewall 215 that extends downward to a central bottom mesa 220 formed in the bottom ohmic contact layer 14. The bottom mesa 220 has a circular profile as defined by the annular sidewall 215 as best shown in FIG. 2A. This etching step can also remove the central portion of the implant regions 216 and 218 such that they each have an annular profile disposed laterally between the annular sidewall 215 and the projection of sidewall 213 as shown in FIG. 2B.

An anode terminal electrode 222 is formed on the intermediate mesa 214 with an annular pattern that is offset laterally inside the annular sidewall 213 as best shown in FIGS. 2A and 2B. The anode terminal electrode 222 contacts the p-type ion implant regions 216, which contact the p-type modulation doped QW structure 20 of the device structure. A cathode terminal electrode 224 is formed on the bottom mesa 220 in contact with the bottom n-type ohmic contact layer(s) 14 as best shown in FIG. 2B. The cathode terminal electrode 224 can be patterned as a circular tab as best shown in FIG. 2A or can have some other shape. Similar to the source, drain and gate terminal electrodes of the p-channel HFET device as described above with respect to FIGS. 7A and 7B, the metal of the anode terminal electrode 222 is preferably an Au—Be alloy, and the metal of the cathode terminal electrode 224 is preferably an Au—Ge—Ni alloy. The resultant structure can be heated to treat the metal alloys of the source, drain and gate electrodes as desired. In one embodiment, the resultant structure can be heated at 420° C. to treat the metal alloys of the anode and cathode electrodes of the device. Such metallization can be carried out in tandem with the metallization of the source, drain and gate electrodes of the p-channel HFET device as described above with respect to FIGS. 7A and 7B or the electrode of other devices integrally formed on the substrate 10.

Following the metallization, the resultant structure is patterned and etched to form sidewalls 226 that extend from the top mesa 212 to the mirror layers 12. One of the sidewalls 226-1 forms the outer annular periphery of the top mesa 212. Two other sidewalls 226-2 and 226-3 form a waveguide rib that defines a coupling waveguide 230 extending tangential to the outer annular sidewall 226-1 of the resonator device as best shown on FIG. 2A. The sidewall 226-2 of the coupling waveguide 230 is offset from the annular sidewall 226-1 by a narrow gap 232 and the height of the coupling waveguide 230 can match the height of the mesa 212 as best shown in FIG. 2B.

A trench etch can expose the bottom mirror layers 12 in the vicinity of both the whispering gallery microresonator 200 and the coupling waveguide 230. The exposed bottom mirror layers 12 can be oxidized in steam ambient. A dielectric top mirror (not shown) can cover the top mesa 212 and the annular sidewalls of the microresonator 200 and the coupling waveguide 230. The dielectric material of the top mirror can fill the gap 232.

The index changes provided by the top mesa 212 (together with the top mirror when present), the inner annular sidewall 213, the outer annular sidewall 226-1, the ion implant regions 216, 218, and the bottom DBR mirror 12 form a resonant cavity with an disk-shaped annular volume that is configured to support a whispering gallery optical mode signal. The thickness of the disk-shaped annular volume can be configured to correspond to at or near one wavelength (for example, a thickness at or near 1 µm for a whispering gallery optical mode signal in the near-infrared range of the electromagnetic spectrum). The thickness of the disk-shaped annular volume can encompass relatively equal portions of the layer structure of FIG. 1 above and below the p-type modulation doped quantum well structure 20. The coupling waveguide 230 provides for evanescent coupling of light to and/or from the resonant cavity of the whispering gallery microresonator device 200. Electrically, the whispering gallery microresonator device 200 can operate as an electrically-pumped bottom diode laser or bottom diode detector.

For the bottom diode laser, the anode terminal electrode 222 is forward biased relative to the cathode terminal electrode 224 such that holes are injected from the anode terminal electrode 222 into the QW channel(s) realized in the p-type modulation doped QW structure 20 in order to induce photon emission within the device structure. The current-blocking ion implant region 218 funnels the injected hole current that flow from the anode terminal electrode 222 and the p-type contact implant region 216 into the QW channel of the p-type modulation doped QW structure 20 within the annular volume of the resonant cavity of the device. Such current funneling enhances the current density of the injected current in the QW channel of the p-type modulation doped QW structure 20 within the annular volume of the resonant cavity of the device, which can improve the output power of the device and/or lower the laser threshold voltage of the device.

For the diode detector, the anode terminal electrode 222 is reversed biased relative to the cathode terminal electrode 224. An input optical light is supplied to the coupling waveguide 230, which couples the input optical light as a whispering gallery mode signal that propagates in the annular resonant cavity of the whispering gallery microresonator device 200 for absorption by the device structure. The reverse bias conditions of the anode terminal electrode 222 and the cathode terminal electrode 224 are configured such the diode detector produces photocurrent between the anode terminal electrode 222 and the cathode terminal electrode 224 that is proportional to the intensity of the whispering gallery optical mode absorbed by the device structure. The photocurrent flows between the anode terminal 222 and cathode terminal 224 under the reverse bias. The current-blocking ion implant region 218 substantially reduces dark leakage current, which can greatly reduce the sensitivity of the device if not addressed.

Figure 3A:
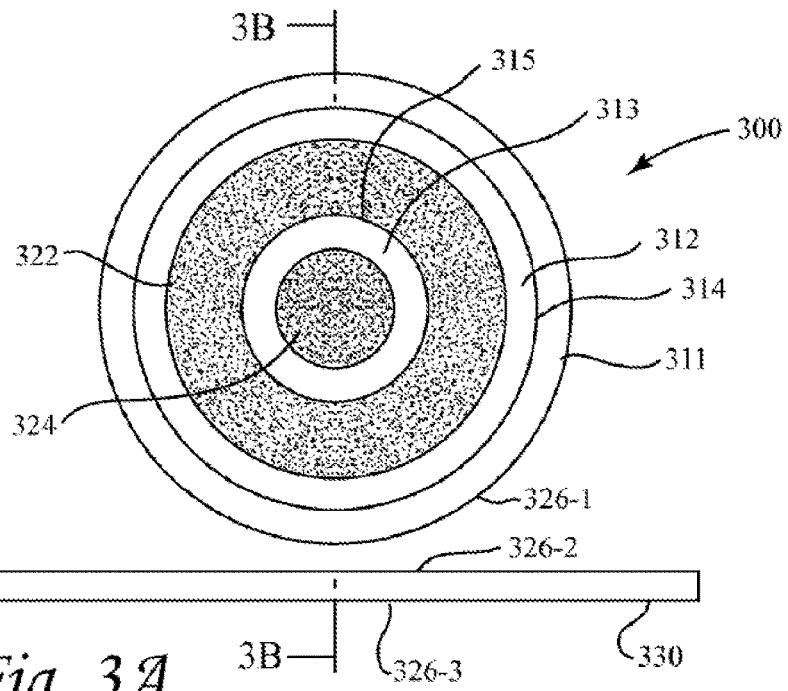
FIG. 3A-3B illustrate a diode ring microresonator realized as part of an optoelectronic integrated circuit that employs the layer structure of FIG. 1.
Figure 3B:
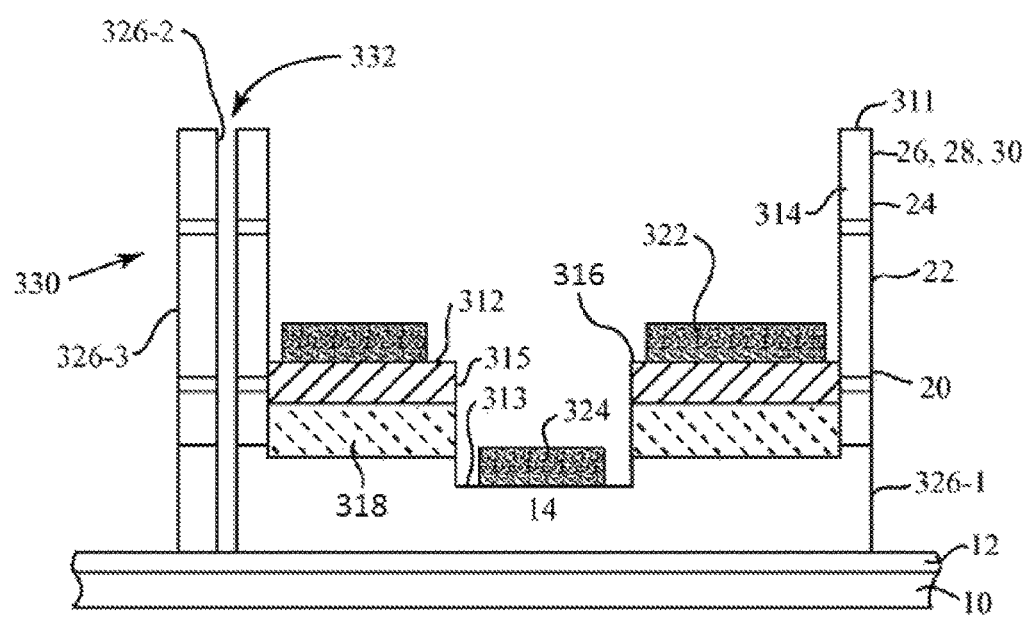

FIGS. 3A-3B illustrate an embodiment of a closed-loop (ring) microresonator 300 realized as part of an optoelectronic integrated circuit that employs the layer structure of FIG. 1. The ring microresonator 300 is a bottom diode laser or optical detector as described above. Thus, it can be configured as a laser or as an optical detector. In this embodiment, the ring microresonator 300 includes a top mesa 311, an intermediate mesa 312 that is surrounded by the top mesa 311, and a central bottom mesa 313 that is surrounded by the intermediate mesa 312. The top mesa 311 is formed by the top surface of layer 30 of the layer structure of FIG. 1. The intermediate mesa 312 is formed by patterning and etching the layer structure to a depth in spacer layer(s) 22 above (but near) the p-type modulation doped quantum well structure 20 to define the annular sidewall 314 that forms the outer circular profile of the mesa 312 as evident from FIG. 3A. The sidewall 314 extends to the intermediate mesa 313 formed in the layer structure in the spacer layer(s) 22 above (but near) the p-type modulation doped quantum well structure 20. The intermediate mesa 312 has an annular profile as defined by the annular sidewall 314 and an annular sidewall 315 (which is offset radially inside the sidewall 314) as shown in FIG. 3B.

Two ion implant regions 316, 318 are defined by ion implantation through the intermediate mesa 312. The ion implant regions 316, 318 are similar to the ion implant regions 719 and 721 of the p-channel HFET as described above with respect to FIG. 7 and can be implanted together with these implants with the same ions species (i.e., p-type acceptor ions for the ion implant region 316 and oxygen species for the ion implant region 318) as described above. The implant region 316 is implanted to a depth that encompasses the p-type modulation doped QW structure 20 with an annular pattern that is disposed laterally inside the projection of the annular sidewall 314 as evident from FIG. 3B. The implant region 316 provides for electrical contact to the annular p-type modulation doped QW structure 20 that surrounds the implant region 316. The ion implant region 318 (which has the deepest depth of the two implant regions) is implanted into the N+-type layer 14 with a pattern that is disposed laterally inside the projection of the annular sidewall 314 as evident from FIG. 3B. In this manner, the implant region 316 overlies the implant region 318. The high resistance deep oxygen ion implant region 318 effectively blocks current flow therethrough and thus operates to funnel or steer current into the active region of the resonant cavity of the device. Furthermore, the current blocking oxygen ion implant region 318 defines an isolation region between the p-type implant region 316 and the bottom N+-type ohmic contact layer 14 of the layer structure. Such isolation region is substantially devoid of conducting species and significantly reduces the capacitance between the anode terminal electrode 322 and the cathode terminal electrode 324 of the device. This capacitance can drastically lower the speed of response of the device if not reduced.

The resultant structure is patterned and etched to form the annular sidewall 315 that extends downward to the bottom mesa 313 formed in the bottom ohmic contact layer 14. The bottom mesa 313 has a circular profile as defined by the annular sidewall 313 as best shown in FIG. 3A. This etching step can also remove the central portion of the implant regions 316 and 318 such that they each have an annular profile disposed laterally between the annular sidewall 315 and the projection of sidewall 314 as shown in FIG. 3B.

An anode terminal electrode 322 is formed on the intermediate mesa 312 with an annular pattern that is offset laterally inside the annular sidewall 314 as best shown in FIGS. 3A and 3B. The anode terminal electrode 322 contacts the p-type ion implant regions 316, which contact the p-type modulation doped QW structure 20 of the device structure. A cathode terminal electrode 324 is formed on the bottom mesa 313 in contact with the bottom n-type ohmic contact layer(s) 14 as best shown in FIG. 3B. The cathode terminal electrode 224 can be patterned as a circular tab as best shown in FIG. 3A or can have some other shape. Similar to the source, drain and gate terminal electrodes of the p-channel HFET device as described above with respect to FIGS. 7A and 7B, the metal of the anode terminal electrode 322 is preferably an Au—Be alloy, and the metal of the cathode terminal electrode 324 is preferably an Au—Ge—Ni alloy. The resultant structure can be heated to treat the metal alloys of the source, drain and gate electrodes as desired. In one embodiment, the resultant structure can be heated at 420° C. to treat the metal alloys of the anode and cathode electrodes of the device. Such metallization can be carried out in tandem with the metallization of the source, drain and gate electrodes of the p-channel HFET device as described above with respect to FIGS. 7A and 7B or the electrode of other devices integrally formed on the substrate 10.

Following the metallization, the resultant structure is patterned and etched to form sidewalls 326 that extend from the top mesa 311 to the mirror layers 12. One of the sidewalls 326-1 forms the outer annular periphery of the top mesa 311. Two other sidewalls 326-2 and 326-3 form a waveguide rib that defines a coupling waveguide 330 extending tangential to the outer annular sidewall 326-1 of the resonator device 300 as best shown on FIG. 3A. The sidewall 326-2 of the coupling waveguide 330 is offset from the annular sidewall 326-1 by a narrow gap 332 and the height of the coupling waveguide 330 can match the height of the mesa 31 as best shown in FIG. 3B.

A trench etch can expose the bottom mirror layers 12 in the vicinity of both the ring microresonator 300 and the coupling waveguide 330. The exposed bottom mirror layers 12 can be oxidized in steam ambient. A dielectric top mirror (not shown) can cover the top mesa 311 and the annular sidewalls of the resonator 300 and the coupling waveguide 330. The dielectric material of the top mirror can fill the gap 332.

The index changes provided by the top mesa 311 (together with the top mirror when present), the inner annular sidewall 314, the outer annular sidewall 326-1, the ion implant regions 316, 318, and the bottom DBR mirror 12 form a resonant cavity with a ring-shaped annular volume that is configured to support circulating propagation of an optical mode signal about the ring-shaped volume. The length of the optical path of the ring-shaped annular volume of the resonant cavity is tuned to the particular wavelength of the optical mode signal that is to propagate in the resonant cavity. Specifically, the length L of the optical path is selected to conform to the following:

$$L = \frac{2\pi m \lambda_c}{n_{eff}} \quad (1)$$

where m is an integer greater than zero;
$\lambda_c$ is the wavelength of the optical mode signal that propagates in ring-shaped annular volume of the resonant cavity; and $n_{eff}$ is the effective refractive index of the ring-shaped annular volume of the resonant cavity.

The width of the ring-shaped annular volume of the resonant cavity (i.e., the radial offset between the annular sidewalls 314, 326-1) can be less than 2 µm, and possibly 1 µm or less. The thickness of the ring-shaped annular volume can be configured to correspond to at or near one wavelength (for example, a thickness at or near 1 µm for an optical mode signal in the near-infrared range of the electromagnetic spectrum). The thickness of the ring-shaped annular volume can encompass relatively equal portions of the layer structure of FIG. 1 above and below the p-type modulation doped quantum well structure 20. The coupling waveguide 330 provides for evanescent coupling of light to and/or from the resonant cavity of the ring microresonator device 300. Electrically, the ring microresonator device 300 can operate as an electrically-pumped bottom diode laser or bottom diode detector.

For the bottom diode laser, the anode terminal electrode 322 is forwarded biased relative to the cathode terminal electrode 324 such that holes are injected from the anode terminal electrode 322 into the QW channel(s) realized in the p-type modulation doped QW structure 20 in order to induce photon emission within the device structure. The current-blocking ion implant region 318 funnels or steers the injected hole current that flows from the anode terminal electrode 322 and the p-type contact implant region 316 into the QW channel of the p-type modulation doped QW structure 20 within the ring-shaped annular volume of the resonant cavity of the device. Such current funneling or steering enhances the current density of the injected current in the QW channel of the p-type modulation doped QW structure 20 within the ring-shaped annular volume of the resonant cavity of the device, which can improve the output power of the device and/or lower the laser threshold voltage of the device.

For the diode detector, the anode terminal electrode 322 is reversed biased relative to the cathode terminal electrode 324. An input optical light is supplied to the coupling waveguide 330, which couples the input optical light as an optical mode signal that circulates in the ring-shaped annular resonant cavity of the ring microresonator device 300 for absorption by the device structure. Under reverse bias conditions the anode terminal electrode 322 and the cathode terminal electrode 324 are configured such the diode detector produces photocurrent between the anode terminal electrode 322 and the cathode terminal electrode 324 that is proportional to the intensity of the optical mode signal absorbed by the device structure. The photocurrent flows between the anode terminal 322 and cathode terminal 324 under the reverse bias. The current-blocking ion implant region 318 substantially reduces dark leakage current, which can greatly reduce the sensitivity of the device if not addressed.

Figure 4A:
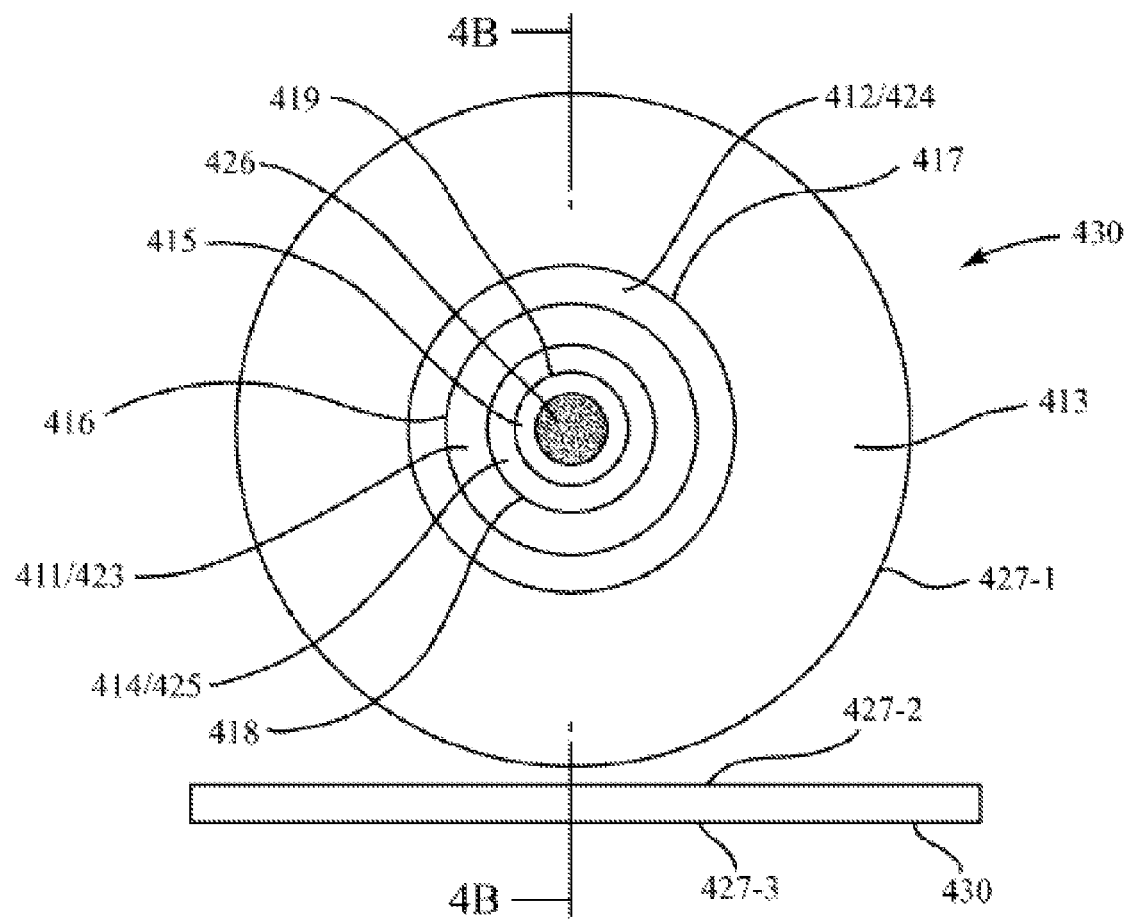
FIGS. 4A-4B illustrate a thyristor whispering gallery microresonator realized as part of an optoelectronic integrated circuit that employs the layer structure of FIG. 1.
Figure 4B:
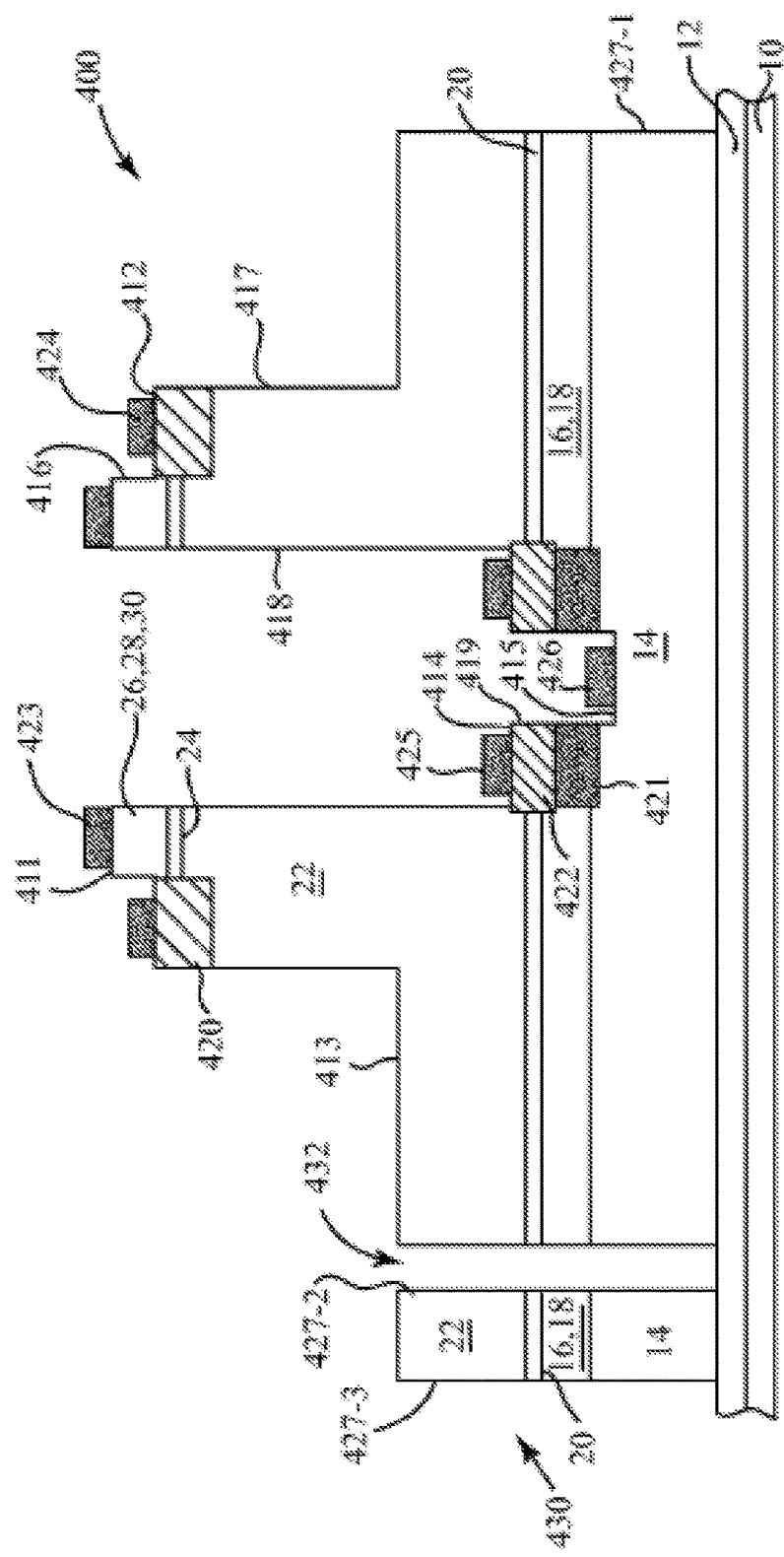

FIGS. 4A-4B illustrate an embodiment of a whispering gallery thyristor microresonator 400 realized as part of an optoelectronic integrated circuit that employs the layer structure of FIG. 1. The whispering gallery thyristor microresonator 400 is a thyristor laser or optical detector as describe above. Thus, it can be configured as a laser or as an optical detector. In this embodiment, the whispering gallery thyristor microresonator 400 includes a top mesa 411, a first intermediate mesa 412 that is disposed outside the outer periphery of the top mesa 411, a second intermediate mesa 413 that is disposed outside the outer periphery of the first intermediate mesa 412, a third intermediate mesa 414 that is disposed inside the inner periphery of the top mesa 411, and a central bottom mesa 415 that is disposed inside the inner periphery of the third intermediate mesa 414.

The top mesa 411 is formed by the top surface of layer 30 of the layer structure of FIG. 1. An anode terminal electrode 423 is formed on the top mesa 411 with an annular pattern as best shown in FIGS. 4A and 4B. The anode terminal electrode 423 contacts the top p-type ohmic contact layer 30. The metal of the anode terminal electrode 423 can be tungsten or other suitable metal or alloy. The metal of the anode terminal electrode 423 can be patterned by a lift off by oxide process as described below with respect to FIGS. 9A-9D.

The first intermediate mesa 412 is formed by patterning and etching the layer structure to a depth in layer(s) 26 above (but near) the n-type modulation doped quantum well structure 24 to define the annular sidewall 416 that forms the inner circular profile of the mesa 412 as evident from FIG. 4A. The sidewall 416 extends to the first intermediate mesa 412 formed in the layer structure in the layer(s) 26 above (but near) the n-type modulation doped quantum well structure 24. The first intermediate mesa 412 has an annular profile as defined by the annular sidewall 416 and an annular sidewall 417 (which is offset radially outside the sidewall 416) as shown in FIG. 4B. The patterned metal of the anode terminal electrode 423 can be used as a mask layer for the etch of the sidewall 416 if desired The second intermediate mesa 413 is formed by patterning and etching the layer structure to a depth near the middle of spacer layer(s) 22 to define the annular sidewall 417 that forms the inner circular profile of the second intermediate mesa 413 as evident from FIG. 4A. The sidewall 417 extends to the second intermediate mesa 413 formed in the layer structure near the middle of the spacer layer(s).

The third intermediate mesa 414 is formed by patterning and etching the layer structure to a depth in spacer layer(s) 22 above (but near) the p-type modulation doped quantum well structure 20 to define the annular sidewall 418 that forms the outer circular profile of the third intermediate mesa 414 as evident from FIG. 4A. The sidewall 418 extends to the third intermediate mesa 414 formed in the layer structure in the spacer layer(s) 22 above (but near) the p-type modulation doped quantum well structure 20. The third intermediate mesa 414 has an annular profile as defined by the annular sidewall 418 and an annular sidewall 419 (which is offset radially inside the sidewall 418) as shown in FIG. 4B. The patterned metal of the anode terminal electrode 423 can be used as a mask layer for the etch of the sidewall 418 if desired An ion implant region 420 is defined by ion implantation of n-type ions through the first intermediate mesa 412. The ion implant 420 is implanted to a depth that encompasses the n-type modulation doped QW structure 24 with an annular pattern that is disposed laterally outside the projection of the annular sidewall 416 as evident from FIG. 4B. The implant region 420 provides for electrical contact to the annular n-type modulation doped QW structure 24 that surrounds the implant region 420.

Two ion implant regions 421, 422 are defined by ion implantation through the intermediate mesa 414. The ion implant regions 421, 422 are similar to the ion implant regions 719 and 721 of the p-channel HFET as described above with respect to FIG. 7 and can be implanted together with these implants with the same ions species (i.e., p-type acceptor ions for the ion implant region 421 and oxygen species for the ion implant region 422) as described above. The implant region 421 is implanted to a depth that encompasses the p-type modulation doped QW structure 20 with an annular pattern that is disposed laterally inside the projection of the annular sidewall 418 as evident from FIG. 4B. The implant region 421 provides for electrical contact to the annular p-type modulation doped QW structure 20 that surrounds the implant region 421. The ion implant region 422 (which has the deepest depth of the two implant regions) is implanted into the N+-type layer 14 with a pattern that is disposed laterally inside the projection of the annular sidewall 418 as evident from FIG. 4B. In this manner, the implant region 421 overlies the implant region 422. The high resistance deep oxygen ion implant region 422 effectively blocks current flow therethrough and thus operates to funnel or steer current into the active region of the resonant cavity of the device. Furthermore, the current blocking oxygen ion implant region 422 defines an isolation region between the p-type implant region 421 and the bottom N+-type ohmic contact layer 14 of the layer structure. Such isolation region is substantially devoid of conducting species and significantly reduces the capacitance between the p-channel injector terminal electrode 425 and the cathode terminal electrode 426 of the device. This capacitance can drastically lower the speed of response of the device if not reduced.

The resultant structure is patterned and etched to form the annular sidewall 419 that extends downward to the central bottom mesa 415 formed in the bottom ohmic contact layer 14. The bottom mesa 415 has a circular profile as defined by the annular sidewall 419 as best shown in FIG. 4A. This etching step can also remove the central portion of the implant regions 421 and 422 such that they each have an annular profile disposed laterally between the annular sidewall 419 and the projection of sidewall 418 as shown in FIG. 4B.

An n-channel injector terminal electrode 424 is formed on the first intermediate mesa 412 as best shown in FIGS. 4A and 4B. The n-channel injector terminal electrode 424 contacts the n-type ion implant region 420, which contacts the n-type modulation doped QW structure 24 of the device structure. A p-channel injector terminal electrode 425 is formed on the third intermediate mesa 414 with an annular pattern as best shown in FIGS. 4A and 4B. The p-channel injector terminal electrode 425 contacts the p-type ion implant region 422, which contacts the p-type modulation doped QW structure 20 of the device structure. A cathode terminal electrode 426 is formed on the bottom mesa 415 in contact with the bottom n-type ohmic contact layer(s) 14 as best shown in FIG. 4B. The cathode terminal electrode 426 can be patterned as a circular tab as best shown in FIG. 4A or can have some other shape. Similar to the source, drain, gate and collector terminal electrodes of the p-channel HFET device as described above with respect to FIGS. 7A and 7B, the metal of the p-channel injector terminal electrode 425 is preferably an Au—Be alloy, and the metal of the n-channel injector terminal 424 and the cathode terminal electrode 426 is preferably an Au—Ge—Ni alloy. The resultant structure can be heated to treat the metal alloys of the electrodes of the device as desired. In one embodiment, the resultant structure can be heated at 420° C. to treat the metal alloys of the device. Such metallization can be carried out in tandem with the metallization of the source, drain and gate electrodes of the p-channel HFET device as described above with respect to FIGS. 7A and 7B or the electrode(s) of other devices integrally formed on the substrate 10.

Following the metallization, the resultant structure is patterned and etched to form sidewalls 427 that extend from the second intermediate mesa 413 to the mirror layers 12. One of the sidewalls 427-1 forms the outer annular periphery of the resonator device such that the second intermediate mesa 413 of the resonator device 400 has an annular profile as defined by the annular sidewall 417 and the annular sidewall 427-1 (which is offset radially outside the sidewall 417) as shown in FIG. 4B. Two other sidewalls 427-2 and 427-3 form a waveguide rib that defines a coupling waveguide 430 extending tangential to the outer annular sidewall 427-1 of the resonator device 400 as best shown on FIG. 4A. The sidewall 427-2 of the coupling waveguide 430 is offset from the annular sidewall 427-1 by a narrow gap 432 and the height of the coupling waveguide 440 can match the height of the mesa 413 of the resonator device 400 as best shown in FIG. 4B.

A trench etch can expose the bottom mirror layers 12 in the vicinity of both the thyristor whispering gallery microresonator 400 and the coupling waveguide 430. The exposed bottom mirror layers 12 can be oxidized in steam ambient. A dielectric top mirror (not shown) can cover the mesas 413, 412, 411 and the annular sidewalls of the resonator 400 and the coupling waveguide 430. The dielectric material of the top mirror can fill the gap 432.

The index changes provided by the mesa 413 (together with the top mirror when present), the inner annular sidewall 418, the outer annular sidewall 427-1, the ion implant regions 421, 422, and the bottom DBR mirror 12 form a resonant cavity with a disk-shaped annular volume that is configured to support a whispering gallery optical mode signal. The thickness of the disk-shaped annular volume can be configured to correspond to at or near one wavelength (for example, a thickness at or near 1 μm for a whispering gallery optical mode signal in the near-infrared range of the electromagnetic spectrum). The thickness of the disk-shaped annular volume can encompass relatively equal portions of the layer structure of FIG. 1 above and below the p-type modulation doped quantum well structure 20. The coupling waveguide 430 provides for evanescent coupling of light to and/or from the resonant cavity of the thyristor whispering gallery microresonator device 400. Electrically, the thyristor whispering gallery microresonator device 400 can operate as an electrically-pumped thyristor laser or thyristor detector.

For the thyristor laser, the device structure switches from a non-conducting/OFF state (where the current I through the device is substantially zero) to a conducting/ON state (where current I is substantially greater than zero) when i) the anode terminal electrode 423 is forward biased with respect to the cathode terminal electrode 426 and ii) the voltage between n-channel injector 424 and the anode electrode 423 is biased such that charge is produced in the n-type modulation doped QW structure 24 that is greater than the critical switching charge $Q_{CR}$, which is that charge that reduces the forward breakdown voltage such that no off state bias point exists. The voltage between p-channel injector electrode 425 and the cathode electrode 426 can also be configured to produce a charge in the p-type modulation doped QW structure 20 that is greater than the critical switching charge $Q_{CR}$. The critical switching charge $Q_{CR}$ is unique to the geometries and doping levels of the device. The device switches from the conducting/ON state (where the current I is substantially greater than zero) to a non-conducting/OFF state (where current I is substantially zero) when the current I through device falls below the hold current of the device for a sufficient period of time such that the charge in the n-type modulation doped QW structure 24 (or the charge in the p-type modulation doped QW structure 20) decreases below the holding charge $Q_H$, which is the critical value of the channel charge which will sustain holding action. Thus, if the anode terminal 423 is forward biased with respect to the cathode terminal 426 and the n-channel injector terminal 424 (and/or the p-channel injector terminal 425) is biased to produce the critical switching charge $Q_{CR}$ in the n-type modulation doped QW structure 24 (or in the p-type modulation doped QW structure 20), then the device will switch to its conducting/ON state. If the current I in the conducting/ON state is above the threshold for lasing $I_{TH}$, then photon emission will occur within the device structure. For the microresonator 400, such photon emission produces the whispering gallery mode signal that circulates in the resonant cavity of the microresonator 400, which is coupled to the coupling waveguide 430 to produce an output optical signal that propagates in the coupling waveguide 430 for output therefrom. The current-blocking ion implant region 421 funnels the current that flows from between the anode terminal electrode 423 and the cathode terminal electrode 426 into the QW channel of the p-type modulation doped QW structure 20 within the disk-shaped annular volume of the resonant cavity of the device. Such current funneling enhances the current density of the injected current in the QW channel of the p-type modulation doped QW structure 20 within the disk-shaped annular volume of the resonant cavity of the device, which can improve the output power of the device and/or lower the laser threshold voltage of the device.

For the thyristor detector, an input optical signal is supplied to the coupling waveguide 430, which couples the input optical signal as a whispering gallery mode optical signal that circulates in the resonant cavity of the microresonator device 400 for absorption by the device structure. The device structure switches from a non-conducting/OFF state (where the current I through the device is substantially zero) to a conducting/ON state (where current I is substantially greater than zero) in response to the whispering gallery mode optical signal producing charge in the n-type modulation doped QW structure 24 and/or the p-type modulation doped QW structure 20 resulting from photon absorption of the whispering gallery mode optical signal. Specifically, the anode terminal electrode 423 is forward biased with respect to the cathode terminal electrode 426 and the voltage between n-channel injector 424 and the anode electrode 423 (and/or the voltage between the p-channel injector 425 and the cathode terminal electrode 626) is biased such that that charged produced in the n-type modulation doped QW structure 24 (and/or the p-type modulation doped QW structure 20) resulting from photon absorption of the whispering gallery mode optical signal is greater than the critical switching charge $Q_{CR}$. When the whispering gallery mode optical signal is removed, the device switches from the conducting/ON state (where the current I is substantially greater than zero) to a non-conducting/OFF state (where current I is substantially zero) when the charge in the n-type modulation doped QW structure 24 (and/or the p-type modulation doped QW structure 20) decreases below the holding charge $Q_H$.

For both the thyristor laser and the thyristor detector, the current-blocking ion implant region 421 reduces the capacitance between the p-channel injector terminal electrode 425 and the cathode terminal electrode 426 of the device. This capacitance can drastically lower the speed of response of the device if not reduced.

FIGS. 5A-5E illustrate a configuration of a closed-loop microresonator 500 that can be made utilizing the layer structure of FIG. 1, which includes a resonator 501 spaced from a section of a zig-zag waveguide structure 509 by a gap region 513. The zig-zag waveguide structure 509 is optically coupled to the resonator 501 by evanescent-wave coupling over the gap region 513. The resonator 501 defines a resonant cavity, which is referred to herein as active waveguide 502, that follows a closed path that is generally rectangular in shape. The optical path length of the active waveguide 502 is tuned to the particular wavelength of the optical mode signal 504 that is to propagate in the waveguide 502. Specifically, the length of the rectangular closed path of the active waveguide 502 is given as $2(L_1+L_2)$ and the $L_1$ and $L_2$ parameters are selected to conform to the following:

$$2(L_1 + L_2) = \frac{2\pi m \lambda_D}{n_{eff}} \quad (2)$$

where $L_1$ and $L_2$ are the effective lengths of the opposed sides of the active waveguide 502;

m is an integer greater than zero;

$\lambda_D$ is the wavelength of the optical mode 504 that is to propagate in the active waveguide 502; and $n_{eff}$ is the effective refractive index of the active waveguide 502.

The width (W) of the active waveguide 502 can be less than 2 μm, and possibly 1 μm or less. The width of the gap region 513 (i.e., the spacing between the active waveguide 502 and the zig-zag waveguide 509) can be less than 2 μm, and possibly on the order of 1 μm or less.

Figure 5A:
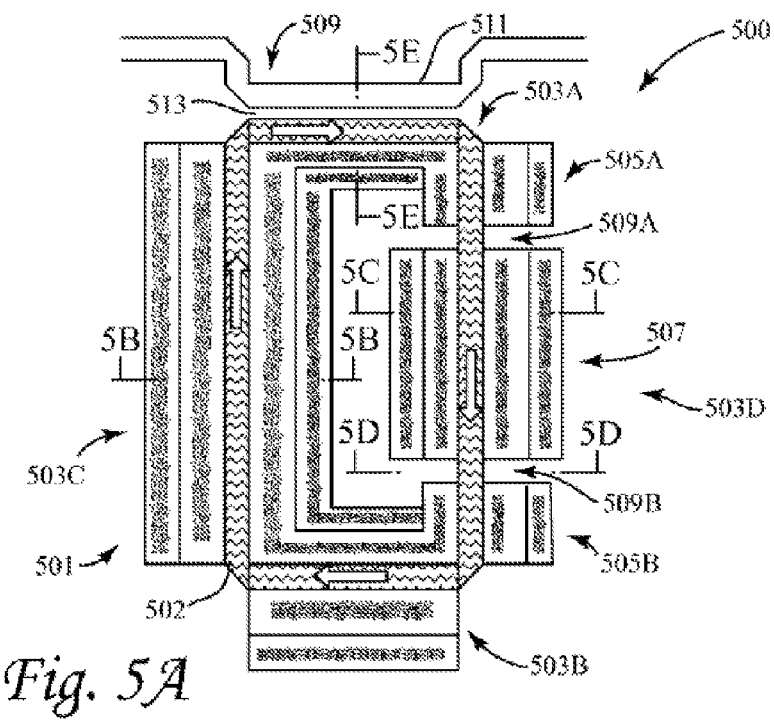
FIGS. 5A-5E illustrates an embodiment of a closed-loop (rectangular path) microresonator realized as part of an optoelectronic integrated circuit that employs the layer structure of FIG. 1.

The optical mode 504 circulates around the active waveguide 502 and is strongly confined within the active waveguide 502 by internal reflection at the reflective interfaces of the active waveguide 502. The zig-zag waveguide 509 defines a passive rib waveguide that forms a zig-zag path. The optical mode is strongly confined within the zig-zag waveguide 509 by internal reflection at the reflective interfaces of the zig-zag waveguide 509. The active waveguide 502 can be logically partitioned in four sections that are coupled to one another by ninety-degree corners as shown in FIG. 5A. The four sections include a straight section 503A that extends parallel to and is closely-spaced from a straight section 511 of the zig-zag waveguide 509 by the gap region 513, a straight section 503B disposed opposite the straight section 503A, and two straight sections 503C and 503D that are opposed to one another and that extend orthogonal to the sections 503A and 503B between the corresponding opposed ends of the sections 503A and 503B. Section 503A is configured to provide evanescent coupling to (or from) the straight section 511 of the zig-zag waveguide 509 for the optical mode signal 504 that circulates in the active waveguide 502. Sections 503B and 503C are configured to contribute to the generation (or absorption) of the optical mode signal 504 that circulates in the active waveguide 502. Section 503D has a number of portions that perform different functions. Specifically, section 503D has two opposed end portions 505A, 505B that are configured in a manner similar to sections 503B and 503C to contribute to the generation (or absorption) of the optical mode signal 504 that circulates in the active waveguide 502. Segment 503D also has a central portion 507 that is electrically isolated from the two opposed end portions 505A, 505B by corresponding passive waveguide portions 509A and 509B as shown. The central portion 507 is configured to provide tuning of the wavelength of the optical mode signal 504 that circulates in the active waveguide 502.

Figure 5B:
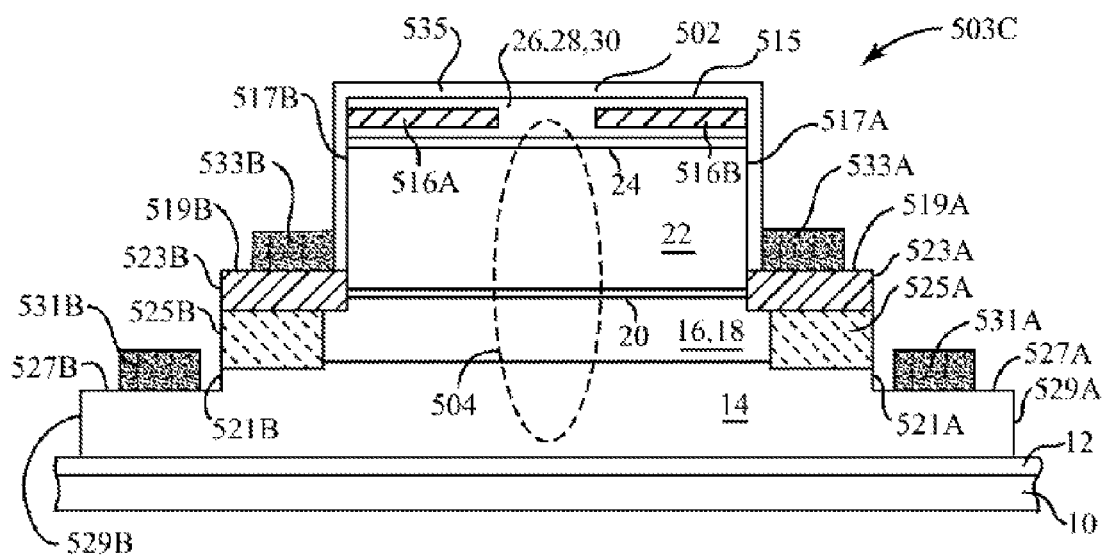

FIG. 5B is a cross-sectional schematic view of section 503C of the active waveguide 502. All of the features of the cross-section extend laterally along the length of section 503C as evident from FIG. 5A. In this description, "inner" refers to features that are closer to the center of the waveguide 502, and "outer" refers to features that are further away from the center of the waveguide 502. These features include a top mesa 515 defined between an inner sidewall 517A and an outer sidewall 517B. Ion implant regions 516A, 516B (preferably of n-type ions) can be implanted to a depth within the top layers 26, 28, 30 on opposite sides of waveguide 502 adjacent the respective sidewalls 517A, 517B as shown. The waveguide ion implant regions 516A, 516B can provide an index change that operates to aid in confining and guiding the optical mode signal 504 that propagates within the central region of the waveguide 502. The inner sidewall 517A extends downward to an inner mesa 519A (which extends laterally to an inner sidewall 521A), while the outer sidewall 517B extends downward to an outer mesa 519B (which extends laterally to an outer sidewall 521A). Both the inner mesa 519A and the outer mesa 519B are formed in the layer structure in spacer layer(s) 22 above (but near) the p-type modulation doped quantum well structure 20. Two implant regions 523A, 525A are defined by ion implantation through the inner mesa 519A. The ion implant regions 523A, 525A are similar to the ion implant regions 719 and 721 of the p-channel HFET as described above with respect to FIG. 7 and can be implanted together with these implants with the same ions species (p-type acceptor ions for the implant region 523A and oxygen ions for the implant region 525A) as described above. The implant region 523A (which has the shallowest depth of the two implant regions 523A, 525A) has a pattern that is disposed laterally between the inner sidewall 521A and the projection of the inner sidewall 517A as shown in FIG. 5B. The implant region 523A provides for electrical contact to the p-type modulation doped QW structure 20. The implant region 525A (which is deeper in depth than the implant region 523A) is implanted into the N+-type layer 14 with a pattern that is disposed laterally between the inner sidewall 521A and the projection of the inner sidewall 517A as shown in FIG. 5B. In this manner, the implant region 523A overlies the implant region 525A. The high resistance deep oxygen ion implant region 525A effectively blocks current flow therethrough and defines an isolation region between the p-type implant region 523A and the bottom N+-type ohmic contact layer 14 of the layer structure. Such isolation region is substantially devoid of conducting species and significantly reduces the capacitance between the anode terminal electrode part 533A and the cathode terminal electrode part 531A of the device. This capacitance can drastically lower the speed of response of the device if not reduced.

Similarly, two implant regions 523B, 525B are defined by ion implantation through the outer mesa 519B. The ion implant regions 523B, 525B are similar to the ion implant regions 719 and 721 of the p-channel HFET as described above with respect to FIG. 7 and can be implanted together with these implants with the same ions species (p-type acceptor ions for the implant region 523B and oxygen ions for the implant region 525B) as described above. The implant region 523A (which has the shallowest depth of the two implant regions 523B, 525B) has a pattern that is disposed laterally between the outer sidewall 521B and the projection of the outer sidewall 517B as shown in FIG. 5B. The implant region 523B provides for electrical contact to the p-type modulation doped QW structure 20. The implant region 525B (which is deeper in depth than the implant region 523B) is implanted into the N+-type layer 14 with a pattern that is disposed laterally between the outer sidewall 521B and the projection of the outer sidewall 517B as shown in FIG. 5B. In this manner, the implant region 523B overlies the implant region 525B. The high resistance deep oxygen ion implant region 525B effectively blocks current flow therethrough and defines an isolation region between the p-type implant region 523A and the bottom N+-type ohmic contact layer 14 of the layer structure. Such isolation region is substantially devoid of conducting species and significantly reduces the capacitance between the anode terminal electrode part 533B and the cathode terminal electrode part 531B of the device. This capacitance can drastically lower the speed of response of the device if not reduced.

The inner sidewall 521A extends downward to an inner bottom mesa 527A formed in the bottom ohmic contact layer 14. The inner bottom mesa 527A extends laterally from the inner sidewall 521A to an inner sidewall 529A as shown in FIG. 5B. The outer sidewall 521B extends downward to an outer bottom mesa 527B formed in the bottom ohmic contact layer 14. The outer bottom mesa 527B extends laterally from the inner sidewall 521B to the inner sidewall 529B as shown in FIG. 5B.

Two parts (531A, 531B) of a cathode terminal electrode are formed on the inner and outer bottom mesas 527A, 527B, respectively, in contact with the bottom n-type ohmic contact layer(s) 14 as best shown in FIG. 5B. Two parts (533A, 533B) of an anode terminal electrode are formed on the inner and outer mesas 519A, 519B, respectively, in contact with their respective implant regions 525A, 525B. Note that the n-type region of the n-type modulation doped QW structure 24 of section 503C floats with respect to the electrical signals supplied to anode terminal electrode parts 533A, 533B as well as to the cathode terminal electrode parts 531A, 531B. A top mirror 535 can cover the top mesa 515 and the sidewalls 517A, 517B.

The top mesa 515 (or the top mirror 535 when present), the sidewalls 517A, 517B and the bottom DBR mirror 12 form part of the closed-path resonant cavity waveguide that is configured to support circulation of the optical mode signal 504 within the resonant cavity waveguide. The width of the resonant cavity waveguide (i.e., the lateral offset between the sidewalls 517A, 517B) can be less than 2 μm, and possibly 1 μm or less. The height of the vertical cavity waveguide can be above sixty percent of the waveguide width.

Figure 5C:
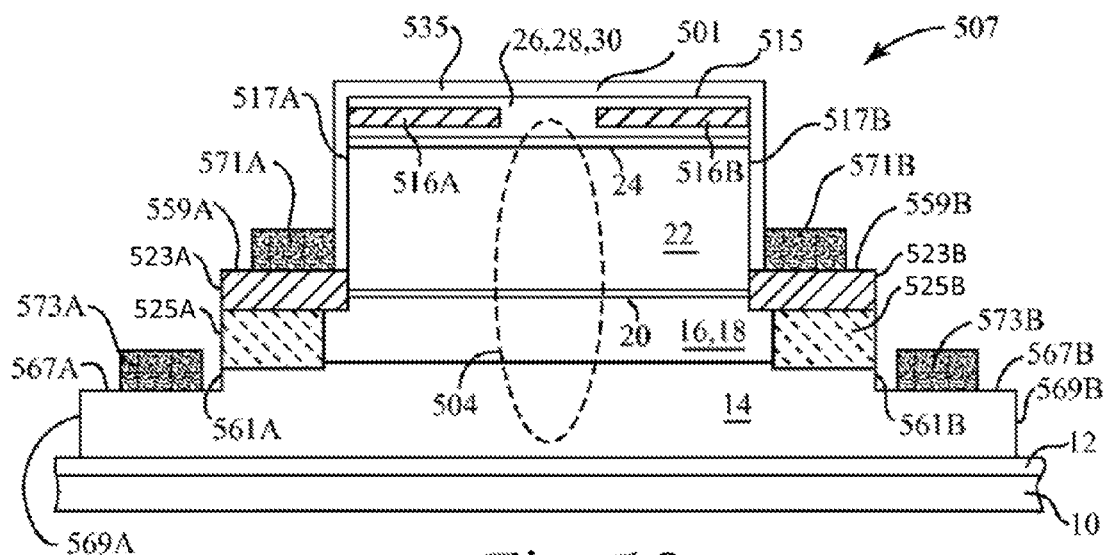

FIG. 5C is a cross-sectional schematic view of the tuning portion 507 of section 503D of the active waveguide 502. All of the features of the cross-section extend laterally along the length of the tuning portion 507 as evident from FIG. 5A. These features include the top mesa 515 defined between the inner sidewall 517A and the outer sidewall 517B. Ion implant regions 516A, 516B (preferably of n-type ions) can be implanted to a depth within the top layers 26, 28, 30 on opposite sides of waveguide 502 adjacent the respective sidewalls 517A, 517B as shown. The ion implant regions 516A, 516B can provide an index change that operates to aid in confining and guiding the optical mode signal 504 that propagates within the central region of the waveguide 502. The top mesa 515, the sidewalls 517A, 517B and the waveguide implant regions 516A, 516B can be extensions of the top mesa, the sidewalls and the waveguide ion implant regions that form the resonant rib waveguide of the other sections of the resonator 500. The inner sidewall 517A extends downward to an inner mesa 559A (which extends laterally to an inner sidewall 561A), while the outer sidewall 517B extends downward to an outer mesa 559B (which extends laterally to an outer sidewall 561B). Both the inner mesa 559A and the outer mesa 559B are formed in the layer structure in spacer layer(s) 22 above (but near) the p-type modulation doped quantum well structure 20. Implant regions 523A, 525A are defined by ion implantation through the inner mesa 559A, while implant regions 523B, 525B are defined by ion implantation through the outer mesa 559B. The implant regions 523A, 525A, 523B, 525B are similar to those described above for section 503C of FIG. 5B. The inner sidewall 561A extends downward to an inner bottom mesa 567A formed in the bottom ohmic contact layer 14. The inner bottom mesa 567A extends laterally from the inner sidewall 561A to an inner sidewall 569A as shown in FIG. 5C. The outer sidewall 561B extends downward to an outer bottom mesa 567B formed in the bottom ohmic contact layer 14. The outer bottom mesa 567B extends laterally from the outer sidewall 561B to the outer sidewall 569B as shown in FIG. 5C.

Two parts (571A, 571B) of a first tuning terminal electrode are formed on the inner and outer mesas 559A, 559B, respectively, in contact with their respective implant regions 523A, 523B which contact the QW of the p-type modulation doped QW structure 20 of the tuning portion 507. Two parts (573A, 573B) of a second tuning terminal electrode are formed on the inner and outer bottom mesas 567A, 567B, respectively, in contact with the bottom n-type ohmic contact layer(s) 14 of the tuning portion 507 as best shown in FIG. 5C. The high resistance deep oxygen ion implant regions 525A, 525B effectively blocks current flow therethrough and defines isolation regions between the respective p-type implant regions 523A/523B and the bottom N+-type ohmic contact layer 14 of the layer structure. Such isolation regions are each substantially devoid of conducting species and significantly reduce the capacitance between the first tuning electrode parts 571A, 571B and the cathode terminal electrode parts 573A, 573B of the device. This capacitance can drastically lower the speed of response of the device if not reduced. Note that the n-type region of the n-type modulation doped QW structure 24 of the tuning portion 507 floats with respect to the electrical signals supplied to tuning electrode parts 571A, 571B, 573A, 573B. A top mirror 535 can cover the top mesa 515 and the sidewalls 517A, 517B.

Figure 5D:
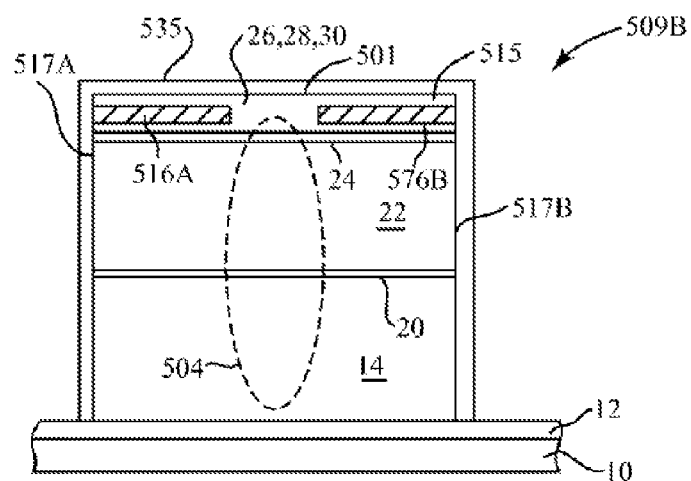

FIG. 5D is a cross-sectional schematic view of the isolating passive waveguide portion 509B of section 503D of the active waveguide 502. All of the features of the cross-section extend laterally along the length of the passive waveguide portion 509B as evident from FIG. 5A. These features include the top mesa 515 defined between the inner sidewall 517A and the outer sidewall 517B. Ion implant regions 516A, 516B (preferably of n-type ions) can be implanted to a depth within the top layers 26, 28, 30 on opposite sides of waveguide 502 adjacent the respective sidewalls 517A, 517B as shown. The ion implant regions 516A, 516B can provide an index change that operates to aid in confining and guiding the optical mode signal 504 that propagates within the central region of the waveguide 502. The top mesa 515, the sidewalls 517A, 517B and the waveguide ion implant regions 516A, 516B can be extensions of the top mesa, sidewalls and waveguide ion implant regions that form the resonant rib waveguide of the other sections of the resonator 500. The inner and outer sidewalls 517A extends downward to bottom mirror layers 12. A top mirror 535 can cover the top mesa 515 and the sidewalls 517A, 517B. Note that the passive waveguide portion 509B is formed adjacent one end of the tuning portion 507, while another passive waveguide portion 509A is formed adjacent the opposed end of tuning portion 507 of segment 503D. The passive waveguide portion 509A has the same features as passive waveguide portion 509B of FIG. 5D. The opposed passive waveguide portions 509A and 509B provide electrical isolation of the tuning portion 507 from the two opposed end portions 505A, 505B of the active waveguide.

Figure 5E:
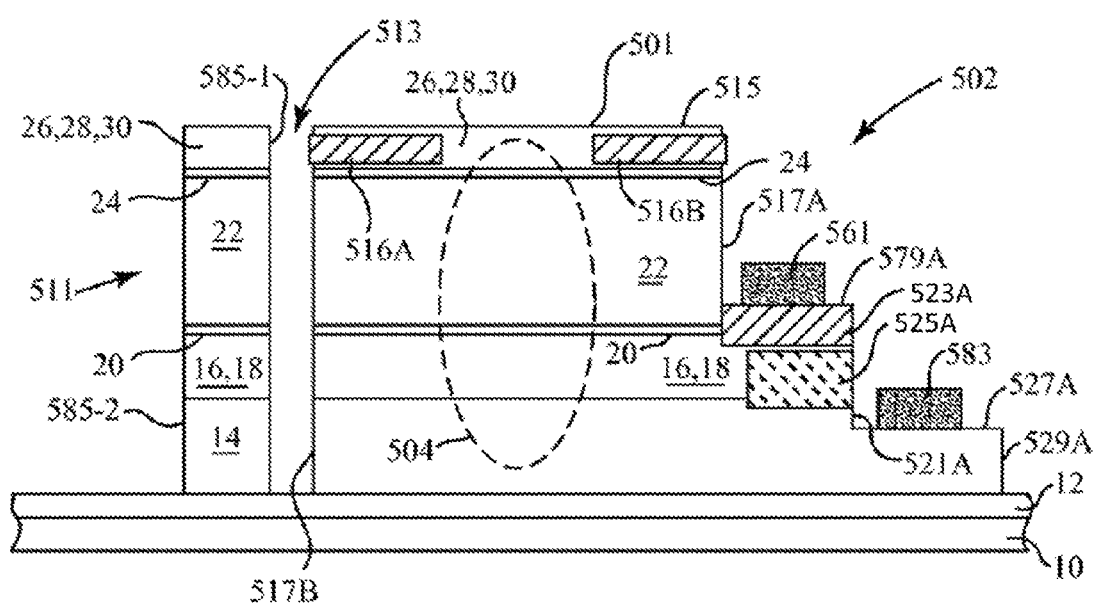

FIG. 5E is a cross-sectional schematic view of the coupling section 503A of the active waveguide 502 and the straight section 511 of the zigzag waveguide 509 with the gap region 513 therebetween. All of the features of the cross-section extend laterally along the length of the tuning portion 507 as evident from FIG. 5A. These features include the top mesa 515 defined between inner sidewall 517A and an outer sidewall 517B. Ion implant regions 516A, 516B (preferably of n-type ions) can be implanted to a depth within the top layers 26, 28, 30 on opposite sides of waveguide 502 adjacent the respective sidewalls 517A, 517B as shown. The ion implant regions 516A, 516B can provide an index change that operates to aid in confining and guiding the optical mode signal 504 that propagates within the central region of the waveguide 502. The top mesa 515, the sidewalls 517A, 517B and the waveguide ion implant regions 516A, 516B can be extensions of the top mesa, sidewalls and waveguide ion implant regions that form the resonant rib waveguide of the other sections of the resonator 500. The inner sidewall 517A extends downward to an inner mesa 519A (which extends laterally to an inner sidewall 521A), while the outer sidewall 517B extends downward to the mirror layers 12. The inner mesa 519A is formed in the layer structure in spacer layer(s) 22 above (but near) the p-type modulation doped quantum well structure 20. Implant regions 523A, 525A are defined by ion implantation through the inner mesa 519A. The implant regions 523A, 525A are similar to those described above for section 503C of FIG. 5B. The inner sidewall 521A extends downward to an inner bottom mesa 527A formed in the bottom ohmic contact layer 14. The inner bottom mesa 527A extends laterally from the inner sidewall 521A and an inner sidewall 569A as shown in FIG. 5E.

A first control electrode 581 is formed on the inner mesas 519A in contact with the implant region 523A, which is in contact with the QW of the p-type modulation doped QW structure 20 of the active waveguide 502 of the coupling section 503. A second control electrode 583 is formed on the inner bottom mesa 527A in contact with the bottom n-type ohmic contact layer(s) 14 of the active waveguide 502 of the coupling section 503 as best shown in FIG. 5E. The high resistance deep oxygen ion implant region 525A effectively blocks current flow therethrough and defines an isolation region between the p-type implant region 523A and the bottom N+-type ohmic contact layer 14 of the layer structure. Such isolation region is substantially devoid of conducting species and significantly reduces the capacitance between the first control electrode 581 and the second control electrode 583 of the device. This capacitance can drastically lower the speed of response of the device if not reduced. Note that the n-type region of the n-type modulation doped QW structure 24 floats with respect to the electrical signals supplied to first control terminal electrode 581.

The straight section 511 of the zig-zag waveguide 509 is formed from the layer structure of FIG. 1 by patterning and etching the layer structure to form opposed sidewalls 581-1 and 585-2 that extend from the top surface 501 to the mirror layers 12. The sidewall 585-1 of the straight section 511 is offset from the sidewall 517B of the coupling section 503A by the gap region 513 as shown. A top mirror (not shown) can cover the top mesa 515 and the sidewalls of the devices.

The etching that forms the sidewalls and mesas of the sections of the resonator 501 and the coupling waveguide 509, the ion implantation operations and associated RTA operations for the sections of the sections of the resonator 501 and the coupling waveguide 509, as well as the metallization of the terminal electrodes of the resonator 501 can be carried in tandem with the formation of like structures in other devices integrally formed on the substrate 10.

Electrically, certain portions of the resonator 501 (i.e., sections 505A, 505B, 503B, and 503C) can operate as an electrically-pumped bottom diode laser or bottom diode detector.

For the bottom diode laser, the anode terminal electrode (parts 533A, 533B) is forwarded biased relative to the cathode terminal electrode (parts 531A, 531B) such that holes are injected from the anode terminal electrode (parts 533A, 533B) into the QW channel(s) realized in the p-type modulation doped QW structure 20 in order to induce photon emission within the waveguide 502 of the device structure. The current-blocking deep oxygen ion implant regions ion implant regions 525A, 525B can aid in funneling the injected hole current that flows from the anode terminal electrode parts 533A, 533B and the p-type contact implant regions 525A, 525B into the QW channel of the p-type modulation doped QW structure 20 within the waveguide 502 of the device structure. Such current funneling enhances the current density of the injected current in the QW channel of the p-type modulation doped QW structure 20 within the waveguide 502 of the device structure, which can improve the output power of the device and/or lower the laser threshold current and voltage of the device. The deep oxygen ion implant regions 525A, 525B define isolation regions that significantly reduce the capacitance between the anode terminal electrode (parts 533A, 533B) and the cathode terminal electrode (parts 531A, 531B). This capacitance can drastically lower the speed of response of the device if not reduced.

For the diode detector, the anode terminal electrode (parts 533A, 533B) is reversed biased relative to the cathode terminal electrode (parts (531A, 531B). An input optical light is supplied to the coupling waveguide 509, which couples the input optical light as an optical mode signal 504 that propagates in the waveguide 502 of the resonator 501 for absorption by the device structure. The reverse bias conditions of the anode terminal electrode (parts 533A, 533B) and the cathode terminal electrode (parts 531A, 531B) are configured such the diode detector produces photocurrent between the anode terminal electrode (parts 533A, 533B) and the cathode terminal electrode (parts 531A, 531B) that is proportional to the intensity of the optical mode signal 504 absorbed by the device structure. The photocurrent flows between the anode terminal electrode (parts 533A, 533B) and cathode terminal electrode (parts 531A, 531B) under the reverse bias. The current-blocking ion implant regions 525A, 525B substantially reduces dark leakage current, which can greatly reduce the sensitivity of the device if not addressed.

Electrical signals can be supplied to the first control electrode 581 and the second control electrode 583 of the coupling section 503 in order to change the coupling coefficient of the evanescent coupling between the waveguide 502 of the coupling section 503 and the straight section 511 of the coupling waveguide 509. Specifically, the coupling coefficient of the evanescent-wave coupling between the two waveguides can be changed (i.e., modulated) by controlling the amount of charge (holes) that fills the QW(s) of the p-type modulation doped QW structure 20 for the waveguide 502 of the coupling section 503, which dictates the shifting of the absorption edge and index of refraction of the QW(s) of the p-type modulation doped QW structure 20 for the waveguide 502 of the coupling section 503. Charge can be added to (or removed from) the QW(s) of the p-type modulation doped QW structure 20 by a suitable bias current source and/or bias current sink that is electrically coupled to the first control electrode 581. The second control electrode 883 tied to ground potential. For continuous output or input, a DC electrical signal can be supplied to the first control electrode 581 and the second control electrode 583 in order to activate and deactivate the evanescent coupling between the waveguide 502 and the straight section 511 of the coupling waveguide 509. Alternatively, a time-varying differential electrical signal can be supplied to the first control electrode 581 and the second control electrode 583 in order to modulate the evanescent coupling between the waveguide 502 and the straight section 511 of the coupling waveguide 509. Such coupling modulation generates a modulated optical signal based upon the optical mode signal 504 that propagates in the waveguide 502 of the resonator 501. The modulated optical signal propagates through the straight section 511 of the coupling waveguide 509 and is output therefrom. The modulated optical signal can have an optical OOK modulation format (i.e., digital pulsed-mode optical signal) or possibly a higher order optical modulation format (such as optical differential phase shift keying format or optical differential quadrature phase shift keying format).

Electrical signals can be supplied to the first tuning electrode (parts 571A, 571B) and the second tuning electrode (parts 573A, 573B) of the tuning portion 507 of section 503D in order to tune the characteristic wavelength $\lambda_D$ of the optical mode signal 504 that propagates in the waveguide 502. Specifically, the bias signal between the first tuning electrode (parts 571A, 571B) and the second tuning electrode (parts 573A, 573B) can populate the QW(s) of the p-type modulation doped QW structure 20 with holes, which shifts the absorption edge to shorter wavelengths and thus induces a significant index change. The index change can modify the length of the optical path of the waveguide 502 and therefore change the characteristic wavelength $\lambda_D$ of the optical mode signal 504 that propagates in the waveguide 502.

In alternate embodiments, the active portions of the resonator 501 (i.e., sections 505A, 505B, 503B, and 503C) can be configured with mesas, contact implants and metallization for electrical contact to top layer 30 for an anode terminal electrode (or parts thereof) and electrical contact to the n-type modulation doped QW structure 24 for a cathode terminal electrode or parts thereof. In this configuration, the active portions of the resonator 501 (i.e., sections 505A, 505B, 503B, and 503C) can operate as a top diode laser or top diode detector as described herein. Similarly, the coupling section 503C of the resonator 501 can be configured with mesas, contact implants and metallization for electrical contact to top layer 30 for a first control terminal electrode and electrical contact to the n-type modulation doped QW structure 24 for a second control electrode that are used to control the coupling coefficient of the evanescent-wave coupling between the waveguide 502 of the coupling section 503 and the straight section 511 of the coupling waveguide 509. Specifically, the coupling coefficient of the evanescent-wave coupling between two waveguides can be changed (i.e., modulated) by controlling the amount of charge (electrons) that fills the QW(s) of the n-type modulation doped QW structure 24 for the waveguide 502 of the coupling section 503, which dictates the shifting of the absorption edge and index of refraction of the QW(s) of the n-type modulation doped QW structure 24 for the waveguide 502 of the coupling section 503. Similarly, the tuning section 507 of the resonator 501 can be configured with mesas, contact implants and metallization for electrical contact to top layer 30 for a first tuning electrode and electrical contact to the n-type modulation doped QW structure 24 for a second tuning electrode that are used to tune the characteristic wavelength $\lambda_D$ of the optical mode signal 504 that propagates in the waveguide 502. Specifically, the characteristic wavelength $\lambda_D$ of the optical mode signal 504 can be changed (i.e., modulated) by controlling the amount of charge (electrons) that fills the QW(s) of the n-type modulation doped QW structure 24 for the waveguide 502 of the tuning section 507, which dictates the shifting of the absorption edge and index of refraction of the QW(s) of the n-type modulation doped QW structure 24 for the tuning section 507 of the waveguide 502 and the optical path length of the waveguide 502 of the resonator.

In yet other embodiments, the active portions of the resonator 501 (i.e., sections 505A, 505B, 503B, and 503C) can be configured with mesas, contact implants and metallization for electrical contact to top layer 30 for an anode terminal electrode (or parts thereof) as well as electrical contact to the n-type modulation doped QW structure 24 for an n-channel injector terminal electrode or parts thereof as well as electrical contact to the p-type modulation doped QW structure 20 for a p-channel injector terminal electrode or parts thereof as well as electrical contact to the bottom n-type contact layer 14 for a cathode terminal electrode or parts thereof. In this configuration, the active portions of the resonator 501 (i.e., sections 505A, 505B, 503B, and 503C) can operate as a thyristor laser or thyristor detector as described herein. Similarly, the coupling section 503C of the resonator 501 can be configured with mesas, contact implants and metallization for electrical contact to top layer 30, to the n-type modulation doped QW structure 24, to the p-type modulation doped QW structure 20, and to the bottom n-type contact layer 14 for control terminal electrodes that are used to control the coupling coefficient of the evanescent-wave coupling between the waveguide 502 of the coupling section 503 and the straight section 511 of the coupling waveguide 509. Specifically, the coupling coefficient of the evanescent-wave coupling between two waveguides can be changed (i.e., modulated) by controlling the amount of charge that fills the QW(s) of the n-type modulation doped QW structure 24 and/or QW(s) of the p-type modulation doped QW structure 20 for the waveguide 502 of the coupling section 503, which dictates the shifting of the absorption edge and index of refraction of the QW(s) of the n-type or p-type modulation doped QW structures for the waveguide 502 of the coupling section 503. Similarly, the tuning section 507 of the resonator 501 can be configured with mesas, contact implants and metallization for electrical contact to top layer 30, to the n-type modulation doped QW structure 24, to the p-type modulation doped QW structure 20, and to the bottom n-type contact layer 14 for tuning electrodes that are used to tune the characteristic wavelength $\lambda_D$ of the optical mode signal 504 that propagates in the waveguide 502. Specifically, the characteristic wavelength $\lambda_D$ of the optical mode signal 504 that propagates in the waveguide 502 can be changed (i.e., modulated) by controlling the amount of charge that fills the QW(s) of the n-type modulation doped QW structure 24 and/or QW(s) of the p-type modulation doped QW structure 20 for the waveguide 502 of the tuning section 507, which dictates shifting of the absorption edge and index of refraction of the QW(s) of the n-type or p-type modulation doped QW structures for the waveguide 502 of the tuning section 507 and the optical path length of the waveguide 502 of the resonator.

In alternate embodiments, the tuning section 507 can be realized as part of any one of the other optical resonator structures as described herein in order to provide tunability of the wavelength of the optical mode processed by the optical resonator structure.

Figure 5F:
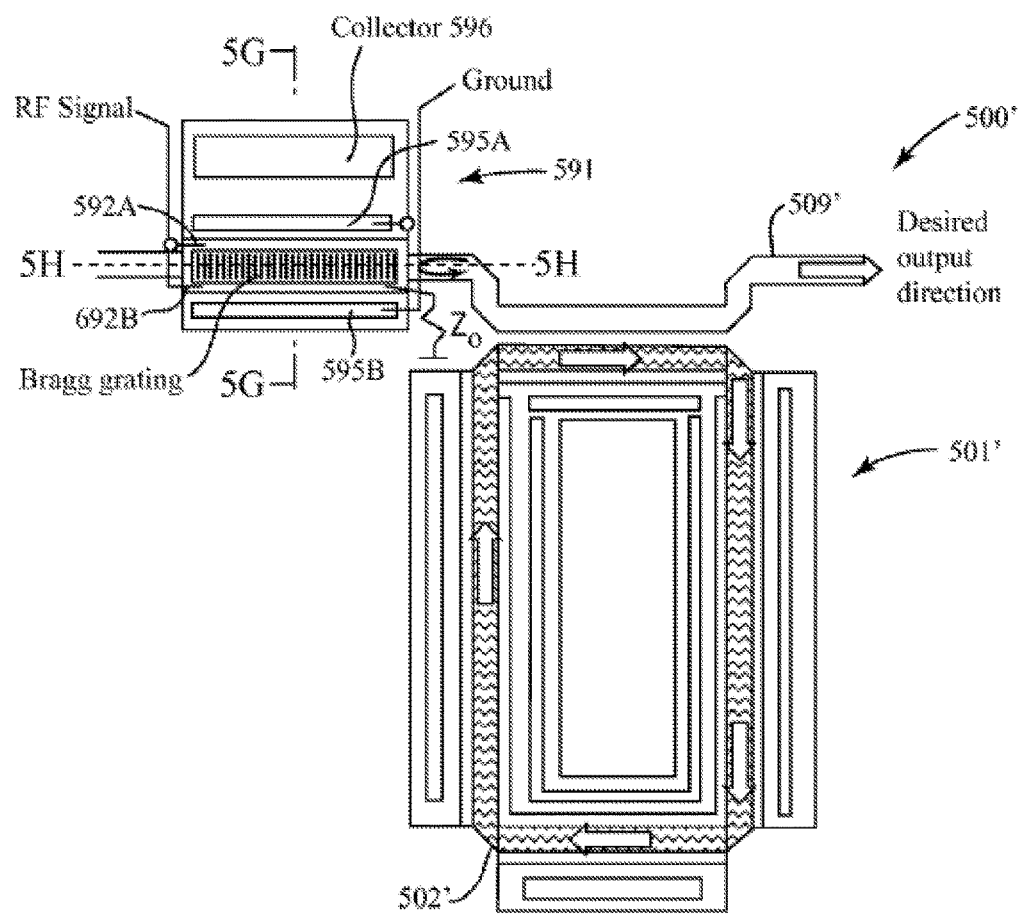
FIGS. 5F-5H illustrates an embodiment of a closed-loop (rectangular path) microresonator and electrically-controlled tuning reflector that are realized as part of an optoelectronic integrated circuit that employs the layer structure of FIG. 1.
Figure 5G:
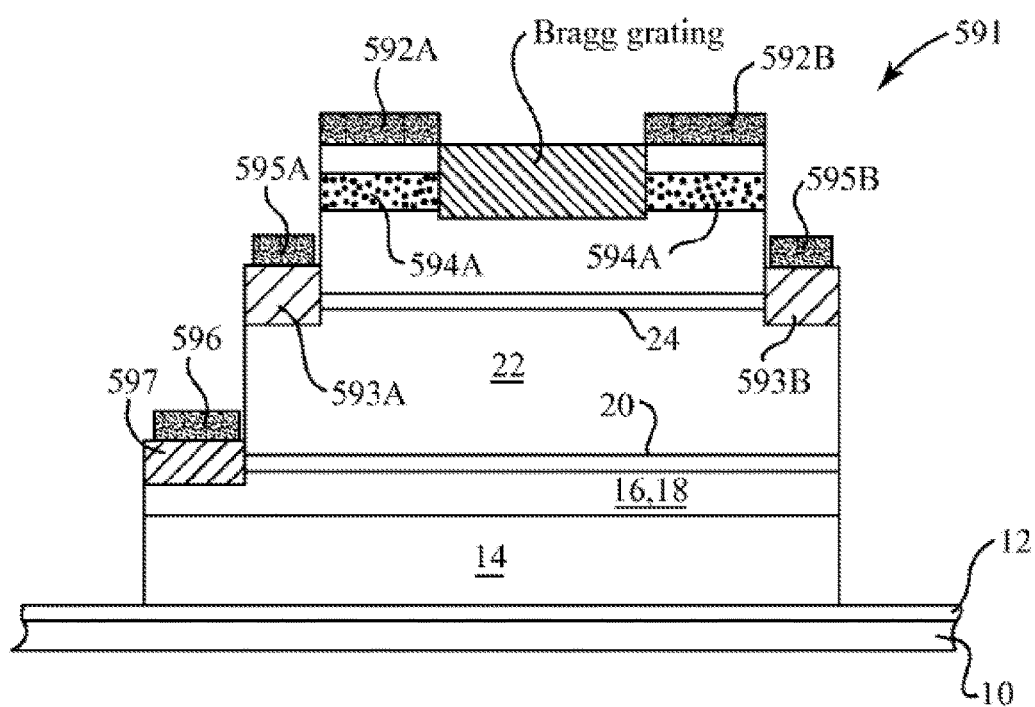
Figure 5H:
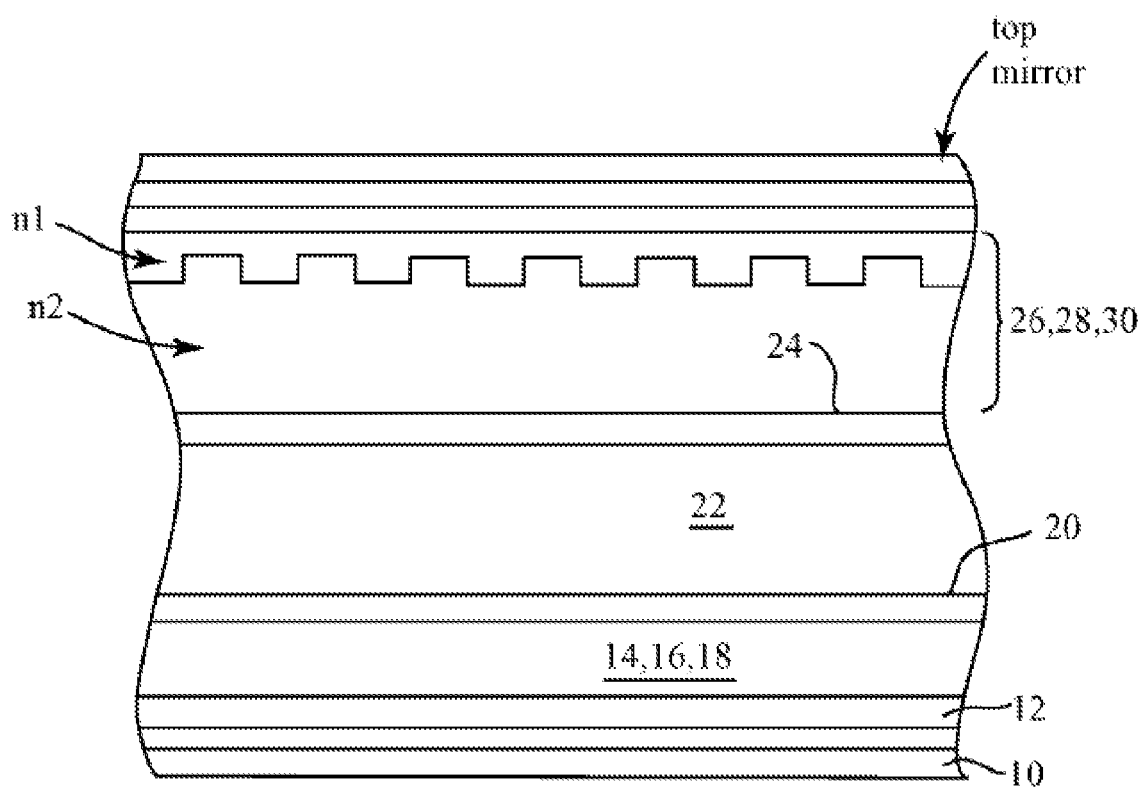

FIGS. 5F-5H illustrate a configuration of a closed-loop (rectangular path) microresonator 500' that includes a resonator 501' and electrically-controlled tuning reflector 591 that are realized as part of an optoelectronic integrated circuit that employs the layer structure of FIG. 1. The resonator 501' is spaced from a section of a zig-zag waveguide structure 509' by a gap region. The zig-zag waveguide structure 509' is optically coupled to the resonator 501' by evanescent-wave coupling over the gap region. Similar to the resonator 501 of the embodiment of FIGS. 5A-5E as described above, the resonator 501' defines an active waveguide 502' that follows a closed path that is generally rectangular in shape. The optical path length of the active waveguide 502' is tuned to the particular wavelength of the optical mode signal that is to propagate in the waveguide 502'. However, the tuning section and isolating passive waveguide sections of the waveguide 502 of the embodiment of FIGS. 5A-5E is omitted and replaced with an active section similar to the section 503C of FIG. 5B. Moreover, wavelength tuning functionality is carried out by the tuning reflector 591 that is formed as part of the coupling waveguide 509.

In this embodiment, the active waveguide 502' of the resonator 501' is configured with mesas, contact implants and metallization for electrical contact to top layer 30 for an anode terminal electrode (or parts thereof) and electrical contact to the n-type modulation doped QW structure 24 for a cathode terminal electrode or parts thereof. A collector terminal can be in electrical contact to the p-type modulation doped QW structure 20 if desired. In this configuration, the active waveguide 502' of the resonator 501' can operate as a top diode laser or top diode detector as described herein. Similarly, the coupling section of the resonator 501' can be configured with mesas, contact implants and metallization for electrical contact to top layer 30 for a first control terminal electrode and electrical contact to the n-type modulation doped QW structure 24 for a second control electrode that are used to control the coupling coefficient of the evanescent-wave coupling between the waveguide 502' of the coupling section and the straight section of the coupling waveguide 509' as described herein.

In principle, the resonator 501' produces light that propagates in both the clockwise and counterclockwise sense along the optical path of the waveguide 502' of the resonator 501' as indicted by the two sets of arrows in FIG. 5F. Moreover, the evanescent coupling between the coupling section of the resonator 501' and the straight section of the coupling waveguide 509' operates on both clockwise and counterclockwise light propagation within the resonator 501'. Specifically, the light propagating clockwise within the resonator 501' is coupled to the coupling waveguide 509' to produce light that propagates in the coupling waveguide 509' toward the right side of FIG. 5F, and light propagating counterclockwise within the resonator 501' is coupled to the coupling waveguide 509' to produce light that propagates in the coupling waveguide 509' toward the left side of FIG. 5F.

Similarly, the evanescent coupling between the straight section of the coupling waveguide 509' and the coupling section of the resonator 501' operates on both directions of light propagation within the coupling waveguide 509'. Specifically, light propagating in the straight section of the coupling waveguide toward the right side of FIG. 5F is coupled to the resonator 501' to produce light that propagates clockwise in the resonator 501', and light propagating in the straight section of the coupling waveguide toward the left side of FIG. 5F is coupled to the resonator 501' to produce light that propagates counterclockwise in the resonator 501'.

The tuning reflector 591 is a linear active waveguide device formed as a reflector that builds upon the multiple directions of light propagation in the resonator 501' as well as the multiple directions of evanescent coupling provided between the straight section of the coupling waveguide 509' and the coupling section of the resonator 501'. The tuning reflector 591 has Bragg grating (such as a first-order or third-order Bragg grating) defined throughout the length of the active waveguide device. The Bragg grating can be defined by etching into the top layers (such as layers 26, 28, 30 of layer structure of FIG. 1) as shown in FIG. 5G. The Bragg grating operates to reflect any optical modes exiting the straight section of coupling waveguide 509 in the direction of the tuning reflector 591 where the wavelength of such optical modes coincides with the Bragg frequency of the Bragg grating. All optical modes at other wavelengths will be passed through the tuning reflector 591 or be absorbed.

For laser operations, the resonator 501' produces optical mode(s) that propagate counter-clockwise within the waveguide 502' of the resonator 501', which are coupled into the coupling waveguide 509' to produce optical mode(s) that propagate in the coupling waveguide 509' to the tuning reflector 591. The incident optical mode(s) at wavelengths that coincide with the Bragg frequency of the Bragg grating of the tuning reflector 591 are reflected back and propagate in the reverse direction within the coupling waveguide 509' where the mode is coupled into the resonator 501' to produce optical mode(s) that propagates clockwise in the resonator 501' and generate more stimulated emission. This operation is repeated many times such that the wavelength of dominant optical mode that propagates in the resonator 501 corresponds to the Bragg frequency of the Bragg grating. Such dominant optical mode propagating clockwise in the resonator 501 is coupled to the coupling waveguide 509 to produce an output optical signal (which propagates in the direction away from the tuning reflector 591 and labeled "desired output direction" in FIG. 5F). In this manner, optical modes that coincide with the Bragg frequency of the Bragg grating of the tuning reflector 591 make double passes through the resonator 501' for improved stimulated emission. This operation is repeated such that the wavelength of the dominant or primary optical mode that propagates in the resonator 501' corresponds to the Bragg frequency of the Bragg grating. With this operation, the dominant or primary optical mode that propagates in the resonator 501' is output from the coupling waveguide 509', while optical modes that do not coincide with the Bragg frequency of the Bragg grating of the tuning reflector 591 are removed from the output signal by the operation of the tuning reflector 591.

For optical detection operations, the input optical signal is supplied to the coupling waveguide 509' from the end opposite the tuning reflector 591. Such input optical signal is coupled into the resonator 501' to produce optical mode(s) that propagate counter-clockwise within the waveguide 502' of the resonator 501' for absorption. Some counter-clockwise propagating optical modes that are not absorbed can be coupled into the coupling waveguide 509' to produce optical mode(s) that propagate in the coupling waveguide 509' to the tuning reflector 591. The incident optical mode(s) with wavelengths that coincide with the Bragg frequency of the Bragg grating of the tuning reflector 591 are reflected back and propagate in the reverse direction within the coupling waveguide 509' where the mode is coupled into the resonator 501' to produce optical mode(s) that propagate clockwise in the resonator 501' for additional absorption. In this manner, optical modes that coincide with the Bragg frequency of the Bragg grating of the tuning reflector 591 make double passes through the resonator 501'. This operation is repeated such that the wavelength of the dominant or primary optical mode that propagates in the resonator 501' corresponds to the Bragg frequency of the Bragg grating.

For both laser operations and optical detection operations, the Bragg grating functions as a narrow-band filter where the Bragg frequency of grating that dictates the wavelength of the dominant or primary optical mode that propagates in the resonator 501'. Such narrow-band filtering is useful for larger closed-loop resonators where the natural mode resonances are closely spaced from one another and thus do not provide a narrow wavelength band for the optical mode that propagates in the closed-loop resonator.

The Bragg frequency of the Bragg grating of the tuning reflector 591 can be electronically-controlled (or tuned) by controlled injection of charge that modifies the index of the region n2 of the Bragg grating as noted in FIG. 5L. The charge injection can be controlled by traveling wave surface electrode parts 592A, 592B that are formed on the top surface 30 on opposite sides of the Bragg grating along the length of the device as shown in FIG. 5G. Ion implanted source regions 593A and 593B are also formed on opposite sides of the Bragg grating along the length of the device and in contact with the n-type modulation doped QW structure 24 of the device. Waveguide implants 594A, 594B can be formed on opposite sides of the Bragg grating at or near the same depth of the Bragg grating along the length of the device as shown. Intermediate electrode parts 595A, 595B are formed in contact with the ion implanted source regions 593A and 593B. The traveling wave surface electrode parts 592A, 592B form a CPW (Coplanar Waveguide) traveling wave transmission line which is ideal to implement high speed tunability. A collector terminal electrode 596 can be formed on an ion implant region 597 that contacts the p-type modulation doped interface 20 of the device structure. A top mirror can be formed over the device structure as shown in FIG. 5H. The CPW defined by traveling wave surface electrode parts 592A, 592B can be terminated in its characteristic impedance $Z_o$, and the intermediate electrode parts 595A, 595B can be coupled to ground potential as noted in FIG. 5F. Charge injection that modulates the index n2 can be controlled by applying a traveling wave electrical RF signal to the CPW, and the Bragg grating frequency corresponding to the time dependent index n2 value can be obtained. Because the tuning is achieved by charge injection into the QW(s) of the n-type modulation doped QW structure 24 of the device, the collector bias can change the voltage at which this happens similar to the threshold voltage of an HFET. Therefore the voltage window for tuning can be adjusted for the range of input signal. Note that for a 1st and 3rd order gratings, the reflected wavelength $\lambda_o$ and grating pitch $\Lambda$ are related by $\Lambda=\lambda_o/2\bar{n}_{eff}$ and $\Lambda=3\lambda_o/2\bar{n}_{eff}$, respectively where $\bar{n}_{eff}$ is some function of the index n1 and the index n2 such as $\bar{n}_{eff}=(n1+n2)/2$. The electrical traveling wave will have a velocity of $c=c_o/n_{elec}$ where $c_o$ is the velocity of light and $n_{elec}$ is effective index for the electrical wave, which is another function of n1 and n2 and the spacing between the traveling wave surface electrode parts 592A, 592B.

Moreover, if the electrical velocity on the CPW (i.e., the rate at which the RF signal supplied to the CPW advances on the transmission line and given by $c=c_o/n_{elec}$) and the optical velocity (the rate at which the optical signal advances in the optical waveguide of the tuning reflector 591, which is bounded at the top by the Bragg grating, and given by $=c_o/\bar{n}_{eff}$) match one another (which is achieved when $\bar{n}_{eff}=n_{elec}$), the maximum change of index n2 for a given charge injection level will be obtained.

Advantageously, the closed-loop microresonator 500' of FIGS. 5F-5G can be configured to provide the functionality equivalent to a tunable DFB laser with higher speed, wider tunability, and a wider variety of electronic integration than is currently not possible in state-of-the-art technology.

In alternate embodiments, the tuning reflector 591 can be realized as part of the coupling waveguide structure in conjunction with any one of the other optical resonator structures as described herein in order to provide tunability of the wavelength of the optical mode processed by the optical resonator structure.

Figure 6A:
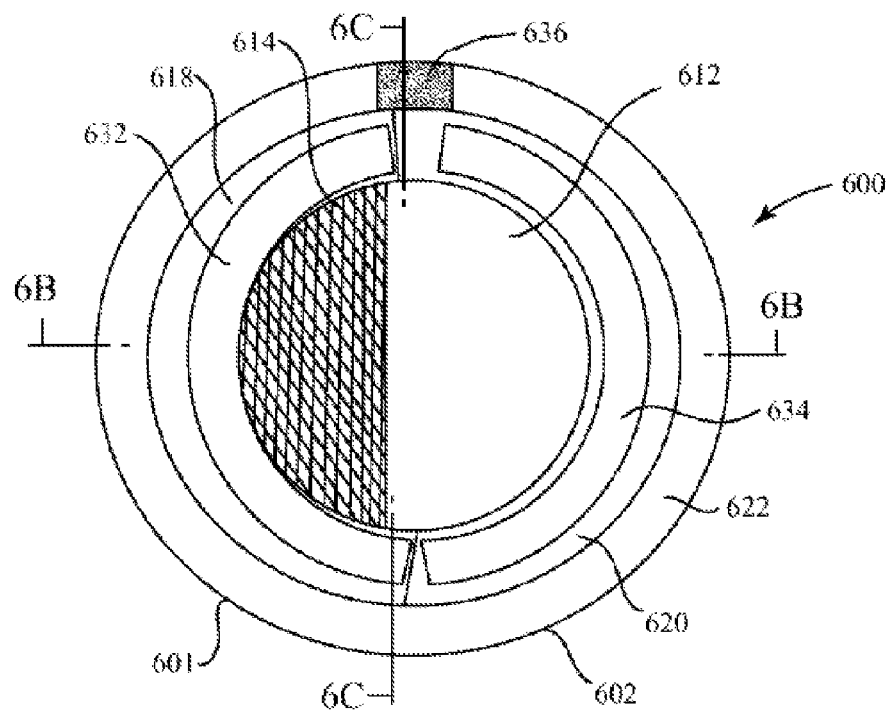
FIGS. 6A-6C illustrate an embodiment of a split-electrode vertical cavity surface emitting device realized as part of an optoelectronic integrated circuit that employs the layer structure of FIG. 1.
Figure 6B:
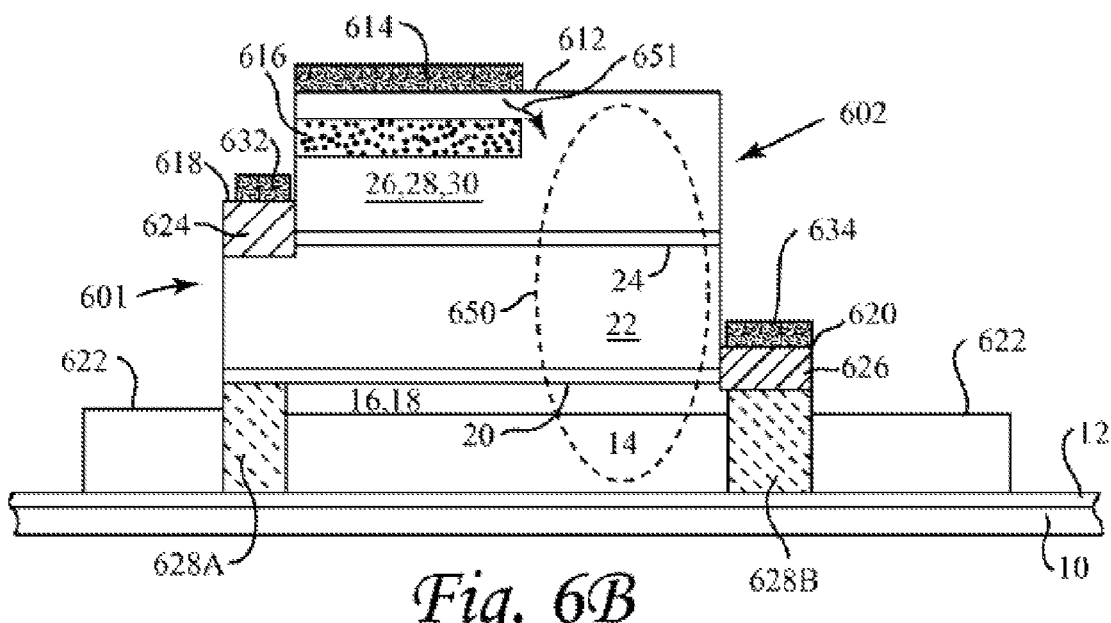
Figure 6C:
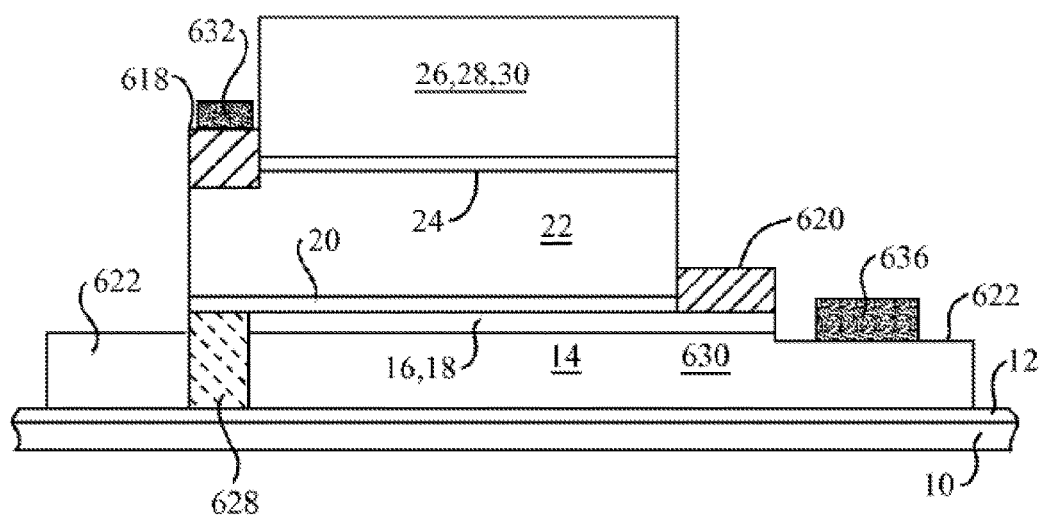

FIGS. 6A-6C illustrate a split-electrode vertical cavity surface emitting device 600 realized as part of an optoelectronic integrated circuit that employs the layer structure of FIG. 1. The device 600 can logically be partitioned into two parts, a left half 601 and a right half 602 that each have a generally half-circular top profile as shown in FIG. 6A. A top mesa 612 extends across both the left half 601 and the right half 603 as best shown in FIG. 6B. A first intermediate mesa 618 is defined on the left side 601 outside the outer periphery of the top mesa 612. The first intermediate mesa 618 is formed above (but near) the n-type modulation doped QW structure 24. A second intermediate mesa 620 is defined on the right side 603 outside the outer periphery of top mesa 612 and opposite the first intermediate mesa 618. The second intermediate mesa 620 is formed above (but near) the p-type modulation doped QW structure 20. A bottom mesa 622 is defined by the n-type layer 14 outside the periphery of both the first intermediate mesa 618 and the second intermediate mesa 620 and extends across both the left half 601 and the right half 603 as best shown in FIG. 6B.

The top mesa 612 is formed by the top surface of layer 30 of the layer structure of FIG. 1. An ion implant region 616 (preferably of n-type ions) can be implanted through the top mesa 612 to a depth within the one or more the top p-type layers 28, 30 on the left half 601 of the device. The ion implant region 616 can have a half-circle profile that provides a current barrier that funnels current injected from the anode terminal electrode 614 into the active region 650 defined by the right half 602 of the device as illustrated by arrow 651 in FIG. 6B.

The anode terminal electrode 614 is formed on the top mesa 612 with a half-circle pattern as best shown in FIG. 6A. The anode terminal electrode 614 contacts the top p-type ohmic contact layer 30. The metal of the anode terminal electrode 614 can be tungsten or other suitable metal or alloy. The metal of the anode terminal electrode 614 as well as the implant region 616 can be formed by a lift off by oxide process as described below with respect to FIGS. 9A-9D.

The first intermediate mesa 618 is formed by patterning and etching the layer structure to a depth in layer(s) 26 above (but near) the n-type modulation doped quantum well structure 24 to define the sidewall that forms the half-circle profile of the mesa 618 for the left half 601 of the device as evident from FIG. 6A. The patterned metal of the anode terminal electrode 614 can be used as a mask layer for the etch of this sidewall if desired.

The second intermediate mesa 620 is formed by patterning and etching the layer structure to a depth in spacer layer(s) 22 above (but near) the p-type modulation doped quantum well structure 20 to define the sidewall that forms the half-circle profile of the mesa 620 for the right half 602 of the device as evident from FIG. 6A.

An ion implant region 624 is defined by ion implantation of n-type ions through the first intermediate mesa 618. The ion implant 624 is implanted to a depth that encompasses the n-type modulation doped QW structure 24 with the half-circle pattern that is disposed laterally outside the projection of the sidewall that leads to the first intermediate mesa. The implant region 624 provides for electrical contact to the annular n-type modulation doped QW structure 24 of the two halves 601, 602 of the device.

An ion implant region 626 is defined by ion implantation of p-type ions through the second intermediate mesa 620. The implant region 626 provides for electrical contact to the annular p-type modulation doped QW structure 20 of the two halves 601, 602 of the device. A rapid thermal anneal (RTA) oxide can be deposited on the resultant structure and RTA operations are carried out to activate the implant regions 624 and 626 as desired. The ion implant region 626 is similar to the ion implant region 719 of the p-channel HFET as described above with respect to FIG. 7 and can be implanted together with this implants with the same p-type acceptor ions species and annealed as described above.

High resistance deep oxygen ion implant regions 628A and 628B are then implanted in the bottom n+ contact layer 14 through the intermediate mesas 618 and 620 for the left and right halves 601 and 602 of the device, where such high resistance effectively blocks current flow therethrough. The oxygen ion implant regions 628A and 628B form a near complete circle with a gap 630 that is devoid of the current blocking oxygen ions. An RTA is then performed in order to activate the oxygen ion implant regions 628A, 628B. The ion implant regions 628A, 628B is similar to the ion implant region 721 of the p-channel HFET as described above with respect to FIG. 7 and can be implanted together and annealed as described above.

The resultant structure is patterned and etched to form the annular sidewalls that extends downward to the bottom mesa 622 formed in the bottom ohmic contact layer 14. The bottom mesa 622 has a circular profile outside the periphery of the first intermediate mesa 618 and the second intermediate mesa 620 for the left and right halves 601, 602 of the device.

An n-channel injector terminal electrode 632 is formed on the first intermediate mesa 618 of the left half 601 with a half-circle pattern as best shown in FIGS. 6A and 6B. The n-channel injector terminal electrode 632 contacts the n-type ion implant region 624, which contacts the n-type modulation doped QW structure 24 of the device structure. A p-channel injector terminal electrode 634 is formed on the second intermediate mesa 620 of the right half 602 with a half-circle pattern as best shown in FIGS. 6A and 6B. The p-channel injector terminal electrode 634 contacts the p-type ion implant region 626, which contacts the p-type modulation doped QW structure 20 of the device structure. The gap 630 of the oxygen implant region is positioned adjacent a cathode terminal electrode 636 (which is preferably shaped as a small tab) that is formed on a portion of the bottom mesa 622 adjacent the gap 630 as evident from the FIGS. 6A and 6C. The gap 630 provides a narrow pathway for current flow from the active region 650 to the cathode terminal electrode 636 as evident from FIG. 6C. Similar to the source, drain, gate and collector terminal electrodes of the p-channel HFET device as described above with respect to FIGS. 7A and 7B, the metal of the p-channel injector terminal electrode 634 is preferably an Au—Be alloy, and the metal of the n-channel injector terminal 632 and the cathode terminal electrode 636 is preferably an Au—Ge—Ni alloy. The resultant structure can be heated to treat the metal alloys of the electrodes of the device as desired. Such metallization can be carried out in tandem with the metallization of the source, drain and gate electrodes of the p-channel HFET device as described above with respect to FIGS. 7A and 7B or the electrode(s) of other devices integrally formed on the substrate 10.

Following the metallization, a trench etch can expose the bottom mirror layers 12. The exposed bottom mirror layers 12 can be oxidized in steam ambient. A top mirror (not shown) can cover the mesas 612, 618, 620 and the sidewalls of the device 600, if desired. The index changes provided by the top mesa 612 (together with the top mirror when present), the sidewalls of the right half 601, the current blocking implant 616, and the bottom DBR mirror 12 form a resonant cavity of a vertical cavity laser emitter or detector. The top surface of the mesa 612 of the right half 602 (which is left open and not covered by the anode metal 614) defines an aperture that leads to the active region 650 of this vertical cavity. Electrically, the vertical cavity thyristor device 500 can operate as an electrically-pumped thyristor laser or thyristor detector.

For the thyristor laser, the device structure switches from a non-conducting/OFF state (where the current I through the device is substantially zero) to a conducting/ON state (where current I is substantially greater than zero) when i) the anode terminal electrode 614 is forward biased with respect to the cathode terminal electrode 636 and ii) the voltage between n-channel injector 632 and the anode electrode 614 is biased such that charge is produced in the n-type modulation doped QW structure 24 that is greater than the critical switching charge $Q_{CR}$, which is that charge that reduces the forward breakdown voltage such that no off state bias point exists. The voltage between p-channel injector electrode 634 and the cathode electrode 636 can also be configured to produce a charge in the p-type modulation doped QW structure 20 that is greater than the critical switching charge $Q_{CR}$. The critical switching charge $Q_{CR}$ is unique to the geometries and doping levels of the device. The device switches from the conducting/ON state (where the current I is substantially greater than zero) to a non-conducting/OFF state (where current I is substantially zero) when the current I through device falls below the hold current of the device for a sufficient period of time such that the charge in the n-type modulation doped QW structure 24 (or the charge in the p-type modulation doped QW structure 20) decreases below the holding charge $Q_H$, which is the critical value of the channel charge which will sustain holding action. Thus, if the anode terminal 614 is forward biased with respect to the cathode terminal 636 and the n-channel injector terminal 632 (and/or the p-channel injector terminal 634) is biased to produce the critical switching charge $Q_{CR}$ in the n-type modulation doped QW structure 24 (or in the p-type modulation doped QW structure 20), then the device will switch to its conducting/ON state. If the current I in the conducting/ON state is above the threshold for lasing $I_{TH}$, then photon emission will occur within the device structure. For the vertical cavity thyristor device 600, such photon emission produces an optical signal that exits through the aperture in the top mesa 612 for output therefrom. The current-blocking oxygen ion implant regions 628A, 628B funnels the current that flows from between the anode terminal electrode 614 and the cathode terminal electrode 636 into the QW channel of the p-type modulation doped QW structure 20 within the vertical resonant cavity of the device. Such current funneling enhances the current density of the injected current in the QW channel of the p-type modulation doped QW structure 20 within the vertical resonant cavity of the device, which can improve the output power of the device and/or lower the laser threshold voltage of the device.

For the thyristor detector, an input optical signal is injected through the aperture in the top mesa 612 into the vertical cavity of the device for absorption by the device structure. The device structure switches from a non-conducting/OFF state (where the current I through the device is substantially zero) to a conducting/ON state (where current I is substantially greater than zero) in response to the optical signal producing charge in the n-type modulation doped QW structure 24 and/or the p-type modulation doped QW structure 20 resulting from photon absorption of the optical signal. Specifically, the anode terminal electrode 614 is forward biased with respect to the cathode terminal electrode 636 and the voltage between n-channel injector 632 and the anode electrode 614 (and/or the voltage between the p-channel injector 634 and the cathode terminal electrode 636) is biased such that that charged produced in the n-type modulation doped QW structure 24 (and/or the p-type modulation doped QW structure 20) resulting from photon absorption of the whispering gallery mode optical signal is greater than the critical switching charge $Q_{CR}$. When the whispering gallery mode optical signal is removed, the device switches from the conducting/ON state (where the current I is substantially greater than zero) to a non-conducting/OFF state (where current I is substantially zero) when the charge in the n-type modulation doped QW structure 24 (and/or the p-type modulation doped QW structure 20) decreases below the holding charge $Q_H$.

For both the thyristor laser and the thyristor detector, the current-blocking ion implant regions 628A, 628B reduces the capacitance between the p-channel injector terminal electrode 634 and the cathode terminal electrode 636 of the device. This capacitance can drastically lower the speed of response of the device if not reduced.

Figure 8A:
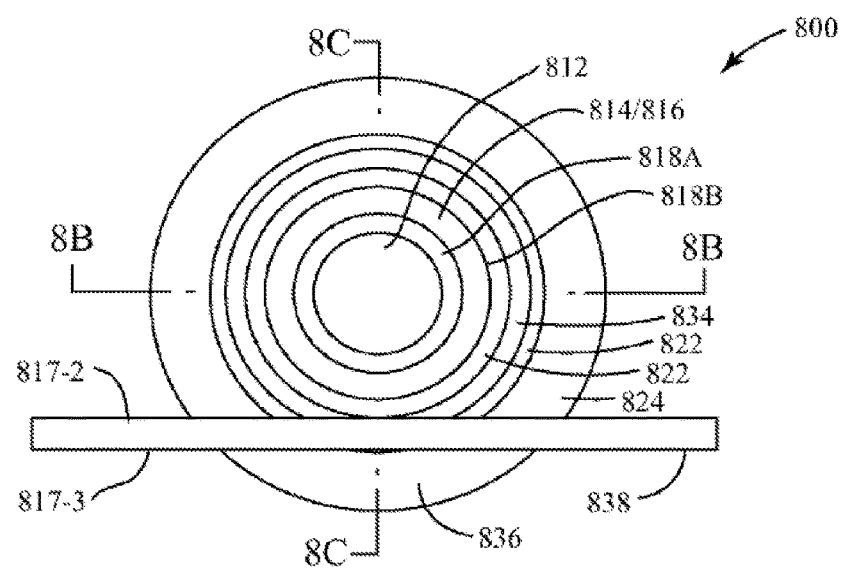
FIGS. 8A to 8C illustrates a dual-wavelength hybrid device realized as part of an optoelectronic integrated circuit that employs the layer structure of FIG. 1.
Figure 8B:
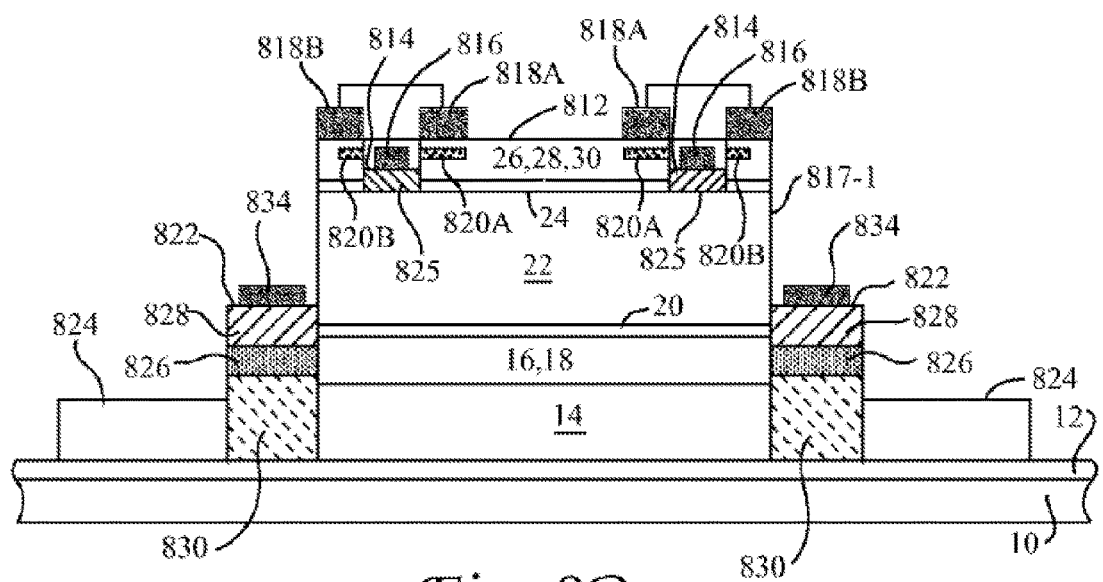
Figure 8C:
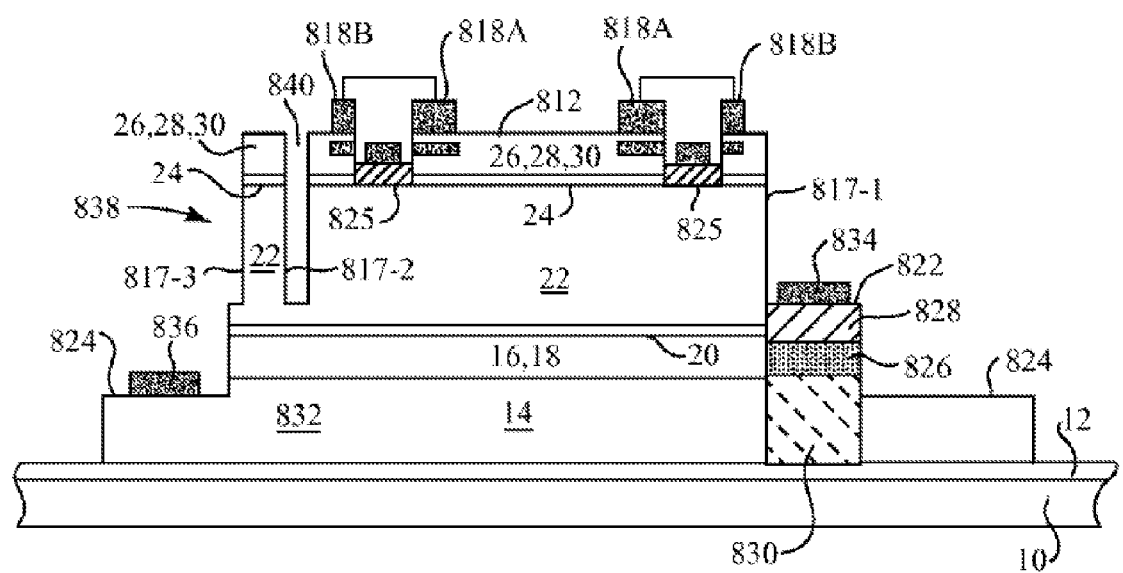

FIGS. 8A to 8C illustrate a dual-wavelength hybrid device 800 realized as part of an optoelectronic integrated circuit that employs the layer structure of FIG. 1. The dual-wavelength hybrid device 800 is a hybrid of two parts: a central part that operates as a vertical cavity device at a first wavelength corresponding to the material of the n-type modulation doped QW structure 24, and an outside part that operates as a whispering gallery mode device at a second wavelength corresponding to the material of the p-type modulation doped structure 20. The device 800 includes a top mesa 812 with an annular shallow trench that forms a first intermediate mesa 814. A bottom mesa 824 is defined outside the outer periphery of the second intermediate mesa 822.

The top mesa 812 is formed by the top surface of layer 30 of the layer structure of FIG. 1. A split anode terminal electrode with two concentric annular parts 818A, 818B is formed on the top mesa 812 as best shown in FIGS. 8A and 8B. The anode terminal electrode parts 818A, 818B both contact the top p-type ohmic contact layer 30. The metal of the anode terminal electrode parts 818A, 818B can be tungsten or other suitable metal or alloy.

Two ion implant regions 820A, 820B (preferably of n-type ions) can be implanted through the top mesa 812 to a depth within the top layers 26, 28, 30. The ion implant regions 820A, 820B can have concentric circular profiles that provide current barriers that funnel current injected from the anode terminal electrode parts 818A, 818B into both central and peripheral active regions of the device. The metal of the anode terminal electrode parts 818A, 818B as well as the ion implant regions 820A, 820B can be patterned by a lift off by oxide process as described below with respect to FIGS. 9A-9D.

The shallow trench that defines the first intermediate mesa 814 is disposed between the two anode terminal electrode parts 818A, 818B and can formed by patterning and etching the layer structure to a depth in layer(s) 26 above (but near) the n-type modulation doped quantum well structure 24. The first intermediate mesa 814 has an annular profile that is concentrically located between the two anode terminal electrode parts 818A, 818B. The patterned metal of the two anode terminal electrode parts 818A, 818B can be used as a mask layer for the etch of this shallow trench if desired.

The second intermediate mesa 822 is formed by patterning and etching the layer structure to a depth in spacer layer(s) 22 above (but near) the p-type modulation doped quantum well structure 20 as evident from FIG. 8B. The second intermediate mesa 822 is defined by an annular sidewall 817-1 that extends down from the outer periphery of the top mesa 812 as shown in FIGS. 8B and 8C. The second intermediate mesa 822 has a generally annular profile that extends laterally outside the outer periphery of the top mesa 812 as evident from FIGS. 8A and 8B. The patterned metal of the outside anode terminal electrode part 818B can be used as a mask layer for the etch of the sidewall 817-1 if desired. The outside current blocking implant region 820 can be offset laterally from the sidewall 817-1 as evident from FIG. 8B.

The patterning and etching of the sidewall 817-1 can also define two opposed sidewalls 817-2 and 817-3 of a waveguide rib that defines a coupling waveguide 838 extending tangential to the outer annular sidewall 817-1 of the device 800 as best shown on FIG. 8A. The sidewall 817-2 of the coupling waveguide 838 is offset from the annular sidewall 817-1 by a narrow gap 840 and the height of the coupling waveguide 838 can match the height of the top mesa 812 of the device 400 as best shown in FIG. 8C.

An ion implant region 825 is defined by ion implantation of n-type ions through the first intermediate mesa 814. The ion implant 825 is implanted to a depth that encompasses the n-type modulation doped QW structure 24 with an annular pattern that is disposed laterally within the projections of the annular sidewalls of the shallow top trench as evident from FIG. 8B. The implant region 825 provides for electrical contact to the annular n-type modulation doped QW structure 24 that surrounds the implant region 825 on both sides of the implant region 825.

Two ion implant regions 828, 830 are defined by ion implantation through the second intermediate mesa 822. The ion implant regions 828, 830 are similar to the ion implant regions 719 and 721 of the p-channel HFET as described above with respect to FIG. 7 and can be implanted together with these implants with the same ions species (p-type acceptor ions for the implant region 828 and oxygen ions for the implant regions 830) and annealed as described above. The implant region 828 is implanted to a depth that encompasses the p-type modulation doped QW structure 20 with an annular pattern that is disposed laterally outside the projection of the annular sidewall that extends downward to the second intermediate mesa 822 as evident from FIG. 8B. The implant region 828 provides for electrical contact to the annular p-type modulation doped QW structure 20 that is surrounded by the implant region 828. The ion implant region 830 (which has the deepest depth of the two implant regions) is implanted into the N+-type layer 14 with a pattern that is disposed laterally outside the projection of the annular sidewall that extends downward to the second intermediate mesa 822 as evident from FIG. 8B. In this manner, the implant region 828 overlies the implant region 830. The high resistance deep oxygen ion implant region 830 effectively blocks current flow therethrough and thus operates to funnel or steer current into the active region of the resonant cavity of the device. Furthermore, the current blocking oxygen ion implant region 820 defines an isolation region between the p-type implant region 828 and the bottom N+-type ohmic contact layer 14 of the layer structure. Such isolation region is substantially devoid of conducting species and significantly reduces the capacitance between the p-channel injector terminal electrode 834 and the cathode terminal electrode 836 of the device. This capacitance can drastically lower the speed of response of the device if not reduced.

The resultant structure is patterned and etched to form a generally annular sidewall that extends downward to the bottom mesa 824 formed in the bottom ohmic contact layer 14. The bottom mesa 824 has a generally circular profile outside the periphery of the second intermediate mesa 822 as shown in FIG. 8A.

An n-channel injector terminal electrode 816 is formed on the first intermediate mesa 814 with an annular pattern as best shown in FIGS. 8A and 8B. The n-channel injector terminal electrode 816 contacts the n-type ion implant region 825, which contacts the n-type modulation doped QW structure 24 of the device structure. A p-channel injector terminal electrode 834 is formed on the second intermediate mesa 822 with a generally annular pattern as best shown in FIGS. 8A and 8B. The p-channel injector terminal electrode 834 contacts the p-type ion implant region 828, which contacts the p-type modulation doped QW structure 20 of the device structure. The gap 832 in the deep oxygen ion implant region 830 is positioned adjacent a cathode terminal electrode 836 (which is preferably shaped as a small tab) that is formed on a portion of the bottom mesa 824 adjacent the gap 832 as evident from the FIGS. 8A and 8C. The gap 832 provides a narrow pathway for current flow from the central and peripheral active regions to the cathode terminal electrode 836 as evident from FIG. 8C. Similar to the source, drain, gate and collector terminal electrodes of the p-channel HFET device as described above with respect to FIGS. 7A and 7B, the metal of the p-channel injector terminal electrode 834 is preferably an Au—Be alloy, and the metal of the n-channel injector terminal 832 and the cathode terminal electrode 836 is preferably an Au—Ge—Ni alloy. The resultant structure can be heated to treat the metal alloys of the electrodes of the device as desired. Such metallization can be carried out in tandem with the metallization of the source, drain and gate electrodes of the p-channel HFET device as described above with respect to FIGS. 7A and 7B or the electrode(s) of other devices integrally formed on the substrate 10.

Following the metallization, a trench etch can expose the bottom mirror layers 12. The exposed bottom mirror layers 12 can be oxidized in steam ambient. A dielectric top mirror (not shown) can cover the mesas 812, 822, 824 and the sidewalls of the device 800, if desired. The dielectric material of the top mirror can fill the gap 840.

The index changes provided by the top mesa 812 (together with the top mirror when present and the bottom DBR mirror 12 in the central region of the device and possible other parts of the device form a resonant cavity of a thyristor vertical cavity laser emitter or detector. The top surface of the mesa 812 in the central region of the device (which is left open and not covered by the anode metal portions 818A, 818B) defines an aperture that leads to the central active region of this vertical cavity. Furthermore, the index changes provided by the top mesa 812 (together with the top mirror when present), the sidewall 817-1 of the device, the implants 820B, 826, 828, and the bottom DBR mirror 12 in the periphery of the device form a resonant cavity having an annular volume that supports propagation of a whispering gallery mode. The thickness of the disk-shaped annular volume can be configured to correspond to at or near one wavelength (for example, a thickness at or near 1 µm for a whispering gallery optical mode signal in the near-infrared range of the electromagnetic spectrum). The thickness of the disk-shaped annular volume can encompass relatively equal portions of the layer structure of FIG. 1 above and below the p-type modulation doped quantum well structure 20. The coupling waveguide 838 provides for evanescent coupling of light to and/or from the peripheral resonant cavity of the device 800 that supports propagation of a whispering gallery mode.

The device 800 can be configured to perform a first optical mode conversion function where an in-plane optical signal (which is input to the coupling waveguide 838) is converted to a vertical optical mode signal that is emitted from the central aperture of the device 800. Specifically, a whispering gallery mode is coupled into the peripheral resonant cavity from the coupling waveguide 838 by evanescent coupling. This whispering gallery mode propagates around the peripheral resonant cavity, where it is absorbed by the device structure. Such absorption adds charge to the QW(s) of the n-type modulation doped QW structure 24 (or to the P-type modulation doped structure 20) such that the channel charge exceeds the critical switching charge $Q_{CR}$, which turns the central thyristor vertical cavity device ON. The ON current is configured to produce a vertical cavity mode for output.

In one embodiment, the first optical mode conversion function can be configured to perform wavelength conversion where the in-plane optical signal input to the coupling waveguide 838 is at a first wavelength $\lambda_1$ (e.g., 980 nm), and the vertical mode emitted from the central active region of the device 800 is at a second wavelength $\lambda_2$ (e.g., 1310 nm). In this embodiment, the p-type modulation doped QW structure 20 can include one or more QD layers that are configured to absorb at the first wavelength $\lambda_1$, and the n-type modulation doped QW structure 24 can include one or more QD layers that are configured to emit at second wavelength $\lambda_2$. The electrodes of the device are biased such that the thyristor action turns ON in response to detection of the whispering gallery mode at the first wavelength $\lambda_1$ and turns OFF when the whispering gallery mode at the first wavelength $\lambda_1$ is not present, and the n-type modulation doped QW structure 24 with suitable QD layers emit at the second wavelength $\lambda_2$ when the thyristor action is ON.

The device 800 can also be configured to perform a second optical mode conversion function where a vertical optical mode is supplied to the device 800 and injected through the central aperture of the device 800 and converted to an in-plane optical signal that is output from the coupling waveguide 838. Specifically, a vertical optical mode is supplied to the device 800 and injected through the central aperture of the device 800 where it is absorbed by the device structure of the vertical resonant cavity. Such absorption adds charge to the QW(s) of the n-type modulation doped QW structure 24 (or to the P-type modulation doped structure 20) such that the channel charge exceeds the critical switching charge $Q_{CR}$, which turns the central thyristor vertical cavity device ON. The ON current is configured to produce a whispering gallery mode in the peripheral resonant cavity, which is coupled to the coupling waveguide 838 by evanescent coupling and produces the in-plane optical signal for output.

In one embodiment, the second optical mode conversion function can be configured to perform wavelength conversion where vertical mode injected into the central active region of the device 800 is at a first wavelength $\lambda_1$ (e.g., 1310 nm), and the in-plane optical signal output by the coupling waveguide 838 is at a second wavelength $\lambda_2$ (e.g., 980 nm). In this embodiment, the n-type modulation doped QW structure 24 can include one or more QD layers that are configured to absorb at the first wavelength $\lambda_1$, and the p-type modulation doped QW structure 20 can include one or more QD layers that are configured to emit at second wavelength $\lambda_2$. The electrodes of the device are biased such that the thyristor action turns ON in response to detection of the vertical cavity mode at the first wavelength $\lambda_1$ and turns OFF when the vertical cavity mode at the first wavelength $\lambda_1$ is not present, and the p-type modulation doped QW structure 24 with suitable QD layers emit at the second wavelength $\lambda_2$ when the thyristor action is ON.

For both the thyristor laser and the thyristor detector, the current-blocking ion implant regions 628A, 628B operate to funnel or steer current into the active regions for the resonant cavities of the device, and also reduce the capacitance between the p-channel injector terminal electrode 834 and the cathode terminal electrode 686 of the device. This capacitance can drastically lower the speed of response of the device if not reduced.

Figure 9A:
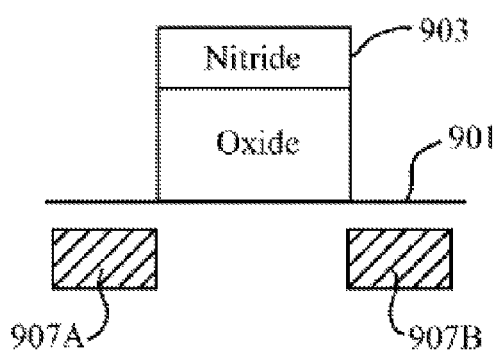
FIGS. 9A to 9D illustrate exemplary fabrication steps that form dopant implant regions that are self-aligned to patterned metal as part of an optoelectronic device realized in an integrated circuit wafer that employs the layer structure of FIG. 1.
Figure 9B:
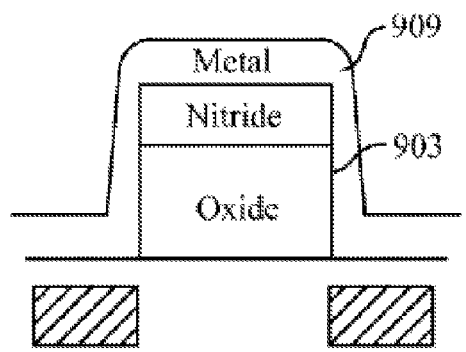
Figure 9C:
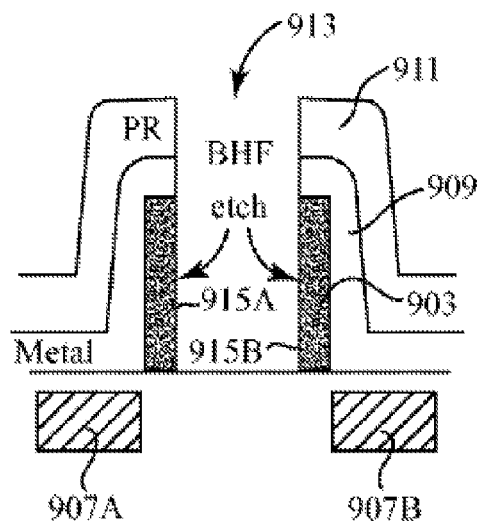
Figure 9D:
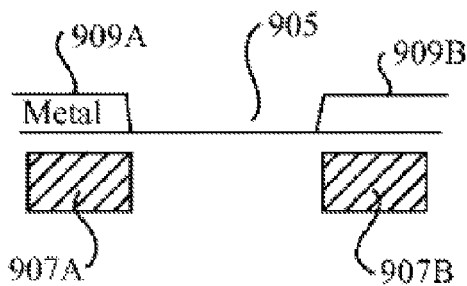

FIG. 9A to 9D illustrate exemplary fabrication steps that form dopant implant regions that are self-aligned to patterned metal for an aperture that is part of optoelectronic device realized in an integrated circuit wafer that employs the layer structure of FIG. 1. An aperture is formed at the top surface of the layer structure to allow for light to exit or enter into the active region of the device. Anode metal regions and/or implant regions can be used to block light from exiting or entering into the active region of the device structure and thus form the boundary of the aperture. In the steps of FIGS. 9A to 9D, a first mask is deposited and patterned on the top surface 901 of layer 30 of the layer structure of FIG. 1. In the one embodiment, the first mask comprises a dual layer structure of oxide and nitride as shown. The mask preferably has a thickness of 4000-5000 Å. The pattern of the mask defines a feature 901 that protects the area of the aperture 905 that results from the process as shown in FIG. 9D.

Then, one or more implant regions (such as two implant regions 907A, 907B as shown) are implanted into the layer structure outside the mask feature 903. In one embodiment, the one or more implant regions (e.g., regions 907A, 907B) are implanted to a depth that encompasses one or more of the p-type layers 26 and 28 of the layer structure of FIG. 1. In this case, the implant regions) employ n-type species of sufficient density that convert the p-type implanted region to n-type and produce a pn junction that blocks the flow of hole current flow vertically downwards. This forces the hole current to flow laterally to the un-implanted active region of the device structure disposed below the aperture 905. In another, embodiment, the implant region(s) can be implanted to a depth below the QW(s) of the n-type modulation doped QW structure 24. This requires higher energy to place the implant regions below such QW(s). In this case, the implant regions 907A, 907B operate to increase the "as grown" barrier to conduction of holes by the addition of more n type doping near the modulation doping of the n-type modulation doped QW structure 24. The larger barrier means that p-type conduction over this barrier is reduced and so the hole current from the top contact flows laterally where the barrier is lower (i.e., the vertically down conduction is blocked) preferentially to the un-implanted active region of the device structure disposed below the aperture 905. The ions species of the implant region(s) can be Si ions due to its lower mass and larger possible range. SiF ions may also be used. The advantage of locating the current blocking implant region(s) below the QW of the n-type modulation doped QW structure 24 is that the top p-type layers 28 and 30 can be made thinner (preferably a ½λ above the QW), which makes it easier to fabricate HFETs with a lower profile topology. Another advantage of this approach is a lower laser resistance and therefore reduced heat generation in the laser active region which is important for stable laser operation in the integrated environment. The implant region(s) can also provide for lateral confinement of light within the active region of the device structure disposed below the aperture 905.

Next, the metal material 909 for the top surface electrode, which can be tungsten or some other suitable metal or metal alloy, is deposited such that it covers the top surface 901 and the mask feature 903 as shown in FIG. 9B.

Next, a second mask 911 (preferably formed from photoresist material) is deposited and patterned to define a window that overlies the mask feature 903. The window is used as part of an etch operation that etches through the window down through the metal 909 and the mask feature 901 to a depth at or near the top surface 901 in the area that results in the aperture 905. The window is smaller than the width of the mask feature 901, and thus leaves behind one or more sidewalls (such as the opposed sidewalls 915A, 915B) of the mask feature 901. The sidewall(s) of the mask feature can have a width dimension on the order of 1-2 μm. This etch operation can employ an anisotropic etching process that define a near vertical profile for the sidewall(s) of the mask feature. An example of a suitable anisotropic etching process is dry reactive ion etching employing SF6.

With the second mask 911 remaining in place or possibly removed, the resultant structure is etched in BOE (Buffered Oxide Etch). The BOE etches sideways and undercuts the sidewall(s) (e.g., sidewalls 915A, 915B) of the mask feature 901 as well as the adjacent sidewall(s) of the metal material 909 and the overlying second mask 911 (if present) to form the resultant structure as shown in FIG. 9D. In this resultant structure, the aperture 905 is formed between the opposed surface electrode parts 909A, 909B. This procedure is designated lift-off by oxide.

Note that the current blocking implant(s) are disposed adjacent the aperture 905 below the corresponding surface electrode. Specifically, the opposed edge(s) of the implant region(s) are aligned laterally with the opposed edges of the surface electrode that define the boundaries of the aperture. This self-aligned configuration of the implant region(s) and the surface electrode is advantageous because it can eliminate one mask procedure, aid in minimizing resistance of the top surface layers 26, 28, 30 and aid in producing uniformity and higher yield over large areas.

In alternate embodiments, the surface electrode that define the boundaries of the aperture can be patterned and etched away after metallizing all of the electrodes of the devices of the integrated circuit and prior to depositing the dielectric material of the top mirror of such device, if used.

In yet other embodiments, the n-type and p-type doping characteristics of the epitaxial layer of FIG. 1 can be reversed with respect to one another. In this configuration, the bottom layers 14', 16' have p-type doping. The bottom layer 14' provides a P+-type ohmic contact layer. An n-type modulation doped quantum well structure 20' can be formed above the bottom layers 14', 16'. The n-type modulation doped structure 20' has a layer of N+-type modulation doping on the bottom side of the structure 20'. A p-type modulation doped quantum well structure 24' can be formed above the n-type modulation doped structure 20'. The p-type modulation doped structure 24' has a layer of P+-type modulation doping on the top side of the structure 24'. The top layers 26', 30' have n-type doping. The top layer 30' provides an N+-type ohmic contact layer.

In yet other embodiments, any one of the optical resonators as described herein can be replicated to form an array of optical emitters or detectors for parallel optical data links or wavelength division multiplexed operations. Moreover, any one of the optical resonator and coupling waveguide systems as described herein can be replicated and positioned adjacent one another to provide for optical switching functions between input and output waveguides and possibly other optical functions as desired.

In still other embodiments, the devices as described herein can be formed from the device structure of FIG. 10, which includes a bottom distributed Bragg reflector (DBR) mirror layers 1003 formed on substrate 1001. The bottom DBR mirror layers 1003 are typically formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4$) optical thickness, the reflections from each of the boundaries will be added in phase to produce a large amount of reflected light (e.g., a large reflection coefficient) at the particular center wavelength $\kappa_C$. Deposited upon the bottom DBR mirror layers 1003 is a metamorphic buffer 1005 that significantly reduces strain due lattice mismatch between the overlying active device structure and the underlying bottom DMR mirror layers 1003 and substrate 1001. Specifically, the metamorphic buffer 1005 accommodates lattice mismatch between the underlying structure (bottom DBR mirror layers 1003 and substrate 1001) and the overlying structure (the alloys of the active device structure) and absorbs strain due to such lattice mismatch while minimizing the nucleation of dislocations. Deposited on the metamorphic buffer 1005 is one or more spacer layers 1007 followed by an active device structure suitable for realizing complementary heterostructure field-effect transistor (HFET) devices. The first of these complementary HFET devices is a p-channel HFET which has a p-type modulation doped quantum well (QW) structure 1015 with an n-type gate region (i.e., bottom n-type ohmic contact layer(s) 1009 and bottom n-type region layer(s) 1011) below the p-type modulation doped QW structure 1015. One or more spacer layers 1013 is disposed between the p-type modulation doped quantum well (QW) structure 1015 and the underlying bottom n-type layer(s) 1011. One or more spacer/barrier layers 1017 are disposed above the p-type modulation doped QW structure 1015. A QD-In-QW structure 1019 is formed above the spacer/barrier layer(s) 1017, where the QD-In-QW structure 1019 includes at least one QW layer with self-assembled quantum dots (QDs) embedded therein. The second of these complementary HFET devices is an n-channel HFET which includes an n-type modulation doped QW structure 1027 with a p-type gate region (i.e., p-type ohmic contact layer(s) 1033 and p-type layer(s) 1031) formed above the n-type modulation doped QW structure 1027. One or more spacer layers 1029 is disposed between the n-type modulation doped quantum well (QW) structure 1027 and the overlying p-type layer(s) 1031. One or more spacer/barrier layers 1025 are formed below the n-type modulation doped quantum well (QW) structure 1027. A QD-In-QW structure 1023 is formed below the spacer/barrier layer(s) 1025, where the QD-In-QW structure 1023 includes at least one QW layer with self-assembled quantum dots (QDs) embedded therein. One or more spacer layer(s) 1021 are formed between the QD-In-QW structure 1019 and the QD-In-QW structure 1023. The layers encompassing the spacer layer(s) 1021 and the n-type modulation doped QW structure 1027 forms the collector region of the p-channel HFET. Similarly, the layers encompassing the spacer layer 1021 and the p-type modulation doped QW structure 1015 forms the collector region of the n-channel HFET. Such collector regions are analogous to the substrate region of a MOSFET device as is well known. Therefore a non-inverted n-channel HFET device is stacked upon an inverted p-channel HFET device as part of the active device structure.

The active device layer structure begins with bottom n-type ohmic contact layer(s) 1009 which enables the formation of ohmic contacts thereto. Deposited on layer(s) 1009 are one or more n-type layers 1011 and one or more spacer layer(s) 1013 which serve electrically as part of the gate of the p-channel HFET device and optically as a part of the lower waveguide cladding of the device. Deposited on layer(s) 1013 is the p-type modulation doped QW structure 1015 that defines a p-type charge sheet offset from one or more QWs (which may be formed from strained or unstrained heterojunction materials) by an undoped spacer layer. The p-type charge sheet is formed first below the undoped spacer and the one or more QWs of the p-type modulation doped QW structure 1015. All of the layers grown thus far form the p-channel HFET device with the gate ohmic contact on the bottom. Deposited on the p-type modulation doped QW structure 1015 is one or more spacer/barrier layers 1017. Deposited on the spacer/barrier layer(s) 1017 is the QD-In-QW structure 1019 (which corresponds to the p-type modulation doped QW structure 1015). The spacer layer(s) 1021 is then formed on the QD-In-QW structure 1019.

Deposited on the spacer layer(s) 1021 is the QD-In-QW structure 1023 (which corresponds to the n-type modulation doped QW structure 1027) followed by one or more spacer layers(s) 1025. The n-type modulation doped QW structure 1027 is formed on the spacer layer(s) 1025. The n-type modulation doped QW structure 1027 defines an n-type charge sheet offset from one or more QWs by an undoped spacer layer. The n-type charge sheet is formed last above the undoped spacer and the one or more QWs of the n-type modulation doped QW structure 1027.

Deposited on the n-type modulation doped QW structure 1027 is one or more spacer layer(s) 1029 and one or more p-type layers 1031, which can serve electrically as part of the gate of the n-channel HFET and optically as part of the upper waveguide cladding of the device. Preferably, the p-type layers 1031 include two sheets of planar doping of highly doped p-material separated by a lightly doped layer of p-material. These p-type layers are offset from the n-type modulation doped quantum well structure 1027 by the spacer layer(s) 1029. In this configuration, the top charge sheet achieves low gate contact resistance and the bottom charge sheet defines the capacitance of the n-channel HFET with respect to the n-type modulation doped QW structure 1027. Deposited on p-type layer(s) 1031 is one or more p-type ohmic contact layer(s) 1033, which enables the formation of ohmic contacts thereto. Deposited on the p-type ohmic contact layer(s) 1033 is an optical guide layer 1035.

The self-assembled quantum dots (QDs) embedded within the QD-in-QW structures 1019 and 1023 improves the efficiency of the optoelectronic devices realized from the active device structure of FIG. 10. Specifically, the population inversion necessary for laser action and amplification and the photon absorption mechanism for necessary for optical detection occurs more efficiently with the introduction of the quantum dots and thus decreases the necessary current required for lasing action and amplification increases the photocurrent produced by absorption. Furthermore, the size of the embedded QDs can be controlled to dictate the wavelength of the desired optical function (emission for lasing, amplification, absorption for detection). For example, the size of the QDs in either or both QD-in-QW structures 1019, 1023 can be controlled to dictate the wavelength in range from 1300 nm up to 1550 nm for use in the O to L (1260-1625 nm) bands employed in commercial optical telecommunication networks. Furthermore, the density distribution of the embedded QDs can be controlled to dictate the laser output power. High density of embedded QDs can provide for an increase of laser output power, but require a greater threshold lasing current.

The QD-in-QW structures 1019 and 1023 can be realized by first and second bilayer structures with an undoped barrier layer therebetween. Both the first and second bilayer structures include a template substructure offset from an emission substructure by a thin undoped barrier layer as described in detail in U.S. patent application Ser. No. 13/921,311, which was filed on Jun. 19, 2013, hereinafter incorporated by reference in its entirety.

The template substructures each include an un-graded QW with self-assembled QDs embedded therein. The self-assembled QDs can be formed during molecular beam epitaxy growth by a self-assembly method known as the Stranski-Krastanov process. In this process, an initial layer (such as InGaAs) that is part an ungraded quantum well is deposited. A compound semiconductor that is lattice mismatched relative to the initial layer and underlying layer is deposited on the initial layer. In particular, the lattice mismatch of the compound semiconductor is such that the growth forms three dimensional islands after a deposition of a critical thickness of the compound semiconductor. The growth is continued to allow the three dimensional islands to expand to form the self-assembled QDs that have the desired characteristic dimensional range. After the self-assembled QDs are formed on the initial layer, the deposition of the ungraded QW material resumes such that the self-assembled QDs are covered and fully embedded within the ungraded QW material.

The emission substructures each include an analog-graded QW with self-assembled QDs embedded therein. The self-assembled QDs can be formed during molecular beam epitaxy growth by a self-assembly method known as the Stranski-Krastanov process similar to the growth conditions of the template substructure. In this process, an initial layer (such as InGaAs) that is part an analog-graded quantum well is deposited. A compound semiconductor that is lattice mismatched relative to the initial layer and underlying layer is deposited on the initial layer. In particular, the lattice mismatch of the compound semiconductor is such that the growth forms three dimensional islands after a deposition of a critical thickness of the compound semiconductor. The three dimensional islands of the emission substructure are formed such that they are aligned with the self-assembled QDs of the underlying template structure. The growth is continued to allow the three dimensional islands to expand to form the self-assembled QDs that have the desired characteristic dimensional range. After the self-assembled QDs are formed on the initial layer, the deposition of the analog-graded QW material resumes such that the self-assembled QDs are covered and fully embedded within the analog-graded QW of the respective emission structure.

The size of the QDs of the template and emission substructures can dictate the wavelength of the electromagnetic radiation emitted or absorbed for the desired optical function (laser emission, amplification, optical detection). For example, the size of the QDs of the template and emission substructures can be controlled to dictate the emission/absorption wavelength in range from 1300 nm up to 1550 nm for use in the 0 to L (1260-1625 nm) bands employed in commercial optical telecommunication networks. Furthermore, the characteristic emission/absorption wavelengths can be different for QDs of the template and emission substructures for the QD-in-QW structures 1019 and 1023, respectively. For example, the size of the QDs of the template and emission substructures for the QD-in-QW structure 1019 can be controlled to dictate the emission/absorption wavelength in range near 1310 nm, and the size of the QDs of the template and emission substructures for the QD-in-QW structure 1023 can be controlled to dictate the emission/absorption wavelength in range near 1550 nm.

Furthermore, the density distribution of the QDs of the template and emission substructures dictates the laser output power. A high density of embedded QDs can provide for an increase of laser output power, but require a greater threshold lasing current. The density distribution of the QDs of the template substructures dictates the density distribution of the QDs of the adjacent emission substructure and allows the growth conditions of the emission substructure to be tuned to control the size of the QDs of the adjacent emission substructure. Furthermore, the template substructure relaxes the strain mismatch of the emission substructure that arises from the layer underlying the template substructure and thus allows for the larger sized QDs to be assembled in the adjacent emission substructure.

FIGS. 11A-F, collectively, illustrate an exemplary layer structure utilizing group III-V materials for realizing the device structure of FIG. 10 as described herein. The layer structure of FIGS. 11A-F can be made, for example, using known molecular beam epitaxy (MBE) techniques. Starting from FIG. 11F, a semiconductor layer 1103 of aluminum arsenide (AlAs) and a semiconductor layer 1105 of gallium arsenide (GaAs) are alternately deposited (with preferably at least seven pairs) upon a semi-insulating GaAs substrate 1101 in sequence to form the bottom DBR mirror layers. The number of AlAs layers will preferably always be one greater than the number of GaAs layers so that the first and last layers of the mirror are shown as layer 1103. In the preferred embodiment, the AlAs layers 1103 are subjected to high temperature steam oxidation during fabrication to produce the compound $Al_xO_y$, so that a mirror will be formed at the designed center wavelength. This center wavelength is selected such that all of the desired resonant wavelengths for the device structures will be subject to high reflectivity. In one embodiment, the thicknesses of layers 1103 and 1105 in the mirror can be chosen so that the final optical thickness of GaAs and $Al_xO_y$ are one quarter wavelength of the center wavelength $\lambda_C$. Alternatively the mirrors could be grown as alternating layers of one-quarter wavelength thickness of GaAs and AlAs at the designed wavelength so that the oxidation step is not used. In that case, many more pairs are required (with typical numbers such as 27.5 pairs) to achieve the reflectivity needed for efficient optical lasing and detection. The layers 1103 and 1105 correspond to the bottom DBR mirror layers 1003 of FIG. 10 as described above. The substrate 1101 corresponds to the substrate 1001 of FIG. 10 as described above.

Deposited on the last bottom mirror layer 1103 is the metamorphic buffer that significantly reduces strain due lattice mismatch between the overlying active device structure of InGaAs material as described herein and the underlying bottom DBR mirror layers and the GaAs substrate 1101. Specifically, the metamorphic buffer accommodates lattice mismatch between the underlying structure (bottom DBR mirror layers 1003 and substrate 1001) and the overlying structure (the alloys of the active device structure) and absorbs strain due to such lattice mismatch while minimizing the nucleation of dislocations. The metamorphic buffer begins with a buffer layer 1107 of undoped GaAs having a typical thickness of 34 Å. A super-lattice 1109 of $Al_{y1}Ga_{(1-y1)}As$ and GaAs are alternately deposited (with preferably at least five pairs) on the buffer layer 1107. $Al_{y1}Ga_{(1-y1)}As$ is an alloy of AlAs and GaAs where the parameter y1 is the proportion of AlAs and (1-y1) is the proportion of GaAs. The parameter y1 is preferably at or near 50% (more preferably at 52%) for the super-lattice 1109. The $Al_{y1}Ga_{(1-y1)}As$ layers and the GaAs layers of the super-lattice 1109 have a typical thickness of 2.4 Å and 1.4 Å, respectively. Next, a layer 1111 of $In_{x1}Al_{(1-x1)}As$ is deposited on the super-lattice 1109. $In_{x1}Al_{(1-x1)}As$ is an alloy of InAs and AlAs where the parameter x1 is the proportion of InAs and (1-x1) is the proportion of AlAs. The parameter x1 is preferably graded in an analog manner from 5% to 28% for layer 1111. The $In_{x1}Al_{(1-x1)}As$ layer 1111 has a typical thickness of 340 Å. The grading is carried out in the growth direction for all graded layers of FIGS. 11A-11F. The substrate temperature is controlled to a temperate preferably at or near 600° C. when depositing layers 1102 to 1109. Next, an inverse step layer 1113 of $In_{x1}Al_{(1-x1)}As$ is deposited on layer 1111. The parameter x1 is preferably graded in an analog manner from 28% to 25% for layer 1113 and thus layer 1113 matches layers 1111 at the interface between layers 1113 and 1111. The $In_{x1}Al_{(1-x1)}As$ layer 1113 has a typical thickness of 20 Å. The substrate temperature is controlled to a temperate preferably in the range of 400-450° C. when depositing layers 1111 to 1235 as described herein. Next, a healing layer 1115 of $In_{x1}Al_{(1-x1)}As$ is deposited on layer 1113. The parameter x1 is constant preferably at 25% for layer 1115 and thus layer 1115 matches layer 1113 at the interface between layers 1115 and 1113. The $In_{x1}Al_{(1-x1)}As$ layer 1115 has a typical thickness of 120 Å. Next, a layer 1117 of $In_{x1}Al_{(1-x1)}As$ is deposited on layer 1115. The parameter x1 is preferably graded in an analog manner from 25% to 52% for layer 1117 and thus layer 1117 matches layer 1115 at the interface between layers 1117 and 1115. The $In_{x1}Al_{(1-x1)}As$ layer 1117 has a typical thickness of 380 Å. Next, an inverse step layer 1119 of $In_{x1}Al_{(1-x1)}As$ is deposited on layer 1117. The parameter x1 is preferably graded in an analog manner from 52% to 49% for layer 1119 and thus layer 1119 matches layer 1117 at the interface between layers 1119 and 1117. The $In_{x1}Al_{(1-x)}As$ layer 1119 has a typical thickness of 20 Å. Next, a healing layer 1121 of $In_{x1}Al_{(1-x1)}As$ is deposited on layer 1119. The parameter x1 is constant preferably at 49% for layer 1121 and thus layer 1121 matches layer 1119 at the interface between layers 1121 and 1119. The $In_{x1}Al_{(1-x1)}As$ layer 1121 has a typical thickness of 110 Å. Note that the inverse step and healing layers of the metamorphic buffer provide a relatively abrupt change of strain in the respective inverse step layers and thus promotes isolated threading dislocations in the inverse step layers while reducing threading dislocations in the layers thereabove and thus provide smoother growing surfaces. The layers 1107 to 1121 corresponds to the metamorphic buffer 1005 of FIG. 10 as described above.

Deposited on layer 1121 is a spacer layer 1123 of undoped $In_{x1}Ga_{(1-x1)}As$. $In_{x1}Ga_{(1-x1)}As$ is an alloy of InAs and GaAs where the parameter x1 is the proportion of InAs and (1-x1) is the proportion of GaAs. The parameter x1 is constant preferably at 53% for layer 1123. The $In_{x1}Ga_{(1-x1)}As$ layer 1123 has a typical thickness of 200 Å. The $In_{x1}Ga_{(1-x1)}As$ layer 1123 functions to eliminate anti-null absorption. The spacer layer 1123 corresponds to the spacer layer 1007 of FIG. 10 as described above.

Deposited on spacer layer 1123 is the active device structure which begins with layer 1125 of N+ type $In_{x1}Ga_{(1-x1)}As$ that enables the formation of ohmic contacts thereto. The parameter x1 is constant preferably at 53% for layer 1125 and thus layer 1125 matches spacer layer 1123. Layer 1125 has a typical thickness near 3000 Å and a typical n-type doping of $3.5 \times 10^{18}$ cm$^{-3}$. The N+ doped $In_{x1}Ga_{(1-x1)}As$ layer 1125 corresponds to the bottom n-type ohmic contact layer 1009 of FIG. 10 as described above.

Deposited on layer 1125 is layer 1127 of n-type $In_{x1}Al_{(1-x1)}As$ with a typical thickness of 600-1000 Å and a typical doping of $5 \times 10^{17}$ cm$^{-3}$. The parameter x1 is preferably 52% for layer 1127. The wideband material of layer 1125 serves as part of the gate region of the p-channel HFET device and optically as a small part of the lower waveguide cladding of the respective optical device. Note that a majority of the lower waveguide cladding for waves propagating in the guide formed by the optically active region of the device is provided by the lower DBR mirror itself. Next are four layers (1129, 1131, 1133, 1135) comprising a stack of an alternating tertiary alloy of InGaAs and a quaternary alloy of InAlGaAs. These four layers collectively have a total thickness of about 125 Å and doped N+ with a typical n-type doping of $3.5 \times 10^{18}$ cm$^{-3}$. The first layer 1129 is a tertiary alloy of $In_{x1}Ga_{(1-x1)}As$ where the parameter x1 is preferably 53% and with a typical thickness of 12 Å. The second layer 1131 is a quaternary alloy of $In_{x1}Al_{x2}Ga_{(1-x1-x2)}As$. $In_{x1}Al_{2}Ga_{(1-x1-x2)}As$ is an alloy of InAs, AlAs and GaAs where the parameter x1 is the proportion of InAs, the parameter x2 is the proportion of AlAs and (1-x1-x2) is the proportion of GaAs. The parameters x1 and x2 for layer 1131 is preferably 53% and 21%, respectively, and layer 1131 has a typical thickness of 20 Å. The third layer 1133 is a tertiary alloy of $In_{x1}Ga_{(1-x1)}As$ where the parameter x1 of layer 1133 is preferably 53% and with a typical thickness of 12 Å. The fourth layer 1135 is a quaternary alloy of $In_{x1}Al_{x2}Ga_{(1-x1-x2)}As$ where the parameters x1, x2 of layer 1135 are preferably 53% and 21%, respectively, and layer 1135 has a typical thickness of 80 Å. The stack of layers 1129, 1131, 1133, 1135 are mid-band gap materials and operate to trap defects from the Al material of layer 1131. The n-type layers 1127 to 1135 correspond to the bottom n-type layer(s) 1011 of FIG. 10.

Next is an undoped layer 1137 formed from a quaternary alloy of $In_{x1}Al_{x2}Ga_{(1-x1-x2)}As$, where the parameters x1 and x2 of layer 1137 are preferably 53% and 21%, respectively. Layer 1137 has a typical thickness of 300 Å. The undoped InAlGaAs layer 1137 corresponds to the spacer layer(s) 1013 of FIG. 10 as described above.

Next is a thin p-type charge sheet 1139 formed from a quaternary alloy of $In_{x1}Al_{x2}Ga_{(1-x1-x2)}As$, where the parameters x1 and x2 of layer 1139 are preferably 53% and 21%, respectively. Layer 1139 is doped P+ with a typical p-type doping of $7\times10^{18}$ cm$^{-3}$ and has a typical thickness of 40 Å. Next is a undoped spacer layer 1141 formed from the quaternary alloy of $In_{x1}Al_{x2}Ga_{(1-x1-x2)}As$, where the parameters x1 and x2 of layer 1141 are preferably 53% and 21%, respectively. Layer 1141 has a typical thickness of 30 Å. Next, an undoped InGaAs barrier layer 1143 and an InGaAs quantum well layer 1145 are repeated for a number of quantum wells (such as three or more quantum wells) for the inverted p-type modulation doped quantum structure. Single quantum well structures may also be used. The undoped InGaAs barrier layer 1143 is formed from a tertiary alloy of $In_{x1}Ga_{(1-x1)}As$, where the parameter x1 is preferably 53%. Layer 1143 has a typical thickness of 15 Å. The InGaAs quantum well layer 1145 is formed from a tertiary alloy of $In_{x1}Ga_{(1-x1)}As$, where the parameter x1 is preferably 70%. Layer 1145 has a typical thickness of 60 Å. Layers 1139 to 1145 correspond to the inverted p-type modulation doped quantum structure 1015 of FIG. 10 as described above.

An undoped InGaAs layer 1147 follows the last InGaAs quantum well layer. The undoped InGaAs layer 1147 is formed from a tertiary alloy of $In_{x1}Ga_{(1-x1)}As$, where the parameter x1 is preferably 53%. Layer 1147 has a typical thickness of 300-500 Å. Layer 1147 corresponds to spacer layer 1017 of FIG. 10 as described above.

Following layer 1147 are layers 1149 to 1177 that correspond to the QD-in QW structure 1019 of FIG. 10 as described above. Layers 1149 to 1153 form the template QD structure with InAs QDs embedded within a non-graded $In_{x1}Ga_{(1-x1)}As$ quantum well where the parameter x1 is 70%. The initial layer 1149 of the $In_{x1}Ga_{(1-x1)}As$ quantum well that is deposited before the InAs QD growth sequence (specified as 1151) is preferably about 2 Å thick. The layer 1153 of the $In_{x1}Ga_{(1-x1)}As$ quantum well that is deposited after the InAs QD growth sequence is preferably about 40-60 Å thick. An undoped $In_{x1}Ga_{(1-x1)}As$ barrier layer 1155 is deposited on the InGaAs quantum well layer 1153. The parameter x1 of the undoped $In_{x1}Ga_{(1-x1)}As$ barrier layer 1155 is preferably 53%. Layer 1155 has a typical thickness of 100 Å. Layers 1157 to 1161 form the emission QD structure on the barrier layer 1155. The emission QD structure includes InAs QDs embedded within an $In_{x1}Ga_{(1-x1)}As$ quantum well that employs analog grading of In content. The initial layer 1157 of the $In_{x1}Ga_{(1-x1)}As$ quantum well that is deposited before the InAs QD growth sequence (specified as 1159) is preferably about 40 Å thick and has analog grading of In content with the parameter x1 of 53% at the interface to barrier layer 1155 to the parameter x1 of 70% at the interface of the InAs QD growth sequence. The layer 1161 of the $In_{x1}Ga_{(1-x1)}As$ quantum well that is deposited after the InAs QD growth sequence (specified as 1159) is preferably about 40 Å thick and has analog grading of In content with the parameter x1 of 70% at the interface of the InAs QD growth sequence to the parameter x1 of 53% at the interface to barrier layer 1163.

An undoped $In_{x1}Ga_{(1-x1)}As$ barrier layer 1163 is deposited on the top InGaAs quantum well layer 1161. The parameter x1 of the undoped $In_{x1}Ga_{(1-x1)}As$ barrier layer 1163 is preferably 53%. The undoped $In_{x1}Ga_{(1-x1)}As$ barrier layer 1163 is preferably about 300-500 Å thick.

Following barrier layer 1163 are layers 1165 to 1169 that form the template QD structure with InAs QDs embedded within a non-graded $In_{x1}Ga_{(1-x1)}As$ quantum well where the parameter x1 is 70%. The initial layer 1165 of the $In_{x1}Ga_{(1-x1)}As$ quantum well that is deposited before the InAs QD growth sequence (specified as 1167) is preferably about 2 Å thick. The layer 1169 of the $In_{x1}Ga_{(1-x1)}As$ quantum well that is deposited after the InAs QD growth sequence is preferably about 40-60 Å thick. An undoped $In_{x1}Ga_{(1-x1)}As$ barrier layer 1171 is deposited on the InGaAs quantum well layer 1169. The parameter x1 of the undoped $In_{x1}Ga_{(1-x1)}As$ barrier layer 1171 is preferably 53%. Layer 1171 has a typical thickness of 100 Å. Layers 1173 to 1177 form the emission QD structure on the barrier layer 1171. The emission QD structure includes InAs QDs embedded within an $In_{x1}Ga_{(1-x1)}As$ quantum well that employs analog grading of In content. The initial layer 1173 of the $In_{x1}Ga_{(1-x1)}As$ quantum well that is deposited before the InAs QD growth sequence (specified as 1175) is preferably about 40 Å thick and has analog grading of In content with the parameter x1 of 53% at the interface to barrier layer 1175 to the parameter x1 of 70% at the interface of the InAs QD growth sequence. The layer 1177 of the $In_{x1}Ga_{(1-x1)}As$ quantum well that is deposited after the InAs QD growth sequence (specified as 1175) is preferably about 40 Å thick and has analog grading of In content from the parameter x1 of 70% at the interface of the InAs QD growth sequence to the parameter x1 of 53% at the interface to spacer layer 1179.

Next is an undoped spacer layer 1179 formed from a quaternary alloy of $In_{x1}Al_{x2}Ga_{(1-x1-x2)}As$, where the parameters x1 and x2 are preferably 53% and 21%, respectively. Layer 1179 has a typical thickness of 4000 Å. Layer 1179 correspond to the spacer layer(s) 1021 of FIG. 10 as described above.

Following the spacer layer 1179 are layers 1181 to 1211 that correspond to the QD-in QW structure 1023 of FIG. 10 as described above. Layer 1181 is an undoped $In_{x1}Ga_{(1-x1)}As$ barrier layer preferably with the parameter x1 of 53% and with a thickness on the order of 300-500 Å. Layers 1183 to 1187 form the template QD structure with InAs QDs embedded within a non-graded $In_{x1}Ga_{(1-x1)}As$ quantum well where the parameter x1 is 70%. The initial layer 1183 of the $In_{x1}Ga_{(1-x1)}As$ quantum well that is deposited before the InAs QD growth sequence (specified as 1185) is preferably about 2 Å thick. The layer 1187 of the $In_{x1}Ga_{(1-x1)}As$ quantum well that is deposited after the InAs QD growth sequence is preferably about 40-60 Å thick. An undoped $In_{x1}Ga_{(1-x1)}As$ barrier layer 1189 is deposited on the InGaAs quantum well layer 1153. The parameter x1 of the undoped $In_{x1}Ga_{(1-x1)}As$ InGaAs barrier layer 1189 is preferably 53%. Layer 1189 has a typical thickness of 100 Å. Layers 1191 to 1195 form the emission QD structure on the barrier layer 1189. The emission QD structure includes InAs QDs embedded within an $In_{x1}Ga_{(1-x1)}As$ quantum well that employs analog grading of In content. The initial layer 1191 of the $In_{x1}Ga_{(1-x1)}As$ quantum well that is deposited before the InAs QD growth sequence (specified as 1193) is preferably about 40 Å thick and has analog grading of In content with the parameter x1 of 53% at the interface to barrier layer 1189 to the parameter x1 of 70% at the interface of the InAs QD growth sequence. The layer 1195 of the $In_{x1}Ga_{(1-x1)}As$ quantum well that is deposited after the InAs QD growth sequence (specified as 1193) is preferably about 40 Å thick and has analog grading of In content from the parameter x1 of 70% at the interface of the InAs QD growth sequence to the parameter x1 of 53% at the interface to barrier layer 1197.

An undoped $In_{x1}Ga_{(1-x1)}As$ barrier layer 1197 is deposited on the top InGaAs quantum well layer 1195. The parameter x1 of the undoped $In_{x1}Ga_{(1-x1)}As$ barrier layer 1197 is preferably 53%. The undoped InGaAs barrier layer 1197 is preferably about 300-500 Å thick.

Following barrier layer 1197 are layers 1199 to 1203 that form the template QD structure with InAs QDs embedded within a non-graded $In_{x1}Ga_{(1-x1)}As$ quantum well with the parameter x1 of 70%. The initial layer 1199 of the $In_{x1}Ga_{(1-x1)}As$ quantum well that is deposited before the InAs QD growth sequence (specified as 1201) is preferably about 2 Å thick. The layer 1203 of the $In_{x1}Ga_{(1-x1)}As$ quantum well that is deposited after the InAs QD growth sequence is preferably about 40-60 Å thick. An undoped $In_{x1}Ga_{(1-x1)}As$ barrier layer 1205 is deposited on the InGaAs quantum well layer 1203. The parameter x1 of the undoped $In_{x1}Ga_{(1-x1)}As$ barrier layer 1205 is preferably 53%. Layer 1205 has a typical thickness of 100 Å. Layers 1207 to 1211 form the emission QD structure on the barrier layer 1205. The emission QD structure includes InAs QDs embedded within an $In_{x1}Ga_{(1-x1)}As$ quantum well that employs analog grading of In. content The initial layer 1207 of the $In_{x1}Ga_{(1-x1)}As$ quantum well that is deposited before the InAs QD growth sequence (specified as 1209) is preferably about 40 Å thick and has analog grading of In content with the parameter x1 of 53% at the interface to barrier layer 1205 to the parameter x1 of 70% at the interface of the InAs QD growth sequence. The layer 1211 of the $In_{x1}Ga_{(1-x1)}As$ quantum well that is deposited after the InAs QD growth sequence (specified as 1209) is preferably about 40 Å thick and has analog grading of In content with the parameter x1 of 70% at the interface of the InAs QD growth sequence to the parameter x1 of 53% at the interface to barrier layer 1213.

An undoped $In_{x1}Ga_{(1-x1)}As$ barrier layer 1213 is deposited on the InGaAs quantum well layer 1211. The parameter x1 of the undoped $In_{x1}Ga_{(1-x1)}As$ barrier layer 1213 is preferably 53%. Layer 1213 has a typical thickness of 300-500 Å and corresponds to the spacer layer 1025 of FIG. 10 as described above.

Next is an InGaAs quantum well layer 1215 and an undoped InGaAs barrier layer 1217 that are repeated for a number of quantum wells (such as three or more quantum wells) for the n-type modulation doped quantum structure. Single quantum well structures may also be used. The InGaAs quantum well layer 1215 is formed from a tertiary alloy of $In_{x1}Ga_{(1-x1)}As$, where the parameter x1 is preferably 70%. Layer 1215 has a typical thickness of 60 Å. The undoped InGaAs barrier layer 1217 is formed from a tertiary alloy of $In_{x1}Ga_{(1-x1)}As$, where the parameter x1 is preferably 53%. Layer 1217 has a typical thickness of 15 Å. Next is a undoped spacer layer 1219 formed from a quaternary alloy of $In_{x1}Al_{x2}Ga_{(1-x1-x2)}As$ where the parameters x1 and x2 are preferably 53% and 21%, respectively. Layer 1219 has a typical thickness of 30 Å. Next is a thin n-type charge sheet 1221 formed from a quaternary alloy of $In_{x1}Al_{x2}Ga_{(1-x1-x2)}As$, where the parameters x1 and x2 are preferably 53% and 21%, respectively. Layer 1221 is doped N+ with a typical n-type doping of $3.5\times10^{18}$ cm$^{-3}$ and has a typical thickness of 80 Å. The layers 1215 to 1221 corresponds to the n-type modulation doped quantum well structure 1027 of FIG. 10 as described above.

Next is an undoped layer 1223 formed from a quaternary alloy of $In_{x1}Al_{x2}Ga_{(1-x1-x2)}As$, where the parameters x1 and x2 are preferably 53% and 21%, respectively. Layer 11223 has a typical thickness of 300 Å. The undoped InAlGaAs layer 1223 corresponds to the spacer layer(s) 1029 of FIG. 10 as described above.

Next are three layers (1225, 1227, 1229) that have a total thickness of about 700-800 Å and are doped with p-type doping. The first layer 1225 is a quaternary alloy of $In_{x1}Al_{x2}Ga_{(1-x1-x2)}As$ where the parameters x1 and x2 are preferably 53% and 21%, respectively. The first layer 1225 is P+ doped with a typical p-type doping of $7\times10^{18}$ cm$^{-3}$ and has a typical thickness of 60 Å. The second layer 1227 is a tertiary alloy of $In_{x1}Ga_{(1-x1)}As$ where the parameter x1 is preferably 53%. The second layer 1227 is P+ doped with a typical p-type doping of $7\times10^{18}$ cm$^{-3}$ and has a typical thickness of 12 Å. The third layer 1229 is a tertiary alloy of $In_{x1}Al_{(1-x1)}As$ where the parameter x1 is preferably 52%. The third layer 1229 is P doped with a typical p-type doping of $5\times10^{17}$ cm$^{-3}$ and has a typical thickness of 700 Å. The wideband material of layer 1229 serves as part of the gate region of the n-channel HFET device and optically as upper waveguide cladding of the respective optical device. The n-type layers 1225 to 1229 correspond to the top n-type layer(s) 1031 of FIG. 10 as described above.

Next is layers 1231 and 1233 of P+ type $In_{x1}Ga_{(1-x1)}As$ that enables the formation of ohmic contacts thereto. The parameter x1 of layers 1231 and 1233 is constant preferably at 53%. Layer 1231 has a typical thickness near 900 Å and a typical p-type doping of $7\times10^{18}$ cm$^{-3}$. Layer 1233 has a typical thickness near 60 Å and a typical p-type doping of $1\times10^{20}$ cm$^{-3}$. The P+ doped $In_{x1}Ga_{(1-x1)}As$ layers 1231 and 1233 corresponds to the top p-type ohmic contact layer(s) 1133 of FIG. 10 as described above.

Deposited on layer 1233 is layer 1235 of undoped $In_{x1}Ga_{(1-x1)}As$ with a typical thickness of 700-1000 Å (more preferably near 870 Å). The parameter x1 for layer 1233 is preferably 53%. Layer 1235 can be used to form an aperture for optical devices (such as VCSELs) as described herein and to form active and passive in-plane optical waveguide structures (such as the active and passive sections of the closed-path waveguides) as described herein. Layer 1233 corresponds to the optical guide layer 1035 of FIG. 10 as described above.

Note that the size of the embedded QDs of the template and emission substructures of the template and emission QD substructures contributes to the emission/absorption wavelength of such structures. In one embodiment, the embedded QDs of the template and emission substructures have the following characteristics:

QDs of the emission substructure having a maximal characteristic dimension of 50-60 Å for production/absorption of light with a characteristic wavelength at or near 1310 nm, and QDs of the template substructure having a maximal characteristic dimension of 20-30 Å (which are of smaller size that the emission substructure) for production/absorption of light with a characteristic wavelength at or near 1310 nm;

QDs of the emission substructure having maximal characteristic dimension of 20-30 Å for production/absorption of light with a characteristic wavelength at or near 1430 nm, and QDs of the template substructure having a maximal characteristic dimension of 20-30 Å (which are of smaller size that the emission substructure) for production/absorption of light with a characteristic wavelength at or near 1430 nm;

QDs of the emission substructure having a maximal characteristic dimension of 100-110 Å for production/absorption of light with a characteristic wavelength at or near 1550 nm, and QDs of the template substructure having a maximal characteristic dimension of 20-30 Å (which are of smaller size that the emission substructure) for production/absorption of light with a characteristic wavelength at or near 515 nm; and QDs with an aspect ratio on the order of three (i.e., the characteristic base dimension of the QD is about three times larger than the characteristic height dimension of the QD).

Such QD size and aspect ratio are dictated by growth conditions, particularly the number of monolayers for three dimensional InAs QD growth. For example, 2 ML of three dimensional InAs QD growth can be used for the template substructures, and 3.2 ML of three dimensional InAs QD growth can be used for the emission substructures. Other suitable monolayer growths can be used as well. Moreover, the thickness of the barrier layer(s) between the QDs of the template substructure and the emission substructure can be controlled in order that the strain energy from the template substructure have a desired influence on the larger dot size and quality of the emission substructure. Moreover, the In concentration of the analog graded quantum well material onto which the QDs are grown can be used to control the amount of strain and thus the maximum size of the QDs formed thereon. For example, the analog graded quantum well layers of the emission substructures can have a maximum relative concentration of In greater than 70% (for example up to or beyond 90%) in order to reduce the amount of strain and thus increase the maximum size of the QDs formed thereon.

Also note the incorporation of In into the quantum wells of the n-type and p-type modulation doped quantum well structures can greatly improve the frequency response (i.e., higher cutoff frequencies) for transistor devices including the n-channel HFET and the p-channel HFET devices.

FIGS. 12A to 12I illustrate exemplary fabrication steps that form an optical feature (such as an aperture) this is aligned to patterned metal and one more underlying implant regions as part of optoelectronic device realized in an integrated circuit that employs the layer structure of FIG. 10. The optical feature is formed at the top surface of the layer structure of FIG. 10. The optical feature can be an aperture that allows for light to exit or enter into the active region of the device. The patterned metal regions and one or more underlying implant regions can be used to block light from exiting or entering into the active region of the device structure and thus form the boundary of the aperture. Similar methodology can also be used to form a passive and/or active in-plane waveguide structures as part of optoelectronic device realized in an integrated circuit that employs the layer structure of FIG. 10. Such in-plane waveguide guides the propagation of light in the plane of the integrated circuit, and the optical feature formed at the top surface provides for vertical confinement and wave guiding of light for the top portion of the integrated circuit wafer. For the passive in-plane waveguide structure, the patterned metal can be omitted.

Figures 12A, 12B, 12C:
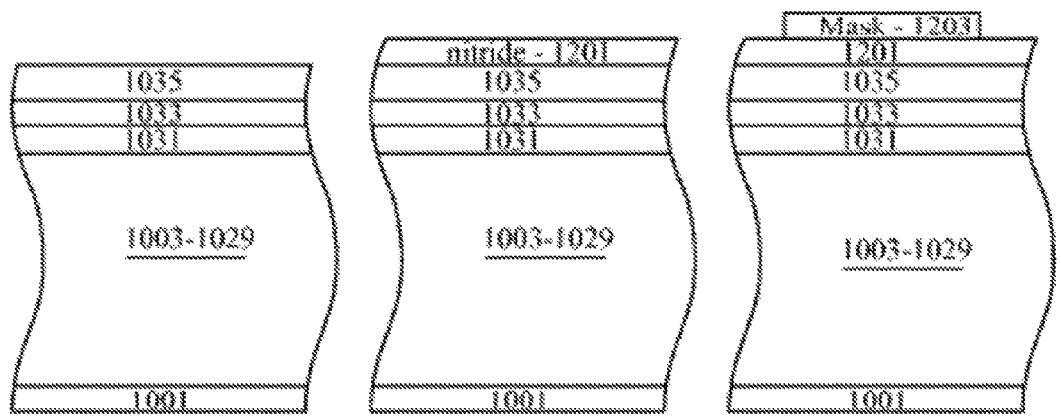
FIGS. 12A to 12I illustrate exemplary fabrication steps that form an aperture (or in-plane waveguide) in conjunction with patterned metal electrodes and/or aligned implant regions as part of an optoelectronic device realized in an integrated circuit that employs the layer structure of FIG. 10.
Figures 12D, 12E, 12F:
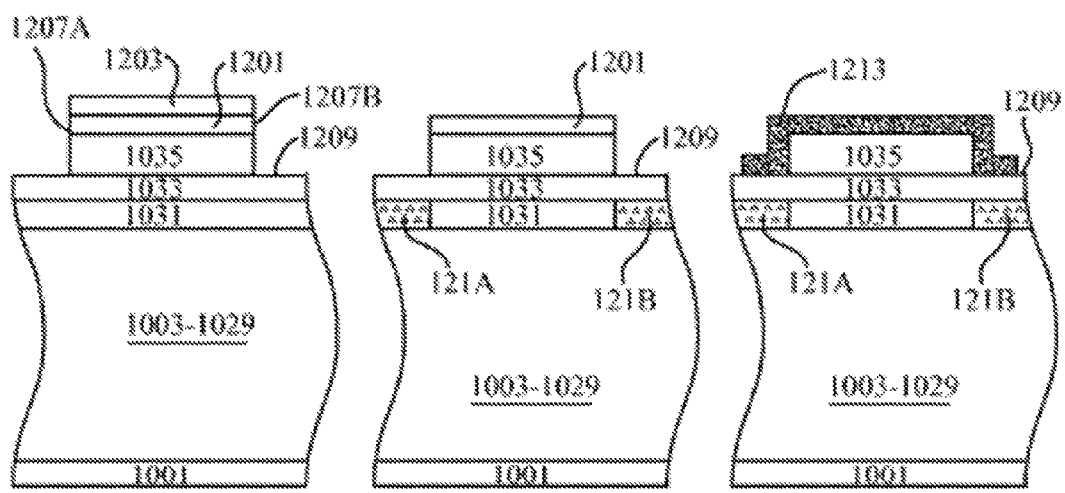
Figure 12G:
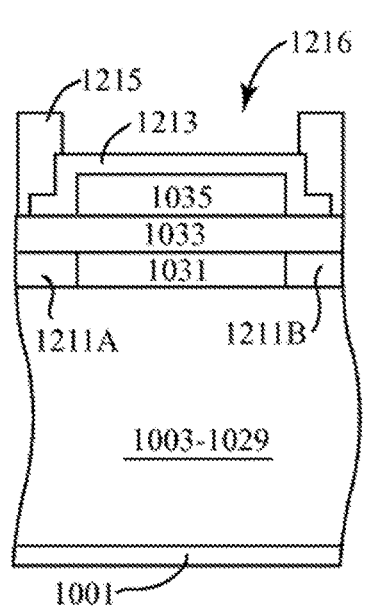
Figure 12H:
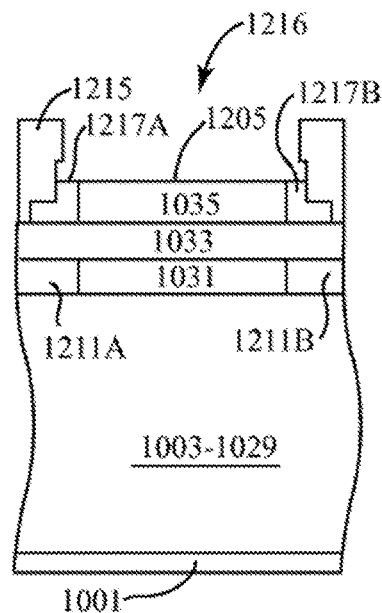
Figure 12I:
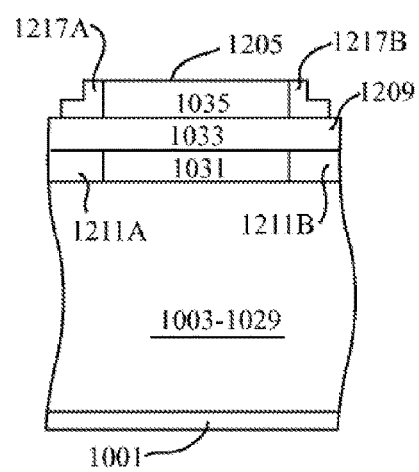

In the steps of FIGS. 12A to 12I, a protective layer 1201 (preferably formed from silicon nitride) is deposited on the top surface of layer 1035 of FIG. 10 as shown in FIGS. 12A and 12B. A mask (preferably formed from photoresist material) is deposited and patterned to define a mask feature 1203 as shown in FIG. 12C. The mask feature 1203 protects the area of the aperture 1205 that results from the process as shown in FIG. 12I.

Then, mask feature 1203 is used as part of an etch operation that etches through the exposed protective layer 1201 and underlying guide layer 1035 to a depth at or near the top surface 1209 of layer 1033, and thus leaving behind a post that includes the protective layer 1201 and underlying guide layer 1035 as shown in FIG. 12D. The post can include one or more sidewalls (such as the two opposed sidewalls 1207A, 1207B) that extend through the protective layer 1201 and underlying guide layer 1035 as shown. This etch operation can employ an anisotropic etching process that define a near vertical profile for the sidewall(s) of the post. An example of a suitable anisotropic etching process is dry reactive ion etching employing SF6.

Then, one or more implant regions such as two implant regions 1211A, 1211B) are implanted through the top surface 1209 into the layer structure outside the post as shown in FIG. 12E. In one embodiment, the one or more implant regions (e.g., regions 1211A, 1211B) are implanted to a depth that encompasses the top p-type layers 1031 of the layer structure of FIG. 10. In this case, the one or more implant regions (e.g., implant regions 1211A, 1211B) employ n-type species of sufficient density that convert the p-type implanted region to n-type and produce a pn junction that blocks the flow of hole current flow vertically downwards. This forces the hole current to flow laterally to an un-implanted active region of the device structure disposed below the post. In another, embodiment, the one or more implant regions (e.g., regions 1211A and 1211B) can be implanted to a depth below the QW(s) of the n-type modulation doped QW structure 1027. This requires higher energy to place the implant region(s) below such QW(s). In this case, the one or more implant regions (e.g., regions 1211A, 1211B) operate to increase the "as grown" barrier to conduction of holes by the addition of more n type doping near the modulation doping of the n-type modulation doped QW structure 1027. The larger barrier means that p-type conduction over this barrier is reduced and so the hole current from the top contact flows laterally where the barrier is lower (i.e., the vertically down conduction is blocked) preferentially to the un-implanted active region of the device structure disposed below the post. The ions species of the implant region(s) can be Si ions due to its lower mass and larger possible range. SiF ions may also be used. The advantage of locating the current blocking implant region(s) below the QW of the n-type modulation doped QW structure 1027 is that the top p-type layers 1031 can be made thinner (preferably a ½λ above the QW), which makes it easier to fabricate HFETs with a lower profile topology. Another advantage of this approach is a lower laser resistance and therefore reduced heat generation in the laser active region which is important for stable laser operation in the integrated environment. The implant region(s) (e.g., regions 211A, 1211B) can also provide for lateral confinement of light within the active region of the device structure disposed below the post.

Next, the protective layer 1201 of the post is removed and then metal material 1213 for the top surface electrode, which can be tungsten or some other suitable metal or metal alloy, is deposited and patterned such that it covers the top surface 1209 of layer 1033 and the top surface and sidewalls of the guide layer 1035 of the post as evident from FIG. 12F.

Next, a second mask layer 1215 (preferably formed from photoresist material) is deposited and patterned to define a window 1216 that overlies the metal feature 1213 and the guide layer 1035 of the post as shown in FIG. 12G. The window 1216 is used as part of an etch operation that etches down through the metal 1213 to a depth at or near the top surface of the guide layer 1035 in the area that results in the aperture 1205. This etch operation can employ a BOE (Buffered Oxide Etch) that etches sideways and removes the top section of the exposed metal feature 1213 to form the resultant structure as shown in FIG. 12H. The second mask layer 1215 is then removed to form the structure as shown in 12I where the aperture 1205 is formed between the opposed surface electrode parts 1217A, 1217B.

Note that the current blocking implant region(s) (e.g., implant regions 1211A, 1211B) are disposed on opposite sides of the aperture 1205 below the corresponding surface electrode parts 1217A, 1217B. Specifically, the opposed edges of the implant regions 1211A, 1211B are generally aligned laterally with the opposed edges of the surface electrode parts 1217A, 1217B that define the boundaries of the aperture 1215. This self-aligned configuration of the implant region(s) and the surface electrode is advantageous because it can eliminate fabrication steps, aid in minimizing resistance of the top surface layers and aid in producing uniformity and higher yield over large areas.

In alternate embodiments, similar methodology can be used to form a passive and/or active in-plane waveguide structures as part of optoelectronic device realized in an integrated circuit that employs the layer structure of FIG. 10. Such in-plane waveguide guides the propagation of light in the plane of the integrated circuit, and the waveguide layer of the post feature formed at the top surface provides for wave guiding of the in-plane propagating light at the top portion of the integrated circuit wafer. For the passive in-plane waveguide structure, the patterned metal can be omitted.

In other alternate embodiments, the surface electrode that defines the boundaries of the aperture 1205 can be patterned and etched away after metallizing all of the electrodes of the devices of the integrated circuit and prior to depositing the dielectric material of the top mirror of such device, if used.

There have been described and illustrated herein several embodiments of an optoelectronic integrated circuit employing complementary modulation doped quantum well structures and methods of fabricating the same. While particular embodiments of the invention have been described, it is not intended that the invention be limited thereto, as it is intended that the invention be as broad in scope as the art will allow and that the specification be read likewise. Thus, while particular group III-V material system and heterostructures have been disclosed, it will be appreciated that other III-V material systems and heterostructures can be used to realize the optoelectronic integrated circuitry as described herein. It will therefore be appreciated by those skilled in the art that yet other modifications could be made to the provided invention without deviating from its spirit and scope as claimed.

What is claimed is:

1. A semiconductor device comprising:
 a waveguide, comprising an active region, a coupling region, a tuning region, and first and second isolating passive waveguide regions, the waveguide divided into first through fourth sections, wherein:
  the first and second sections are straight sections that are spaced apart and parallel to each other, wherein the coupling region includes the first section; and
  the third and fourth sections are straight sections that are spaced apart and parallel to each other, and extend orthogonally to the first and second sections till ends of the first and second sections, wherein the fourth section is divided into fifth through ninth sections, wherein:
   the fifth and sixth sections are first and second end portions of the fourth section, respectively, wherein the active region includes the second, third, fifth, and sixth sections; and
   the eighth and ninth sections are formed adjacent to the fifth and sixth sections, respectively, wherein the eighth and ninth sections electrically isolate the seventh section from the fifth and sixth sections, respectively, wherein the tuning region includes the seventh section, and the first and second isolating passive waveguide regions are the eighth and ninth sections, respectively, wherein the waveguide comprises:
    a first ohmic contact layer having a first doping type; and
    a p-type modulation doped quantum well (QW) structure disposed above the first ohmic contact layer;
  at least one first ion implant region formed in a first region of the first ohmic contact layer;
  at least one second ion implant region formed on the at least one first ion implant region, and that is in electrical contact with the p-type modulation doped QW structure, wherein the at least one second ion implant region is a p-type ion implant region;
  an anode terminal electrode disposed on the at least one second ion implant region;
  a cathode terminal electrode disposed on a first mesa of the first ohmic contact layer; wherein the active region further includes the at least one first ion implant region, the anode terminal electrode, the at least one second ion implant region, and the cathode terminal electrode;
  at least one third ion implant region formed in a second region of the first ohmic contact layer;
  at least one fourth ion implant region formed on the at least one third ion implant region, and that is in electrical contact with the p-type modulation doped QW structure, wherein the at least one fourth ion implant region is a p-type ion implant region;
  a first tuning electrode disposed on the at least one fourth ion implant region; and
  a second tuning electrode disposed on a second mesa of the first ohmic contact layer, wherein the tuning region further includes the at least one third ion implant region, the first tuning electrode, the at least one fourth ion implant region, and the second tuning electrode.

2. The semiconductor device of claim 1, wherein the at least one first-ion implant region and the at least one third ion implant region comprises oxygen ions, and wherein the at least one first ion implant region defines a current-blocking isolation region between the at least one second ion implant region and the first ohmic contact layer in the active region, and the at least one third ion implant region defines a current-blocking isolation region between the at least one fourth ion implant region and the first ohmic contact layer in the tuning region.

3. The semiconductor device of claim 1, wherein the cathode and anode terminal electrodes are configured as terminals of a laser whereby an injected electrical current flows between the cathode and anode terminal electrodes thereby generating light and propagating the light within the waveguide.

4. The semiconductor device of claim 1, wherein the cathode and anode terminal electrodes are configured as terminals of an optical detector that carry an electrical current caused by absorption of light propagating within the waveguide.

5. The semiconductor device of claim 1, wherein the semiconductor device is configured as a switching thyristor laser.

6. The semiconductor device of claim 1, wherein the semiconductor device is configured as a switching thyristor optical detector.

7. The semiconductor device of claim 1, further comprising a resonant cavity defined by a rib waveguide, wherein the at least one first ion implant region and the at least one third ion implant region are disposed in a central region of the resonant cavity, wherein the at least one first ion implant region and the at least one third ion implant region are disposed on first and second sides of the rib waveguide, respectively, and wherein the resonant cavity supports propagation of an optical signal therein.

8. The semiconductor device of claim 7, wherein the rib waveguide has a plurality of straight sections that are optically coupled together by bend sections.

9. The semiconductor device of claim 7, further comprising a plurality of distributed bragg reflector (DBR) mirror layers formed below the first ohmic contact layer.

10. The semiconductor device of claim 9, further comprising a plurality of dielectric mirror layers formed above the second ohmic contact layer.

11. The semiconductor device of claim 1, wherein the semiconductor device is optically coupled to a zig-zag waveguide structure, wherein the semiconductor device is spaced from the zig-zag waveguide structure by a gap region.

12. The semiconductor device of claim 11, wherein the coupling region further includes:
   a fifth ion implant region formed in a third region of the first ohmic contact layer;
   a sixth ion implant region disposed on the fifth ion implant region, and that is in electrical contact with the p-type modulation doped QW structure;
   a first control electrode disposed on a third mesa of the first ohmic contact layer; and
   a second control electrode disposed on the sixth ion implant region.

13. The semiconductor device of claim 1, wherein the waveguide further includes:
   at least one spacer layer disposed on the p-type modulation doped QW structure;
   an n-type modulation doped QW structure disposed on the at least one spacer layer, wherein the p-type and n-type modulation doped QW structures include one or more QWs;
   a fifth and a sixth ion implant regions disposed above the n-type
   modulation doped QW structure; and
   a second ohmic contact layer disposed above the n-type modulation doped QW structure, and in contact with the fifth and sixth ion implant regions, wherein the second ohmic contact layer has a p-type doping.

14. The semiconductor device of claim 13, wherein the waveguide includes an N+ type doped layer for the first ohmic contact layer, a first plurality of layers that define the p-type modulation doped QW structure and a second plurality of layers that define the n-type modulation doped QW structure offset vertically above the p-type modulation doped QW structure.

15. The semiconductor device of claim 13, wherein at least one of the fifth and sixth ion implant regions provides for lateral confinement of light within a resonant cavity of the semiconductor device.

* * * * *